United States Patent
Ohsawa

(10) Patent No.: US 7,855,920 B2
(45) Date of Patent: Dec. 21, 2010

(54) SEMICONDUCTOR MEMORY DEVICE HAVING A FLOATING STORAGE BULK REGION CAPABLE OF HOLDING/EMITTING EXCESSIVE MAJORITY CARRIERS

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/725,796

(22) Filed: Mar. 17, 2010

(65) Prior Publication Data

US 2010/0182853 A1    Jul. 22, 2010

Related U.S. Application Data

(60) Continuation of application No. 11/758,985, filed on Jun. 6, 2007, now Pat. No. 7,710,785, which is a continuation of application No. 11/199,185, filed on Aug. 9, 2005, now Pat. No. 7,242,608, which is a continuation of application No. 10/621,357, filed on Jul. 18, 2003, now Pat. No. 7,257,015, which is a division of application No. 09/917,777, filed on Jul. 31, 2001, now Pat. No. 6,621,725.

(30) Foreign Application Priority Data

| Aug. 17, 2000 | (JP) | ............................... 2000-247735 |
| Dec. 21, 2000 | (JP) | ............................... 2000-389106 |
| Jun. 14, 2001 | (JP) | ............................... 2001-180633 |

(51) Int. Cl.
*G11C 16/04* (2006.01)

(52) U.S. Cl. .............................. 365/185.26; 365/185.27; 365/185.18; 257/350

(58) Field of Classification Search ............ 365/185.26, 365/185.27, 185.18; 257/350, 347
See application file for complete search history.

(56) References Cited

U.S. PATENT DOCUMENTS 4,090,254 A    5/1978    Ho et al.

(Continued)

FOREIGN PATENT DOCUMENTS

EP    1180799    2/2002

(Continued)

OTHER PUBLICATIONS

Hsing-jen Wann, et al., "A Capacitorless DRAM Cell on SOI Substrate", IEEE, 1993, pp. 26.4.1-26.4.3.

(Continued)

*Primary Examiner*—Andrew Q Tran
(74) *Attorney, Agent, or Firm*—Banner & Witcoff, Ltd.

(57) ABSTRACT

A semiconductor memory device includes: a semiconductor layer formed on an insulating layer; a plurality of transistors formed on the semiconductor layer and arranged in a matrix form, each of the transistors having a gate electrode, a source region and a drain region, the electrodes in one direction constituting word lines; source contact plugs connected to the source regions of the transistors; drain contact plugs connected to the drain regions of the transistors; source wirings each of which commonly connects the source contact plugs, the source wirings being parallel to the word lines; and bit lines formed so as to cross the word lines and connected to the drain regions of the transistors via the drain contact plugs. Each of the transistors has a first data state having a first threshold voltage and a second data state having a second threshold voltage.

12 Claims, 53 Drawing Sheets

U.S. PATENT DOCUMENTS

| | | | |
|---|---|---|---|
| 4,250,569 | A | 2/1981 | Sasaki et al. |
| 5,218,217 | A | 6/1993 | Oda et al. |
| 5,448,513 | A | 9/1995 | Hu et al. |
| 5,712,501 | A | 1/1998 | Davies et al. |
| 5,770,881 | A | 6/1998 | Pelella et al. |
| 5,774,411 | A | 6/1998 | Hsieh et al. |
| 5,784,311 | A | 7/1998 | Assaderaghi et al. |
| 5,870,329 | A | 2/1999 | Foss |
| 6,111,778 | A | 8/2000 | MacDonald et al. |
| 6,621,725 | B2 | 9/2003 | Ohsawa |
| 6,693,326 | B2 | 2/2004 | Adan |
| 6,825,524 | B1 | 11/2004 | Ikehashi et al. |
| 7,242,608 | B2 | 7/2007 | Ohsawa |
| 7,257,015 | B2 * | 8/2007 | Ohsawa ............... 365/150 |
| 7,710,785 | B2 * | 5/2010 | Ohsawa ............ 365/185.26 |

FOREIGN PATENT DOCUMENTS

| | | |
|---|---|---|
| JP | 5678156 | 6/1981 |
| JP | 56119986 | 9/1981 |
| JP | 03171768 | 7/1991 |
| JP | 586864 | 12/1993 |
| JP | 587027 | 12/1993 |
| JP | 8213624 | 8/1996 |
| KR | 9700227 | 1/1997 |

OTHER PUBLICATIONS

Mamix R. Tack, et al., "The Multistable Charge-Controlled Memory Effect on SOI MOS Transistors at Low Temperatures", IEEE Transactions on Electron Devices, May 1990, pp. 1373-1382, vol. 37, No. 5.

John E. Leiss, et al., "dram Design Using the Taper-Isolated Dynamic RAM Cell", IEEE Transactions on Electron Devices, Apr. 1982, pp. 707-714, vol. Ed. 29, No. 4.

Shigeki Tomishima, et al., "A Long Data Retention SOI-DRAM with the Body Refresh Function", 1996 Symposium on VLSI Circuits Digest of Technical Papers, pp. 198-199.

European Search Report of EP 0111965 dated Aug. 17, 2005.

Office Action and Translation of KR 10-2001-0049510 dated Aug. 29, 2004.

* cited by examiner

"0" read/refresh

"1" read/"0" write

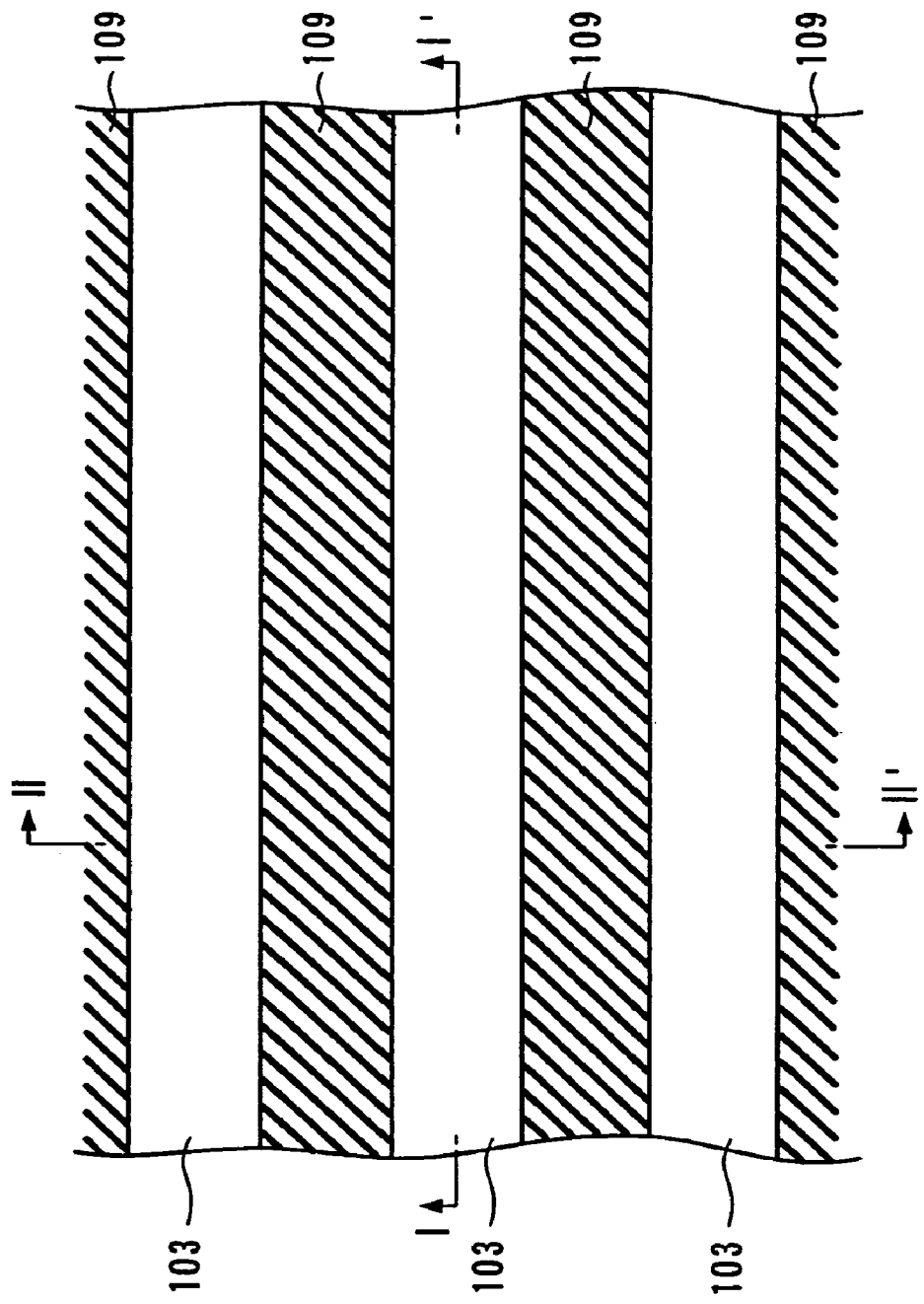

SEMICONDUCTOR MEMORY DEVICE HAVING A FLOATING STORAGE BULK REGION CAPABLE OF HOLDING/EMITTING EXCESSIVE MAJORITY CARRIERS

CROSS REFERENCE TO RELATED APPLICATIONS

This application is a continuation of U.S. patent application Ser. No. 11/758,985, filed Jun. 6, 2007, which is a continuation of U.S. patent application Ser. No. 11/199,185, filed Aug. 9, 2005, which is a continuation of U.S. patent application Ser. No. 10/621,357, filed Jul. 18, 2003, which is a divisional of U.S. patent application Ser. No. 09/917,777, filed Jul. 31, 2001, issued as U.S. Pat. No. 6,621,725, the entire contents of which are incorporated herein by reference.

BACKGROUND OF THE INVENTION

1. Field of the Invention

The present invention relates to a semiconductor memory device, particularly a dynamic semiconductor memory device (DRAM).

2. Related Background Art

In a related DRAM, a memory cell is composed of an MOS transistor and a capacitor. The scaling-down of the DRAM has been remarkably advanced by the adoption of a trench capacitor structure and a stacked capacitor structure. At present, the cell size of a unit memory cell is scaled down to an area of 2 F×4 F=8 $F^2$, where F is a minimum feature size. Namely, the minimum feature size F decreases with the generation advances, and when the cell size is generally taken to be $\alpha F^2$, a coefficient $\alpha$ also decreases with generational advances. Thus, at the present value of F=0.18 μm, $\alpha$=8 is realized.

In order to hereafter secure the trend of cell size or chip size which is the same as before, it is demanded to satisfy $\alpha$<8 in F<0.18 μm and further satisfy $\alpha$<6 in F<0.13 μm, and together with microfabrication, the formation of a cell size of a possible small area becomes a large problem. Accordingly, various proposals for decreasing the size of a single memory cell with a single transistor and a single capacitor to 6 $F^2$ or 4 $F^2$ are made. However, practical use is not easy since there are technical difficulties that the transistor has to be of a vertical type, and that electric interference between adjacent memory cells increases, and in addition difficulties in terms of manufacturing technology including fabrication, film formation, and the like.

On the other hand, some proposals for a DRAM in which a memory cell is composed of one transistor without using a capacitor are made as mentioned below.

(1) JOHN E. LEISS et al, "dRAM Design Using the Taper-Isolated Dynamic Cell" (IEEE TRANSACTIONS ON ELECTRON DEVICES, VOL. ED-29, NO. 4, APRIL 1982, pp 707-714)
(2) Japanese Patent Laid-open Publication No. H3-171768
(3) Mamix R. Tack et al, "The Multistable Charge-Controlled Memory Effect in SOI MOS Transistors at Low Temperatures" (IEEE TRANSACTIONS ON ELECTRON DEVICES, VOL, 37, MAY, 1990, pp 1373-1382)
(4) Hsing-jen Wann et al, "A Capacitorless DRAM Cell on SOI Substrate" (IEDM93, pp 635-638)

A memory cell in (1) is composed of MOS transistors, each of which has a buried channel structure. Charge and discharge to/from a surface inversion layer is performed using a parasitic transistor formed at a taper portion of an element isolation insulating film to perform binary storage.

A memory cell in (2) uses MOS transistors which are well-isolated from each other and uses a threshold voltage of the MOS transistor fixed by a well potential as binary data.

A memory cell in (3) is composed of MOS transistors on an SOI substrate. A large negative voltage is applied from the SOI substrate side, and by utilizing accumulation of holes in an oxide film of a silicon layer and an interface, binary storage is performed by emitting and injecting these holes.

A memory cell in (4) is composed of MOS transistors on an SOI substrate. The MOS transistor is one in terms of structure, but here a structure is adopted, in which a reverse conduction-type layer is formed on top of the surface of a drain diffusion region, whereby a P-MOS transistor for write and an N-MOS transistor for read are substantially combined integrally. With a substrate region of the N-MOS transistor as a floating node, binary data are stored by its potential.

However, in (1), the structure is complicated and the parasitic transistor is used, whereby there is a disadvantage in the controllability of its characteristic. In (2), the structure is simple, but it is necessary to control potential by connecting both a drain and a source of the transistor to a signal line. Moreover, the cell size is large, and rewriting bit by bit is impossible because of the well isolation. In (3), a potential control from the SOI substrate side is needed, and hence rewriting bit by bit is impossible, whereby there is a difficulty in controllability. In (4), a special transistor structure is needed, and the memory cell requires a word line, a write bit line, a read bit line, and a purge line, whereby the number of signal lines increases.

SUMMARY OF THE INVENTION

An object of the present invention is to provide a semiconductor memory device in which a simple transistor structure is used as a memory cell, enabling dynamic storage of binary data by a small number of signal lines and a method of manufacturing the same.

In order to accomplish the aforementioned object and other objects, according to one aspect of the present invention, a semiconductor memory device includes at least one transistor, wherein the transistor comprises:

a semiconductor layer which is a first conduction type and electrically isolated from other memory cells to get floating;

a drain diffusion region which is a second conduction type, formed in the first conduction-type semiconductor layer, and connected to a bit line;

a source diffusion region which is the second conduction type, formed apart from the drain diffusion region in the first conduction-type semiconductor layer, and connected to a source line; and a gate electrode which is formed on the semiconductor layer between the drain diffusion region and the source diffusion region with a gate insulator therebetween, and connected to a word line;

wherein the transistor has a first data state having a first threshold voltage in which excessive majority carriers are held in the semiconductor layer and a second data state having a second threshold voltage in which the excessive majority carriers in the semiconductor layer are emitted.

According to another aspect of the present invention, a semiconductor memory device comprises:

an SOI substrate in which a silicon layer is formed on an insulating film formed on a silicon substrate;

a plurality of transistors formed in the silicon layer, pairs of transistors, each pair sharing a drain diffusion region, being arranged in a matrix form with element-isolated in a channel width direction;

a plurality of word lines each connected to gate electrodes of transistors arranged in a first direction in common;

a plurality of bit lines disposed in a second direction intersecting the first direction and connected to the drain diffusion regions of the transistors;

a common source line formed by continuously disposing source diffusion regions of the transistors arranged in the first direction, wherein the transistor has a first data state having a first threshold voltage in which excessive majority carriers are held in the silicon layer and a second data state having a second threshold voltage in which the excessive majority carriers in the silicon layer are emitted.

According to a further aspect of the present invention, a method of manufacturing a semiconductor memory device comprises:

forming an insulating film on a semiconductor substrate;

forming a first conduction-type semiconductor layer on the insulating film;

forming a mask having an opening in a gate forming region on the semiconductor layer;

forming a side wall insulating film on a side wall of the opening of the mask;

doping impurities to the semiconductor layer through the opening of the mask to form a first conduction-type impurity region having an impurity concentration higher than the semiconductor layer;

forming a gate insulator and a gate electrode by burying them in the opening of the mask after the side wall insulating film is removed; and doping impurities to the semiconductor layer to form second conduction-type drain diffusion region and source diffusion region after the mask is removed.

According to a still further aspect of the present invention, a method of manufacturing a semiconductor memory device comprises:

forming an insulating film on a semiconductor substrate;

forming a first conduction-type semiconductor layer on the insulating film;

forming a mask having an opening in a gate forming region on the semiconductor layer;

forming a first side wall insulating film on a side wall of the opening of the mask;

doping impurities to the semiconductor layer through the opening of the mask to form a first conduction-type first impurity region having an impurity concentration higher than the semiconductor layer;

forming a gate insulator and a gate electrode by burying them in the opening of the mask after the first side wall insulating film is removed;

doping impurities to the semiconductor layer to form second conduction-type second impurity regions in a drain region and a source region after the mask is removed, forming a second side wall insulating film on a side wall of the gate electrode, and doping impurities to the semiconductor layer to form second conduction-type third impurity regions having an impurity concentration higher than the second impurity regions in the drain region and the source region.

BRIEF DESCRIPTION OF THE DRAWINGS

FIG. 61A is a plan view showing an element isolating step in the embodiment;

DESCRIPTION OF THE PREFERRED EMBODIMENTS

Preferred embodiments of the present invention will be explained below with reference to the drawings.

Figure 1:
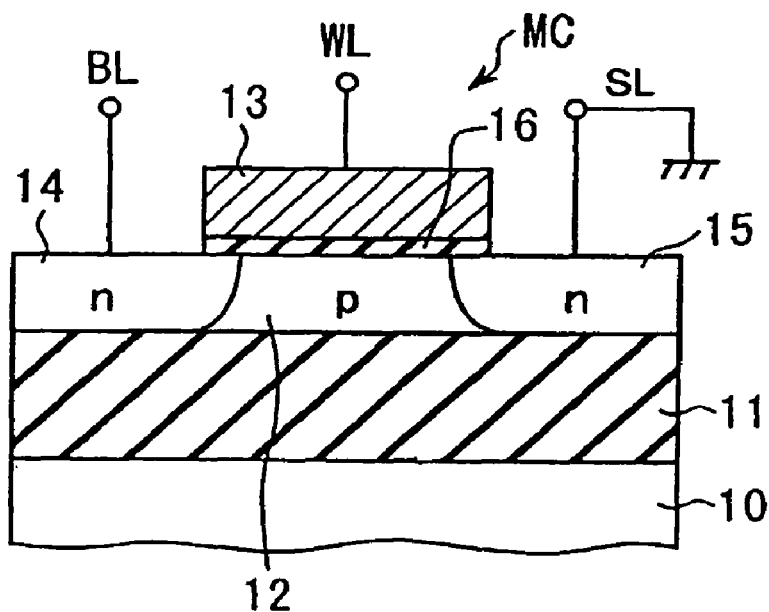
FIG. 1 is a sectional view showing the structure of a memory cell of a DRAM according to a first embodiment of the present invention.
Figure 2:
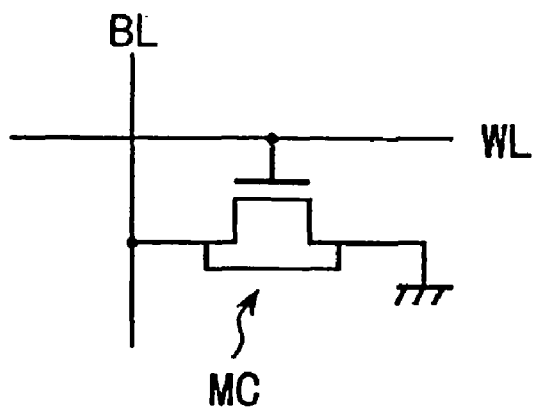
FIG. 2 is a diagram showing an equivalent circuit of the memory cell of the DRAM.

FIG. 1 shows the sectional structure of a unit memory cell of a DRAM according to a first embodiment of the present invention, and FIG. 2 shows its equivalent circuit. A memory cell MC is composed of an N-channel MOS transistor with an SOI structure. Specifically, an SOI substrate, in which a silicon oxide film 11 as an insulating film is formed on a silicon substrate 10 and a p-type silicon layer 12 is formed on the silicon oxide film 11, is used. A gate electrode 13 is formed on the silicon layer 12 of this SOI substrate with a gate oxide film 16 therebetween, and n-type source/drain diffusion regions 14 and 15 are formed, being self-aligned by the gate electrode 13.

The source/drain diffusion regions 14 and 15 are formed deep to reach the silicon oxide film 11 at the bottom. Therefore, a bulk region composed of the p-type silicon layer 12 is insulatingly isolated from others at its bottom face and its side face in a channel width direction if isolation in the channel width direction (a direction perpendicular to a paper surface in FIG. 1) is performed by an oxide film, and floats in a channel lengthwise direction by pn junction isolation.

When these memory cells MC are arranged in a matrix form, the gate electrode 13 is connected to a word line WL, the source diffusion region 15 is connected to a fixed potential line (ground potential line) SL, and the drain diffusion region 14 is connected to a bit line BL.

Figure 3:
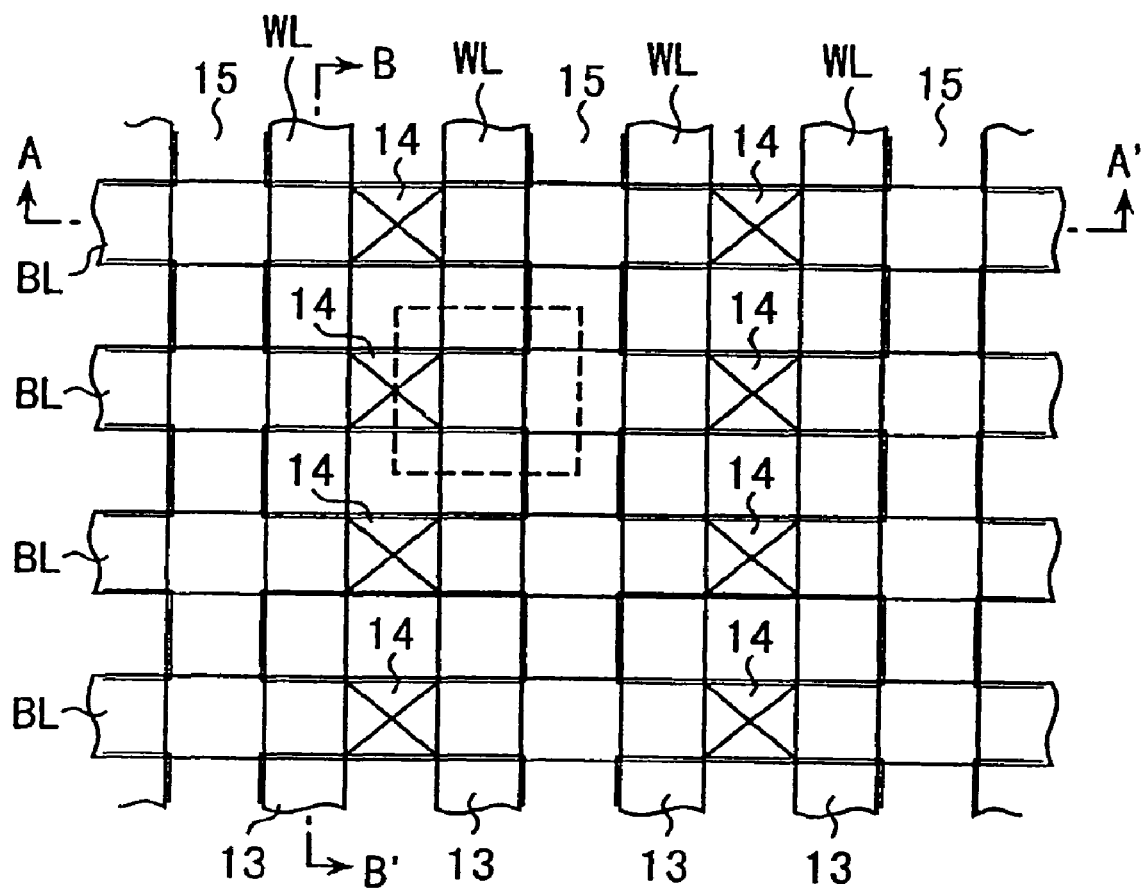
FIG. 3 is a diagram showing the layout of a memory cell array of the DRAM.
Figure 4A:
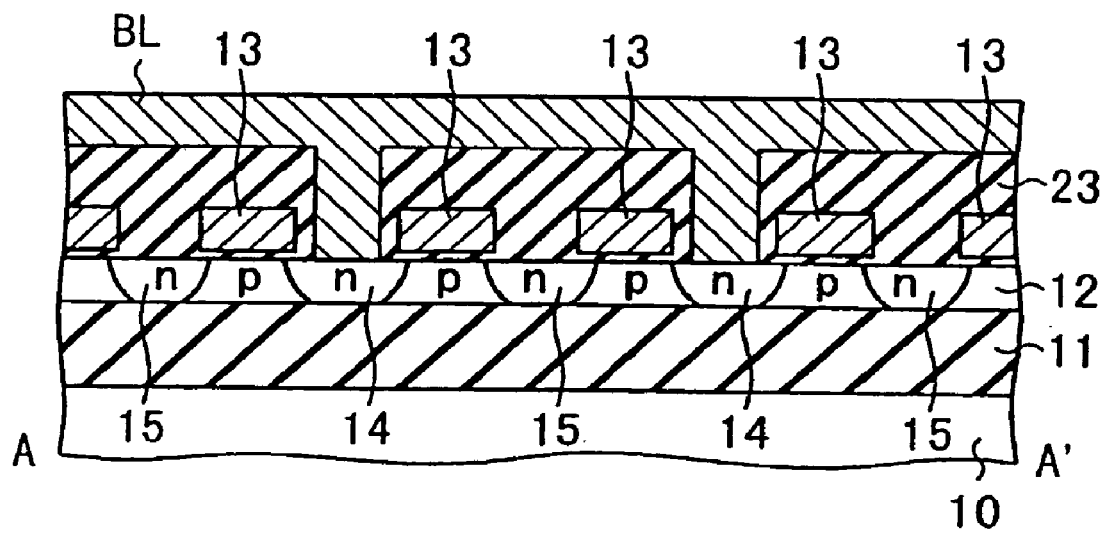
FIG. 4A is a sectional view taken along the line A-A' in FIG. 3.
Figure 4B:
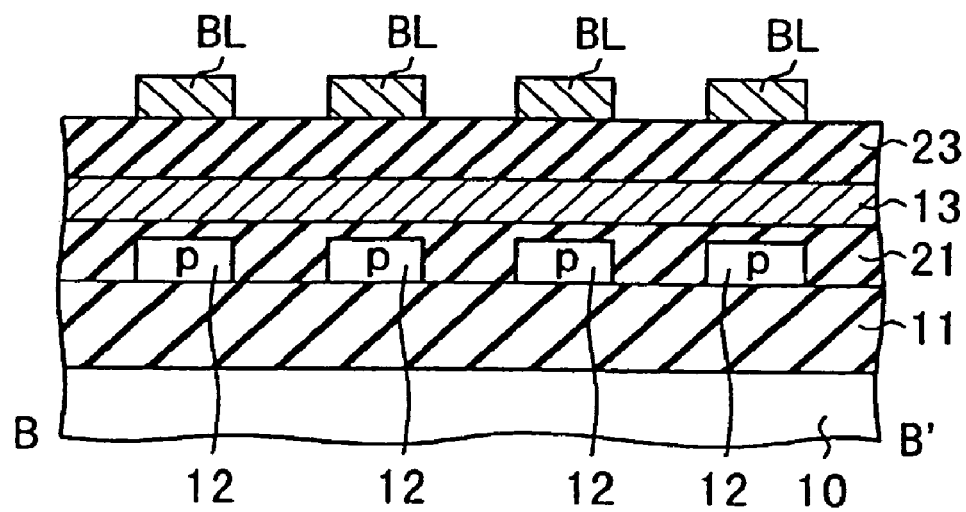
FIG. 4B is a sectional view taken along the line B-B' in FIG. 3.

FIG. 3 shows the layout of a memory cell array, and FIG. 4A and FIG. 4B respectively show sections taken along the line A-A' and the line B-B' in FIG. 3. The p-type silicon layer 12 is pattern-formed in a lattice form by embedding a silicon oxide film 21 therein. Namely, regions each of which is for two transistors sharing a drain are arranged, which are element-isolated in the direction of the word line WL by the silicon oxide film 21. Alternatively, instead of embedding the silicon oxide film 21, element isolation in a crosswise direction may be performed by etching the silicon layer 12. The gate electrodes 13 are formed continuously in one direction to constitute the word lines WL. The source diffusion regions 15 are continuously formed in the direction of the word line WL to constitute the fixed potential lines (common source lines) SL. The transistor is covered with an interlayer dielectric film 23, and the bit lines BL are formed thereon. Each of the bit lines BL is disposed to be in contact with the drain diffusion regions 14, each of which is shared by two transistors, and intersect the word lines WL.

Thereby, the silicon layers 12, each being a bulk region of each transistor, are isolated from each other at their bottom faces and side faces in the channel width direction by the oxide film, and isolated from each other in the channel lengthwise direction by a pn junction, so that a floating state is maintained.

In this memory cell array structure, if the word line SL and the bit line BL are formed in the pitch of a minimum feature size F, a unit cell area is 2 F×2 F=4 F$^2$ as shown by a broken line in FIG. 3.

The operational principle of the DRAM cell composed of this N-MOS transistors utilizes the accumulation of holes which are majority carriers in the bulk region (the p-type silicon layer 12 insulatingly isolated from others) of the MOS transistor. Specifically, a large electric current is sent from the drain diffusion region 14 by operating the MOS transistor in a pentode region to generate impact ionization near the drain diffusion region 14. Excessive holes which are majority carriers produced by this impact ionization are held by the p-type silicon layer 12, and this state in which the holes are accumulated (the state in which potential is higher than in a thermal equilibrium state) is defined, for example, as data "1". The state in which a forward bias is applied to the pn junction between the drain diffusion region 14 and the p-type silicon layer 12 to emit the excessive holes in the p-type silicon layer 12 to the drain side is defined as data "0".

The data "0" and "1" are stored as potential difference in the bulk region and stored as difference in threshold voltage of the MOS transistor. Namely, a threshold voltage Vth1 in a data "1" state in which the potential of the bulk region is high due to hole accumulation is lower than a threshold voltage Vth0 in a data "0" state. In order to maintain the "1" data state in which the holes being majority carriers are accumulated in the bulk region, it is necessary to apply a negative bias voltage to the word line WL. This state in which the data is held is not changed even when a read operation is performed as long as the read operation is performed in a linear region and a write operation (erase) of inverted data is not performed. Namely, unlike the DRAM in which each memory cell has one transistor and one capacitor and which utilizes charge storage by the capacitor, non-destructive read-out is possible.

Figure 5:
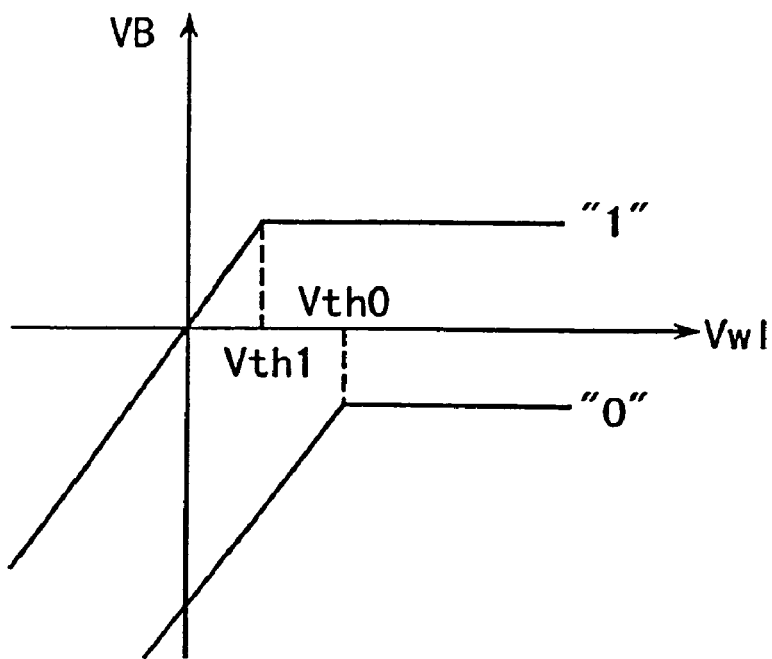
FIG. 5 is a diagram showing the relation between a word line potential and a bulk potential of the DRAM cell.
Figure 6:
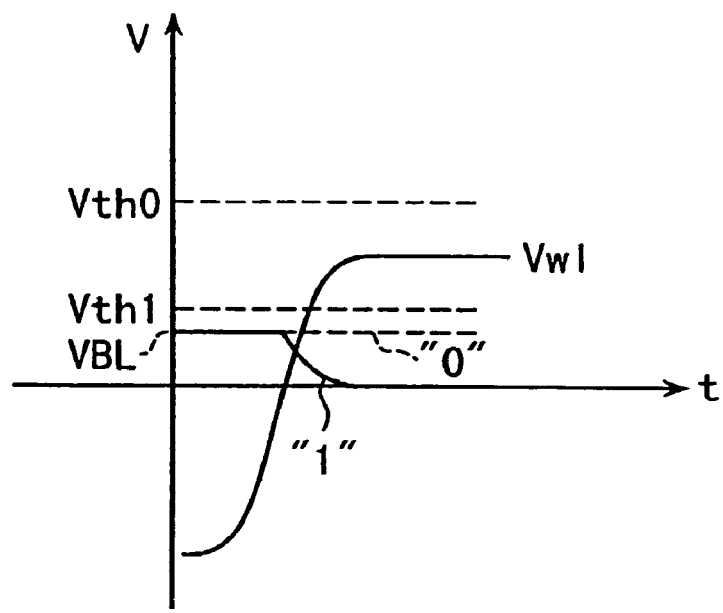
FIG. 6 is a diagram for explaining a read method of the DRAM cell.

Some methods for reading data are presented. The relation between a word line potential Vwl and a bulk potential VB is shown in FIG. 5 in relation to the data "0" and "1". A first method of reading data utilizes the event that the word line WL is given a read potential which has an intermediate value between the threshold voltages Vth0 and Vth1 of the data "0" and "1", and that a current is not passed through the memory cell storing the "0" data, while a current is passed through the memory cell storing the "1" data. More specifically, for example, the bit line BL is precharged at a predetermined potential VBL, and thereafter the word line WL is driven. Thereby, as shown in FIG. 6, in the case of the "0" data, the precharge potential VBL of the bit line does not change, while in the case of the "1" data, the precharge potential VBL is lowered.

Figure 7:
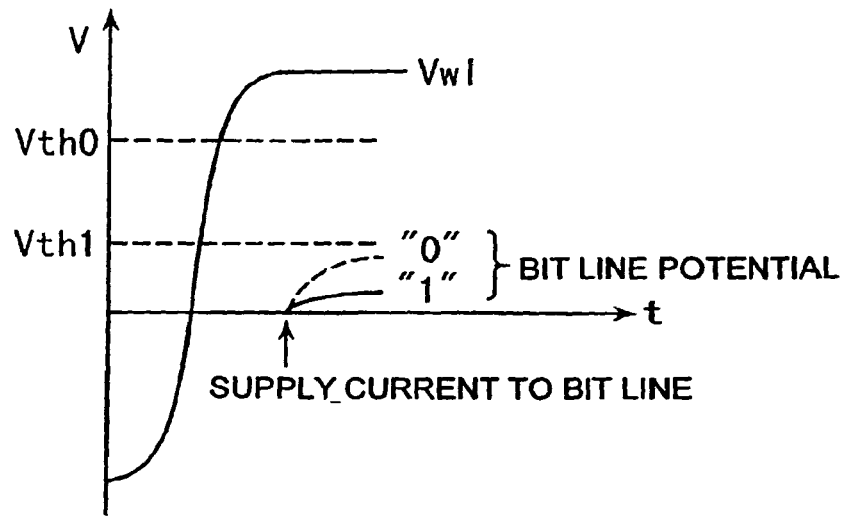
FIG. 7 is a diagram for explaining a different read method of the DRAM cell.

A second read method utilizes the event that after the potential of the word line WL is raised, a current is supplied to the bit line BL, and the increasing speed of the bit line potential is different according to the conductivity of "0" and "1". In brief, the bit line BL is precharged at 0V, the potential of the word line WL is raised, and then a current is supplied to the bit line as shown in FIG. 7. By detecting a difference in bit line potential increase by using a dummy cell at this time, data distinction becomes possible.

A third read method is a method of reading difference in current to the bit line BL which differs according to "0" and "1" when the bit line BL is clamped at a predetermined potential. A current-voltage conversion circuit is necessary to read current difference, and finally potential difference is differentially amplified and a sense output is given.

In this first embodiment, in order to selectively write the "0" data, that is, in order to emit excessive holes only from the bulk region of the memory cell selected by potentials of the selected word line WL and bit line BL in the memory cell array, capacitive coupling of the word line WL and the bulk region is important. Although the detailed examination thereof will described later, a state in which holes are accumulated in the bulk region in the case of the data "1" needs to be maintained in a state in which the word line is fully biased in a negative direction, whereby the capacitance between the gate and the substrate of the memory cell is the capacitance of the gate oxide film (namely, in a state in which no depletion layer is formed in the surface).

Moreover, it is desirable that the write operation be performed by pulse write to reduce electric power consumption in the case of both "0" and "1". When "0" is written, a hole current is sent from the bulk region to the drain of the selected transistor, while an electron current is sent from the drain to the bulk region, but no hole is injected into the bulk region.

More concrete operating waveforms will be explained. FIG. 8 to FIG. 11 show read/refresh and read/write operating waveforms when the first read method of performing data distinction by the presence or absence of electric discharge of the bit line in the selected cell is used.

Figure 8:
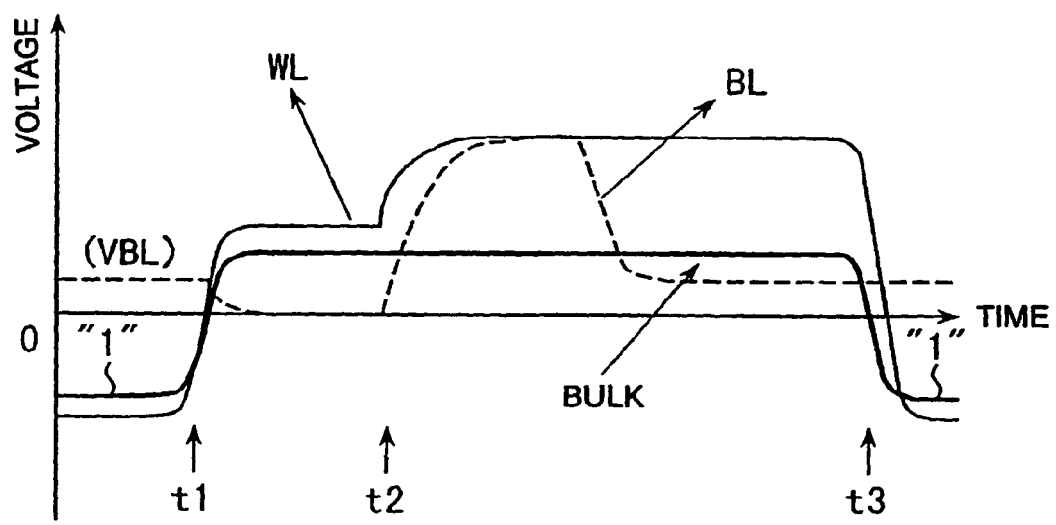
FIG. 8 is a diagram showing an operating waveform of "1" data read/refresh of the DRAM.
Figure 9:
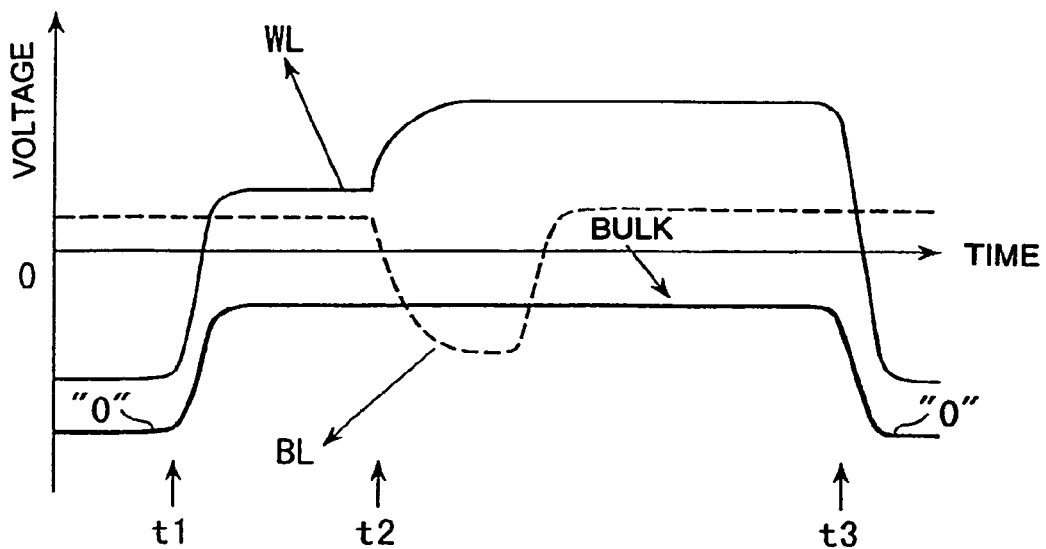
FIG. 9 is a diagram showing an operating waveform of "0" data read/refresh of the DRAM.

FIG. 8 and FIG. 9 respectively show read/refresh operations of the "1" data and the "0" data. Until a point in time t1, a data holding state (a non-selected state) lasts and a negative potential is given to the word line WL. At the point in time t1, the word line WL is raised to a positive predetermined potential. At this time, the potential of the word line is set at a value between the thresholds Vth0 and Vth1 of the "0" and "1" data. As a result, in the case of the "1" data, the potential of the bit line BL (precharged in advance) is lowered by electric discharge. In the case of the "0" data, the bit line potential VBL is held. Hence, the data "1" and "0" can be distinguished.

At a point in time t2, the potential of the word line WL is further increased. At the same time, when the read data is "1", a positive potential is given to the bit line BL (FIG. 8), and when the read data is "0", a negative potential is given to the bit line BL (FIG. 9). Thereby, when the selected memory cell stores the "1" data, a large channel current is passed by operation of a pentode to generate impact ionization, whereby excessive holes are injected into the bulk region and held therein, and thus the "1" data is written again. In the case of the "0" data, a forward bias is applied to a drain junction, and thereby the "0" data in which no excessive hole is held in the bulk region is written again.

At a point in time t3, the word line WL is biased in the negative direction, and the read/refresh operation is completed. In other non-selected memory cells which are connected to the same bit line BL as the memory cell which has read the "1" data, the word line WL is held at a negative potential, and hence the bulk region thereof is held at a negative potential, whereby impact ionization does not occur. In other non-selected memory cells which are connected to the same bit line BL as the memory cell which has read the "0" data, the word line WL is held at a negative potential as well, whereby hole emission does not occur.

Figure 10:
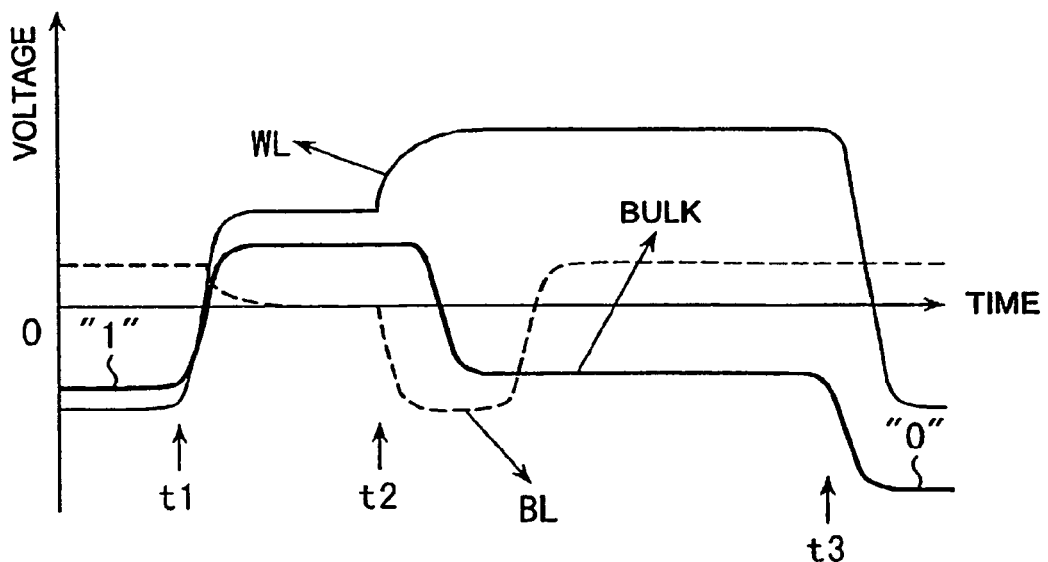
FIG. 10 is a diagram showing an operating waveform of "1" data read/"0" data write of the DRAM.
Figure 11:
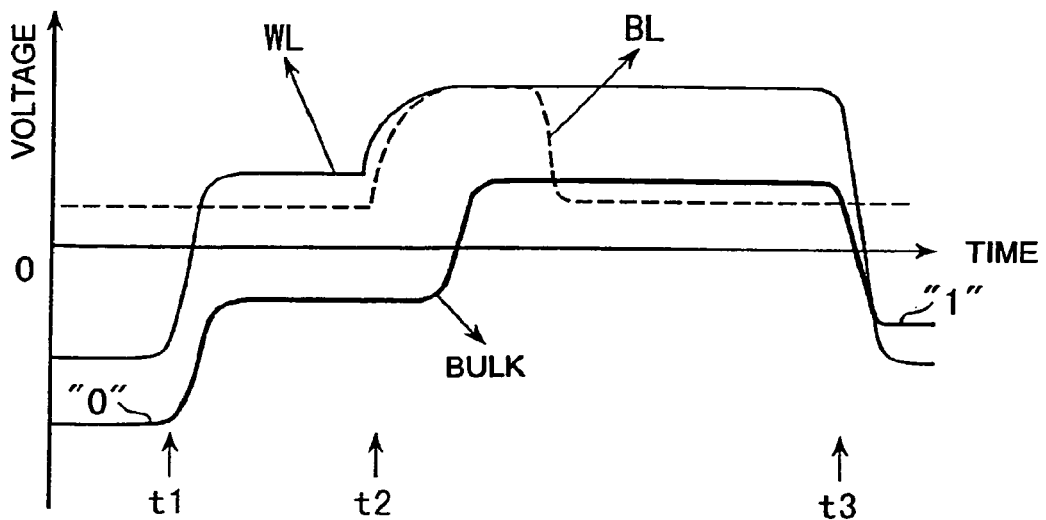
FIG. 11 is a diagram showing an operating waveform of "0" data read/"1" data write of the DRAM.

FIG. 10 and FIG. 11 show read/write operations of the "1" data and the "0" data by the same read method. The read operations at the point in time t1 in FIG. 10 and FIG. 11 are the same as in FIG. 8 and FIG. 9. After reading, at the point in time t2, the potential of the word line WL is further increased. When the "0" data is written in the same selected cell, a negative potential is given to the bit line BL (FIG. 10) at the same time, and when the "1" data is written, a positive potential is given to the bit line BL (FIG. 11). Thereby, in the cell which the "0" data is given, a forward bias is applied to the drain junction, and holes in the bulk region are emitted. Meanwhile, in the cell in which the "1" data is given, impact ionization occurs around the drain, and excessive holes are injected into the bulk region and held therein.

FIG. 12 to FIG. 15 show operating waveforms of read/refresh and read/write when the second read method of supplying a current to the bit line BL after the selection of the word line and performing data distinction by the potential increasing speed of the bit line BL is used.

Figure 12:
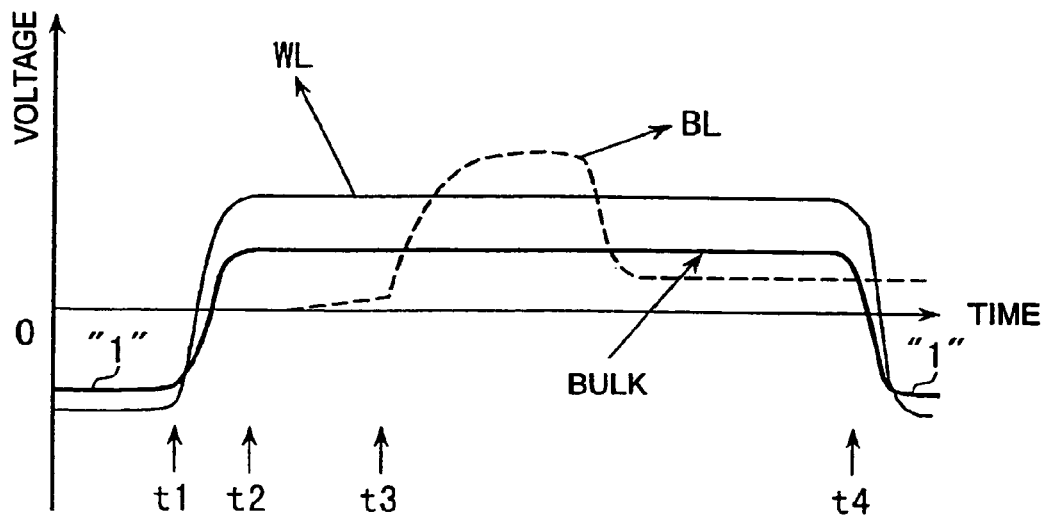
FIG. 12 is a diagram showing an operating waveform of "1" data read/refresh by the different read method of the DRAM.
Figure 13:
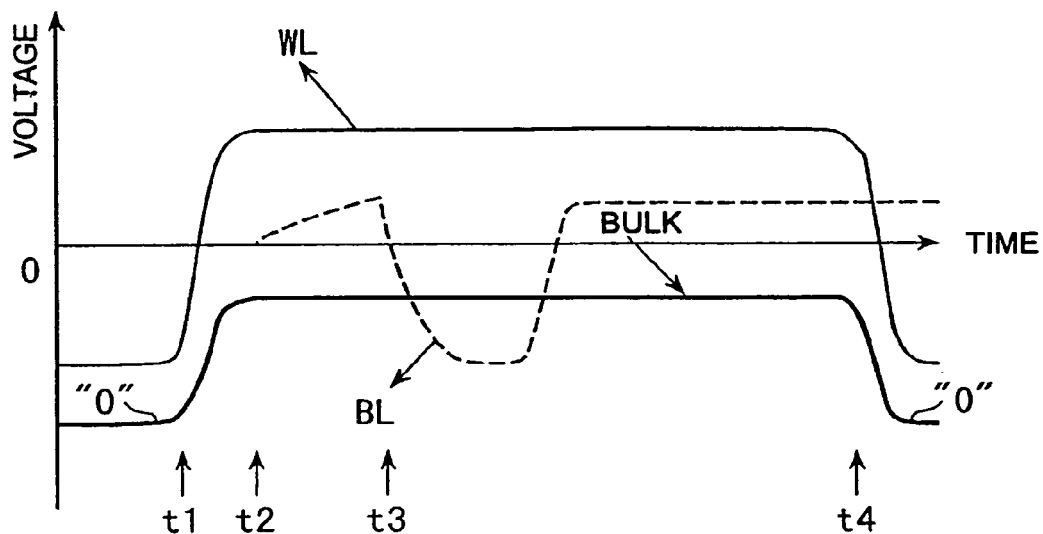
FIG. 13 is a diagram showing an operating waveform of "0" data read/refresh by the different read method of the DRAM.

FIG. 12 and FIG. 13 respectively show read/refresh operations of the "1" data and the "0" data. The word line WL which is held at a negative potential is raised to a positive potential at the point in time t1. At this time, the potential of the word line is set at a value higher than both the thresholds Vth0 and Vth1 of the "0" and "1" data as shown in FIG. 7. Alternatively, and similarly to the first read method, the potential of the word line may be set at a value between the thresholds Vth0 and Vth1 of the "0" and "1" data. Then, a current is supplied to the bit line at the point in time t2. Thereby, in the case of the "1" data, the memory cell is turned on deeply and an increase in the potential of the bit line BL is small (FIG. 12), while in the case of the "0" data, a current in the memory cell is small (or no electric current is passed) and the potential of the bit line increases rapidly. Hence, the "1" and "0" data can be distinguished.

At the point in time t3, a positive potential is given to the bit line BL when the read data is "1" (FIG. 12), while a negative potential is given to the bit line BL when the read data is "0" (FIG. 13). Consequently, when the selected memory cell stores "1" data, a drain current is sent to generate impact ionization, excessive holes are injected into the bulk region and held therein, and the "1" data is written again. In the case of the "0" data, a forward bias is applied to the drain junction, and the "0" data in which there are no excessive holes in the bulk region is written again.

At a point in time t4, the word line WL is biased in the negative direction, and the read/refresh operation is completed.

Figure 14:
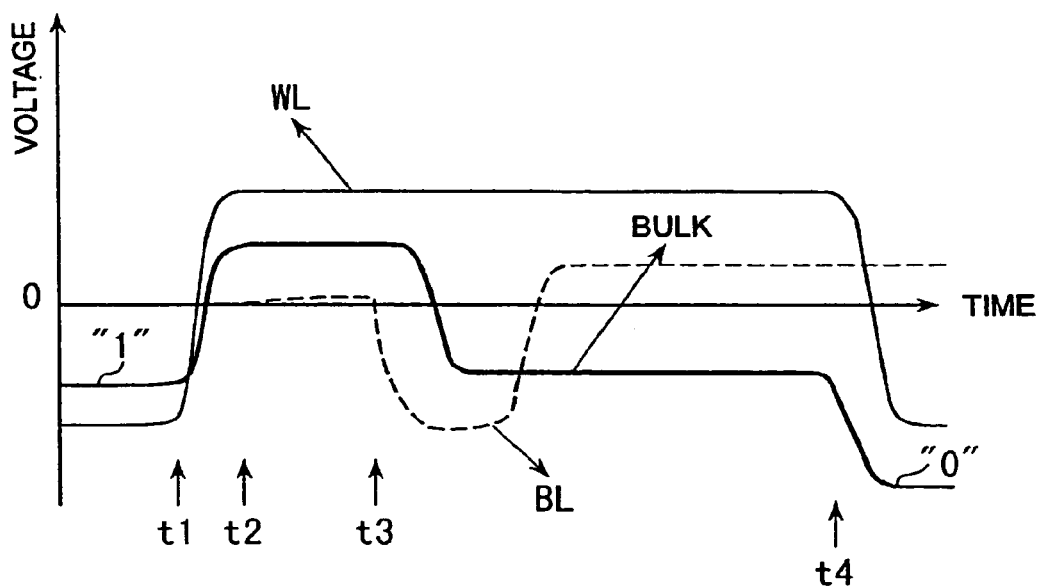
FIG. 14 is a diagram showing an operating waveform of "1" data read/"0" data write by the different read method of the DRAM.
Figure 15:
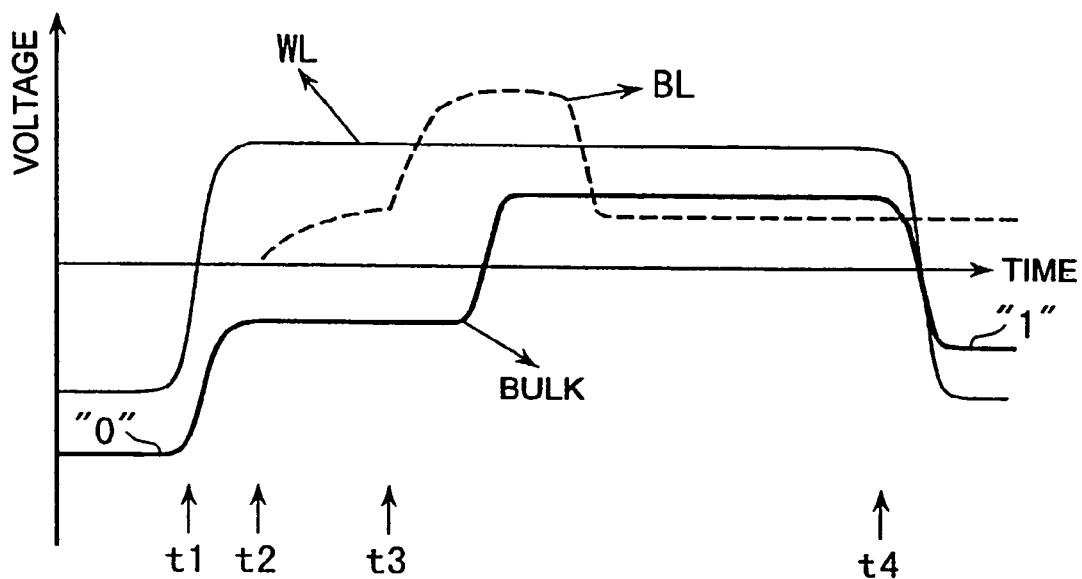
FIG. 15 is a diagram showing an operating waveform of "0" data read/"1" data write by the different read method of the DRAM.

FIG. 14 and FIG. 15 respectively show read/write operations of the "1" data and "0" data by the same read method. The read operations at the points in time t1 and t2 in FIG. 14 and FIG. 15 are the same as in FIG. 12 and FIG. 13. When the "0" data is written in the same selected cell after read, a negative potential is given to the bit line BL (FIG. 14), and when the "1" data is written, a positive potential is given to the bit line BL (FIG. 15). Thereby, in the cell in which the "0" data is given, a forward bias is applied to the drain junction, and excessive holes in the bulk region are emitted. Meanwhile, in the cell in which the "1" data is given, a large drain current is sent thereto to generate impact ionization around the drain, and excessive holes are injected into the bulk region and held therein.

As described above, the DRAM cell according to the first embodiment of the present invention is composed of a simple MOS transistor having a floating bulk region which is electrically isolated from others, and a cell size of 4 $F^2$ can be realized. Capacitive coupling from the gate electrode is used for controlling the potential of the floating bulk region, and without using, for example, back gate control from the back side of the SOI substrate. The source diffusion region has also a fixed potential. Namely, the read/write control is performed only by the word line WL and the bit line BL, which is simple. Moreover, data in the memory cell are basically non-destructively read out, whereby it is unnecessary to provide a sense amplifier in each bit line, which facilitates the layout of the sense amplifiers. In addition, since it adopts a current read method, it is not affected by noise, so that reading is possible, for example, even by an open bit line system. Moreover, the process of manufacturing the memory cell is simple.

The SOI structure is an important technique when an improvement in the performance of a logic LSI in future is considered. The DRAM according to the first embodiment of the present invention is very promising also when mounted together with such a logic LSI having the SOI structure. Unlike a related DRAM using a capacitor, the DRAM in the embodiment of the present invention does not need a process different from that of the logic LSI, and hence its manufacturing process is simplified.

Furthermore, the DRAM having the SOI structure according to the first embodiment has an advantage that an excellent memory holding characteristic can be obtained compared with the case where a related one transistor/one capacitor-type DRAM is formed to have the SOI structure. Specifically, if the related one transistor/one capacitor-type DRAM is formed to have the SOI structure, holes are accumulated in a floating semiconductor bulk, the threshold of a transistor decreases, and thereby a subthreshold current in the transistor is increased, which deteriorates a memory holding characteristic. On the other hand, in the memory cell having only one transistor according to the embodiment of the present invention, there is no transistor path which decreases memory charge, and hence a data holding characteristic is determined by only leakage from the pn junction, which eliminates a problem of subthreshold leakage.

It is judged by the following judgment standards whether the memory cell according to the first embodiment of the present invention can actually stand up to practical use.

(a) Whether a characteristic of holding holes in the bulk region is satisfactory or not (a holding time of approximately 10 sec can be obtained or not).

(b) Whether a sufficient "1" write speed can be obtained or not (whether a write speed of 10 nsec is possible or not, and whether a bulk current of approximately 20 nA or more can be obtained at the time of writing or not).

(c) Whether the selectivity of a "0" write is satisfactory or not (whether a difference of approximately $\Delta VB=1$ V between bulk potentials of the "0" data and the "1" data can be obtained or not).

(d) Whether a capacitance between the gate and the bulk region can be obtained to be sufficiently larger than the capacitance of the pn junction or not, and whether a sufficiently large threshold of the "1" data can be obtained or not.

These judgment standards will be verified below.

Capacitance, Holding Time, Leakage Current of Memory Cell

The mean value of memory holding times of memory cells of the DRAM having 1 G memory cells is taken here as RT=10 sec. Assuming that the thickness of the gate oxide film of the memory cell is tox=2.5 nm under the 0.1 μm rule, the gate oxide film capacitance is 14 fF/cm$^2$, whereby a gate oxide film capacitance Cox is Cox=0.14 fF when the gate area is 0.01 μm$^2$. Including a pn junction capacitance Cj=0.08 fF which will be explained later, the whole capacitance is Ctotal=0.22 fF.

When electric charge is accumulated in this gate capacitance, a leakage current I leak/node per cell, which gives a potential change of $\Delta V=0.1$ V during the memory holding time RT=10 sec, is derived from the following Formula 1.

$$I\text{leak/node} = C\text{total} \cdot \Delta V / RT = 2.2 \times 10^{-18} \text{ A/node} \quad \text{(Formula 1)}$$

Since the pn junction area is 0.1 μm×0.1 μm×2=0.02 μm$^2$ assuming that the thickness of the silicon layer on the SOI substrate is 100 nm, the leakage current 1 leak/area per unit area is derived from the following Formula 2.

$$I\text{leak/area} = 2.2 \times 10^{-18}/0.02 = 1.1 \times 10^{-16} \text{ A/μm}^2 \quad \text{(Formula 2)}$$

The leakage current for a reverse bias of approximately 2 V at the pn junction on the SOI substrate is not more than the above value, the mean cell memory holding time RT=10 sec is guaranteed, and hence the memory holding characteristic comparable to that of the one transistor/one capacitor DRAM can be obtained. Incidentally, a value of 1 to $3 \times 10^{-17}$ A/μm (per 1 nm in the word line direction) is hitherto reported as the leakage current from the pn junction on an SOI substrate (1995 Symp. VSLI Tech., p. 141). From this report, the above memory holding characteristic probably can be realized.

"1" Write Time and Bulk Current

The write time is determined by the capacitance of a cell node (gate) and a bulk current Isub. The gate capacitance is taken here as Ctotal=0.22 fF as described above. If the measure of the write time is twr=10 nsec, the bulk current required to write a voltage of $\Delta V=1$ V in the bulk region within this time is derived from the following Formula 3.

$$\begin{aligned} I\text{sub} &= C\text{total} \cdot \Delta V / twr \\ &= 0.22 \times 10^{-15} \times 1 / 10 \times 10^{-9} \\ &= 22 \text{ nA} \end{aligned} \quad \text{(Formula 3)}$$

Assuming that a drain current Ids which is passed through the channel of the cell transistor is 10 μA, the aforesaid bulk current Isub is approximately 2/1000 thereof. If impact ionization is generated by giving a drain-source voltage of approximately Vds=2 V, a necessary bulk current can be passed.

Selectivity of "0" Write and Signal Quantity

Figure 16:
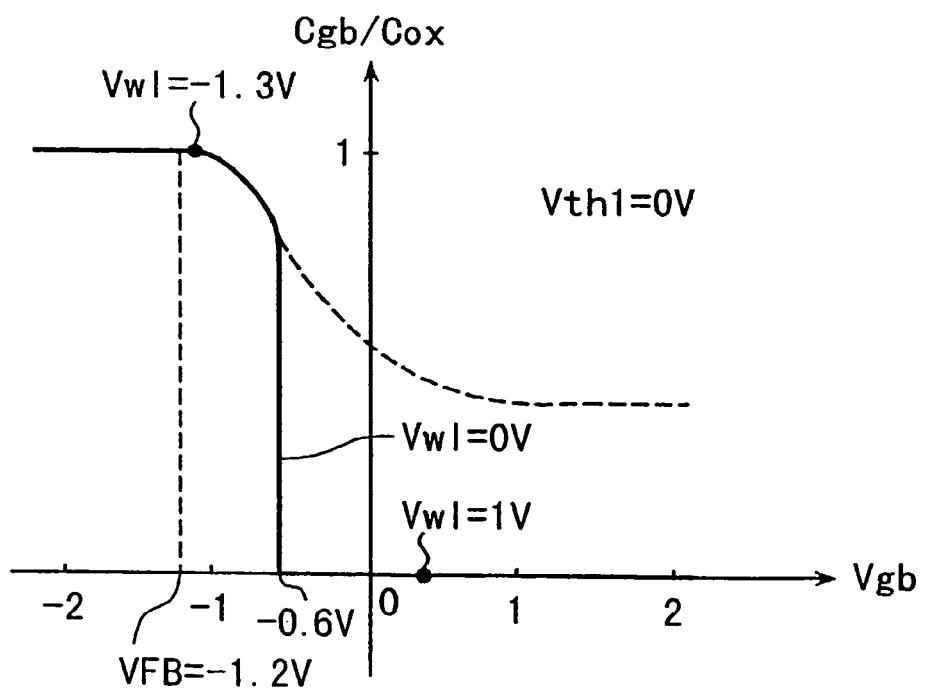
FIG. 16 is a diagram showing a gate capacitance Cgb-voltage Vgb characteristic of the DRAM cell.

A C-V curve of the memory cell (the relation between a voltage Vgb and a capacitance Cgb between the gate and the bulk) is shown in FIG. 16. When NA=$10^{18}$/cm$^3$ is taken for the acceptor concentration of the bulk region, the flat band voltage is VFB=−1.2 V. Assuming that a "1" write is performed at the word line voltage Vwl=1 V (the bulk potential VB=0.6 V) and the word line potential is decreased after the write, the capacitance Cgb is zero since the region is shielded by the channel inversion layer at first. Moreover, assuming that the threshold of the "1" cell is Vth=0 V, the bulk potential VB does not change even if the word line potential is reduced to 0 V, and the capacitance Cgb becomes manifest when the word line potential reaches the threshold voltage Vth1, that is, Vwl=0 V. At this time, the gate-bulk voltage is Vgb=−0.6 V.

The capacitance per unit area of the pn junction is 4 fF/μm$^2$ where NA=$10^{18}$/cm$^3$ and the drain voltage Vd=0V. When the junction area is 0.1 μm×0.1 μm×2=0.02 μm$^2$, the capacitance of the pn junction is Cj=0.08 fF. Assuming that Cgb/Cox is 0.8 at Vgb=−0.6 V, the capacitive coupling ratio λ of the gate voltage to the bulk region in the case of Cox=0.14 fF is derived from the following Formula 4.

$$\begin{aligned} \lambda &= Cgb / (Cgb + Cox) \\ &= 0.14 \times 0.8 / (0.14 \times 0.8 + 0.08) \\ &= 0.58 \end{aligned} \quad \text{(Formula 4)}$$

Accordingly, the ratio of a potential change in the bulk region to that in the word line when the word line potential decreases and the gate-bulk capacitance Cgb starts to appear is approximately 60%. If the word line potential further decreases, the bulk potential also decreases, but Vgb increases to the side more negative than −0.6 V. Following this, the capacitance Cgb increases, and the bulk potential can be decreased by capacitive coupling. Finally, as shown in FIG. 16, assuming that the word line potential is decreased to Vwl=−1.3 V and that the mean capacitive coupling ratio λ is 0.6, the bulk region is decreased from the initial 0.6 V by ΔVB=1.3 V×0.6=0.78 V, resulting in −0.18 V. At this time, Vgb=−1.12 V is obtained.

Specifically, when data is held with the word line potential as Vwl=−1.3 V after the "1" data write in which the bulk potential comes to be VB=0.6 V by injection of excessive holes is performed, the bulk potential is held at −0.18 V by capacitive coupling. When the bulk potential is decreased by decreasing the bit line potential to a negative potential and performing "0" write for some selected cell in this state, holes in the bulk flow into the drain even in a non-selected cell with a word line potential of −1.3 V under the condition that the bulk potential is −0.18 V or less, whereby the data is destroyed. Consequently, the minimum value of bulk potential in writing the "0" data so as not to cause data destruction is −0.18 V. The maximum value of voltage in writing the "1" data is a built-in voltage 0.6 V, and thus the maximum value of signal quantity is 0.6 V−(−0.18 V)=0.78 V. Accordingly, the aforesaid ΔVB itself is the difference in signal quantity between the "0" data and the "1" data (difference in bulk potential).

Confirmation of Non-Destructive Read-Out Characteristic

In the memory cell according to the first embodiment of the present invention, non-destructive read-out is performed in principle. In order to actually guarantee the non-destructive read-out, it is necessary to confirm that:

(1) no hole is injected into the bulk region even if the read operation is repeated for the "0" data cell; and (2) no hole is eliminated from the bulk region even if the read operation is repeated for the "1" data cell.

The approximate maximum value Nmax of the number of repetitions in these cases is Nmax=128 msec/100 nsec=1.28× $10^{16}$ since these cases correspond to the case where the read operation (100 nsec) is continued for the same cell between some refresh and the next refresh (for example, 128 msec). The non-destructive characteristic of the "0" data which holds the hole accumulating state of the bulk is probably more critical. Accordingly, even if a current is passed at the time of a read operation, it is necessary to perform the read in a linear region with a low current of approximately Vds=0.5 V. Alternatively, it is desirable in terms of a guarantee of non-destructive characteristic that a method be adopted by which no electric current is sent to the "0" data cell like the above first read method.

In the above description, the judgment standards indicating the possibility of basic realization of the DRAM according to the first embodiment of the present invention are verified. Next, the analyses of the performance of the DRAM according to the first embodiment of the present invention will be more concretely explained in sequence.

Potential Change in Bit Line at the Time of Read

Figure 17:
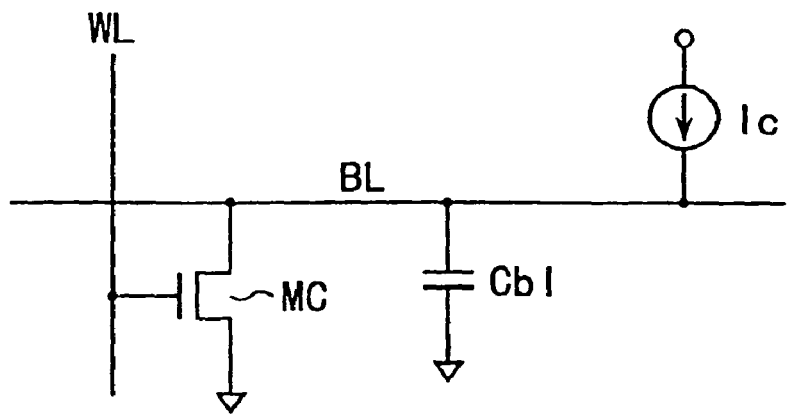
FIG. 17 is an equivalent circuit diagram by means of a constant current read method of the DRAM.

A potential change in the bit line by the second read method explained in FIG. 12 and FIG. 13, that is, in the case where the read is performed by supplying a constant current to the bit line, is verified. FIG. 17 shows an equivalent circuit used for this verification. For convenience, it is supposed that the potential of the bit line BL is precharged at 0 V, and that the potential Vwl of the word line WL is set at a value of not less than the threshold Vth (Vth0, Vth1) of the memory cell MC at t>0 as shown by the following Formula 5.

$$\mathrm{Vwl} > \mathrm{Vth} \quad \text{(Formula 5)}$$

It is supposed that a constant current Ic is supplied to the bit line BL at t>0, and that this current Ic is smaller than a saturation current Idsat at Vgs=Vwl of the cell transistor, as shown by the following Formula 6.

$$Ic < Idsat = (k/2)(Vwl - Vth)^2$$

$$\text{provided that } k = (W/L)(\in ox/tox)\mu eff \quad \text{(Formula 6)}$$

On this occasion, a change in the potential Vbl of the bit line BL is represented by the following Formula 7, letting Ids be a drain current of the cell transistor.

$$dVbl/dt = (1/Cbl)(Ic - Ids) \quad \text{(Formula 7)}$$

The cell transistor operates in a linear region, and thus Vbl<Vwl−Vth is obtained. In such a configuration, the drain current Ids of the cell transistor is derived from the following Formula 8.

$$Ids = k[Vwl - Vth - (½)Vbl]Vbl \quad \text{(Formula 8)}$$

If Formula 8 is substituted for Formula 7 and integrated, the following Formula 9 is obtained.

$$Vbl = \alpha \cdot \beta [1 - \exp(t/t0)] / [\beta - \alpha \cdot \exp(t/t0)]$$

$$\text{provided that } \alpha = Vwl - Vth + [(Vwl - Vth)^2 - 2Ic/k]^{1/2}$$

$$\beta = Vwl - Vth - [(Vwl - Vth)^2 - 2Ic/k]^{1/2}$$

$$t0 = 2Cbl/[k(\alpha - \beta)] \quad \text{(Formula 9)}$$

From the assumption of Formula 5 and Formula 6, α>β>0 is satisfied. Hence, Formula 9 shows an increasing function with a downward convex shape with respect to a time t, and Vbl(0)=0 and Vbl(∞)=β are obtained.

Figure 18:
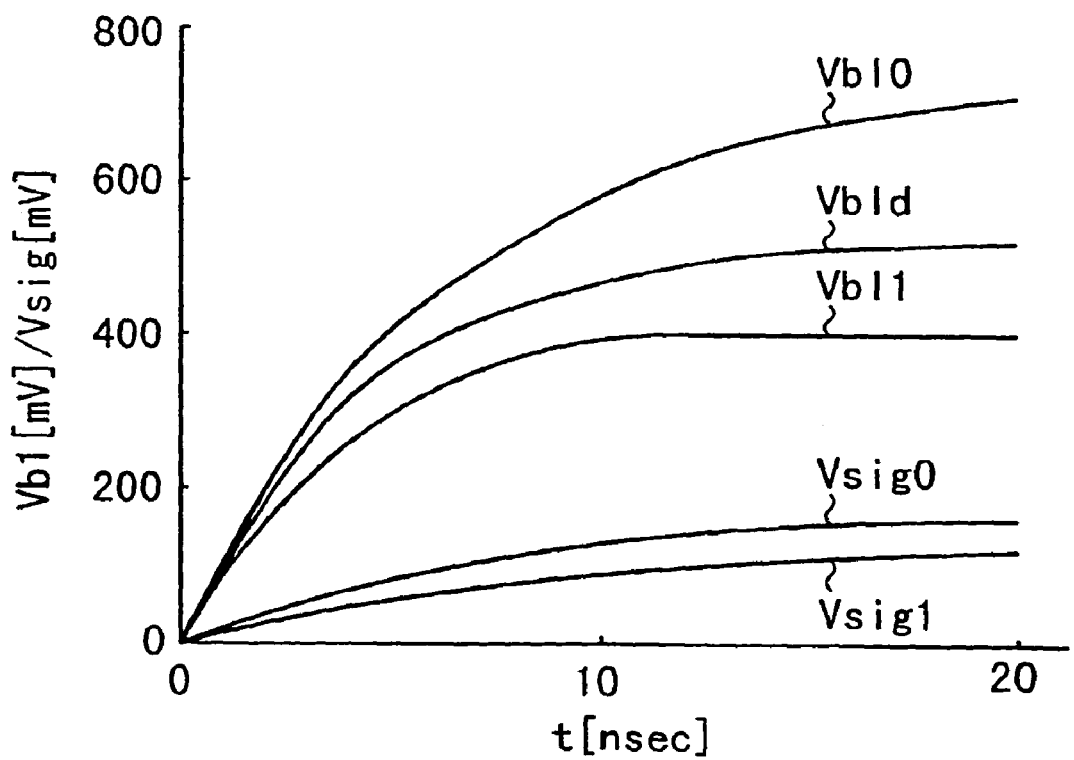
FIG. 18 is a diagram showing a change in the potential of a bit line by a read operation of the DRAM cell.

FIG. 18 shows the computational result of Formula 9. Assuming that the threshold of the "0" data cell is Vth0=0.3 V, the threshold of the "1" data cell is Vth1=−0.3 V, the threshold of the dummy cell is Vthd=0.05 V, the bit line capacitance is Cbl=100 fF, and that the gain coefficient of the cell current is k=2.0×$10^{-5}$ (A/$V^2$), and using Ic=0.9 Idsat=13 μA and Vwl=1.5 V, the bit line voltage Vbl0 in the "0" data and the bit line voltage Vbl1 in the "1" data are shown with their respective signal voltages Vsig0 and Vsig1, and a reference bit line voltage Vbld. From this result, it is known that a signal of 100 mV can be obtained after 10 nsec from the rise of the word line.

As for the dummy cell, it is preferable to have an MOS transistor with the same structure as the memory cell, the bulk potential of which can be appropriately set. This is because it follows the process change or temperature change of the threshold of the memory cell in a self-aligned manner. In this case, the signal quantities of the "0" and "1" data can be optimally set by selecting the bulk potential of the dummy cell.

"0" Write Speed

Figure 19:
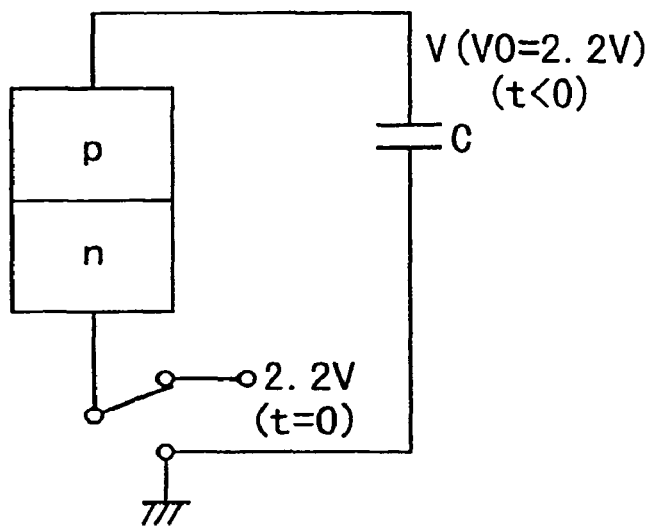
FIG. 19 is an equivalent circuit diagram for explaining the "0" write speed of the DRAM cell.

In the first embodiment of the present invention, in a "0" write, holes in the bulk region are extracted by providing a forward bias to the pn junction of the p-type bulk region and the n-type drain of the memory transistor as described above. The speed of this "0" write will be examined below using an equivalent circuit in FIG. 19.

It is supposed that the pn junction is in an equilibrium state in which both a p-layer and an n-layer are at 2.2 V at t=0. When the n-side is set at 0 V at t>0, a change in the potential of the bulk (P-type layer) having a capacitance C is computed. If the potential of the P-type layer at a point in time t is V, the following Formula 10 is obtained.

$$t = -C \int_{Vo}^{V} dV/I \quad \text{(Formula 10)}$$

where I is a current at the pn junction and derived from the following Formula 11.

$$I = Is[\exp(V/\eta \cdot Vt) - 1] \quad \text{(Formula 11)}$$

Figure 20:
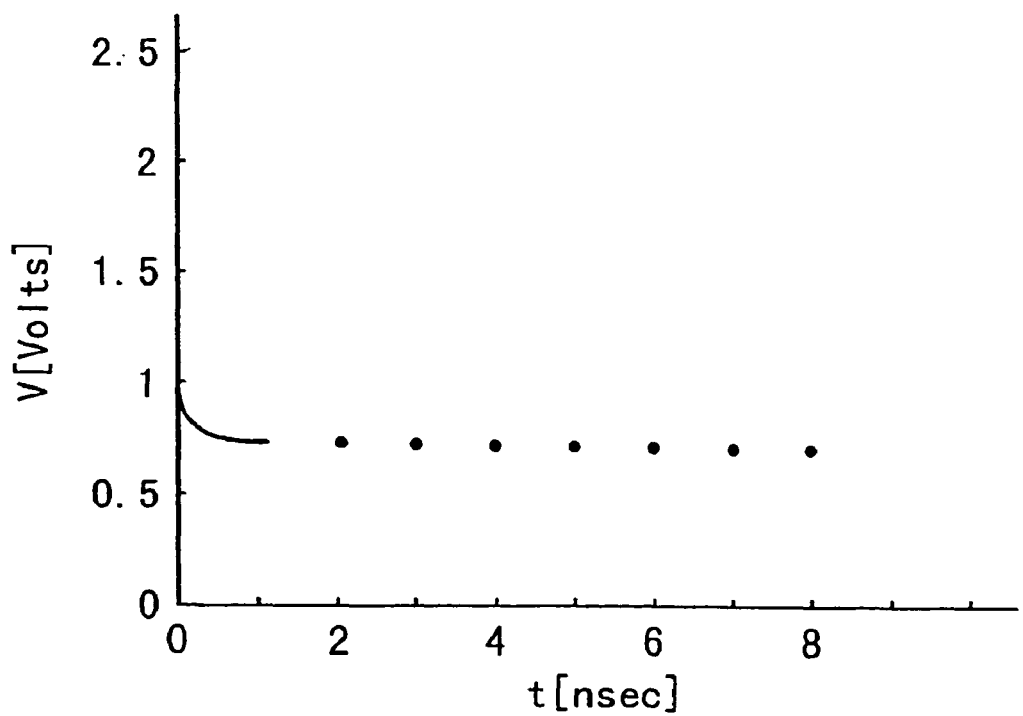
FIG. 20 is a diagram showing a change in the potential of a p-type layer in FIG. 19.

In Formula 11, Is is a saturation current, η is a coefficient between 1 and 2, Vt is a thermal voltage, and Vt=kT/q. Formula 11 is substituted for Formula 10 and integrated so as to obtain the following Formula 12.

$$V = \eta \cdot Vt \cdot \ln[1/\{1-[1-\exp(-V0/\eta \cdot Vt)]\exp(-t/t0)\}] \quad \text{(Formula 12)}$$

where t0 is a time constant given by t0=C·η·Vt/Is. The result of the numerical computation of Formula 12 with the use of numerical values of the following Formula 13 is shown in FIG. 20.

$$Is = Js \cdot Aj$$

$$Js = 6.36 \times 10^{-5} \text{ A/m}^2$$

$$Aj = 0.01 \text{ }\mu m^2$$

$$T = 8.5° \text{ C.}$$

$$Vt = 0.0309$$

$$\eta = 1$$

$$t0 = 10.7 \text{ sec}$$

$$V0 = 2.2V \quad \text{(Formula 13)}$$

It is known from the result of the numerical computation in FIG. 20 that the potential of the bulk (p-type layer) is stabilized at 0.7 V or less in about 1 nsec at the time of "0" write.

Change in Potential of Bulk Region

Concerning the selectivity of a "0" write, the relation between the word line potential and the bulk potential is already explained referring to FIG. 16, and a change in bulk potential will be examined below in more detail. Namely, potential change in the bulk region in such an operation that after write is performed at the positive word line potential Vwl, the word line potential is decreased to a negative value to hold the data, and that the potential of the word line is raised again to a positive potential to perform read at a read potential Vr will be explained in detail.

The capacitance Cgb per unit area between the gate and the bulk (p-type layer) of the SOI substrate of the cell transistor is obtained from the following Formula 14 by using the potential difference Vgb between the gate and the bulk.

$$Cgb/Cox = 1/[1 + 2 \cdot lD^2(Vgb - \delta)/Vt]^{1/2} \quad \text{(Formula 14)}$$

The capacitance Cox per unit area of the gate oxide film is represented by Cox=∈ox/tox using a dielectric constant ∈ox and the oxide film thickness tox. lD is a dimensionless number in which a Debye length LD is normalized by γ=(∈si/∈ox) tox, and given by the following Formula 15.

$$lD = (\varepsilon ox/\varepsilon si)LD/tox$$
$$= (\varepsilon ox/\varepsilon si)[kT \cdot \varepsilon si/(q^2 NA)]^{1/2}/tox \quad \text{(Formula 15)}$$

where a parameter δ is fixed on the following condition. Namely, Formula 14 is derived by obtaining a thickness wp of a depletion layer which extends in the bulk, (which is derived by normalizing a thickness Wp of an actual depletion layer by γ and making it dimensionless) by the following Formula 16.

$$wp = -1 + [1 + lD^2(Vgb - \delta)/Vt]^{1/2} \quad \text{(Formula 16)}$$

to which the condition that wp=lD is obtained by Vgb=VFB (flat band voltage), that is, the following Formula 17 is given.

$$lD = -1 + [1 + lD^2(Vgb - \delta)/Vt]^{1/2} \quad \text{(Formula 17)}$$

When this Formula 17 is solved, the parameter δ is shown by the following Formula 18.

$$\delta = VFB - (1 + 2/lD)Vt \quad \text{(Formula 18)}$$

The dependency of Cgb on Vgb is derived from Formula 14 and Formula 18, but this does not cover a broad region of Vgb. Therefore, the value of Cgb with respect to the value of the broad Vgb is computed, provided that Cgb=0 when the gate-source voltage Vgs exceeds the threshold Vth of the transistor, and that when Cgb/Cox exceeds 1, this is replaced with 1.

Figure 21:
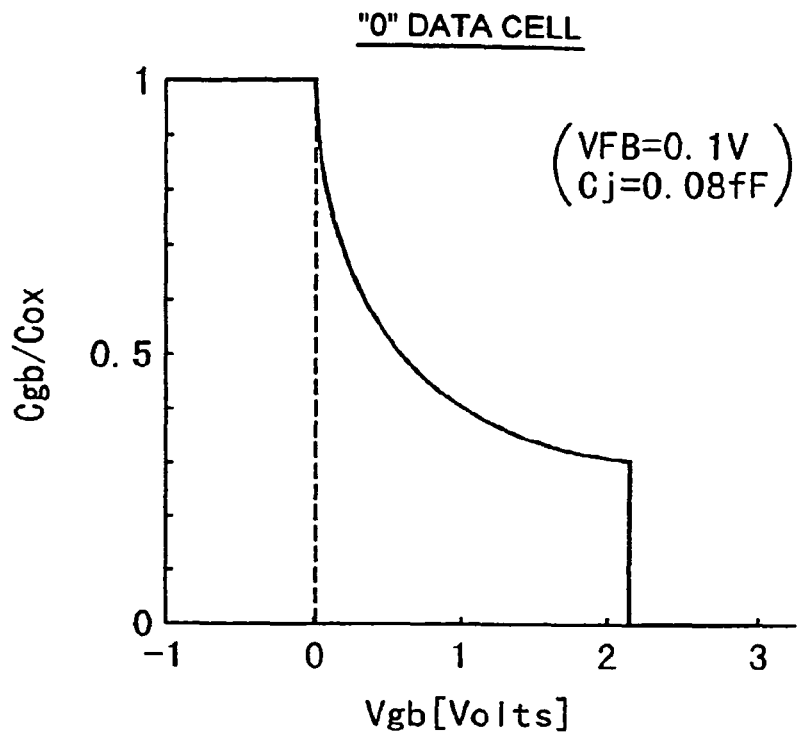
FIG. 21 is a diagram showing a gate capacitance Cgb-voltage Vgb curve of a "0" data cell of the DRAM cell (in the case of a p-type polycrystalline silicon gate)

The computational result thereof will be shown in FIG. 21. This shows the relation between the word line-bulk voltage Vgb and the capacitance Cgb of the "0" data cell in the case where the word line is a p-type polycrystalline silicon gate. The conditions thereof are tox=2.5 nm, NA=5×10$^{18}$/cm$^3$, a temperature of 85° C., VFB=0.1 V, Vth0=1.5 V, VB=−0.7 V, Cox=0.14 fF, and Cj=0.08 fF.

Meanwhile, a bulk potential change ΔVb with respect to a gate voltage change ΔVg is derived from the following Formula 19.

$$\Delta Vb = [Cgb/(Cgb + Cj)]\Delta Vg \quad \text{(Formula 19)}$$

where Cj is a capacitance which enters the bulk in series (the pn junction capacitance explained above), and if Formula 19 is transformed with the capacitance constant, the following Formula 20 is obtained.

$$\Delta Vg = (1 + Cgb/Cj)\Delta Vgb \quad \text{(Formula 20)}$$

When Formula 20 is integrated, the following Formula 21 is obtained.

$$Vg - Vg0 = \int_{Vgb0}^{Vgb}[1 + Cgb/Cj]dVgb \quad \text{(Formula 21)}$$

When Formula 21 is transformed, the following Formula 22 is obtained.

$$Vgb - Vgb0 = (Vg - Vg0) - \int_{Vgb0}^{Vgb}(Cgb/Cj)dVgb \quad \text{(Formula 22)}$$

Figure 22:
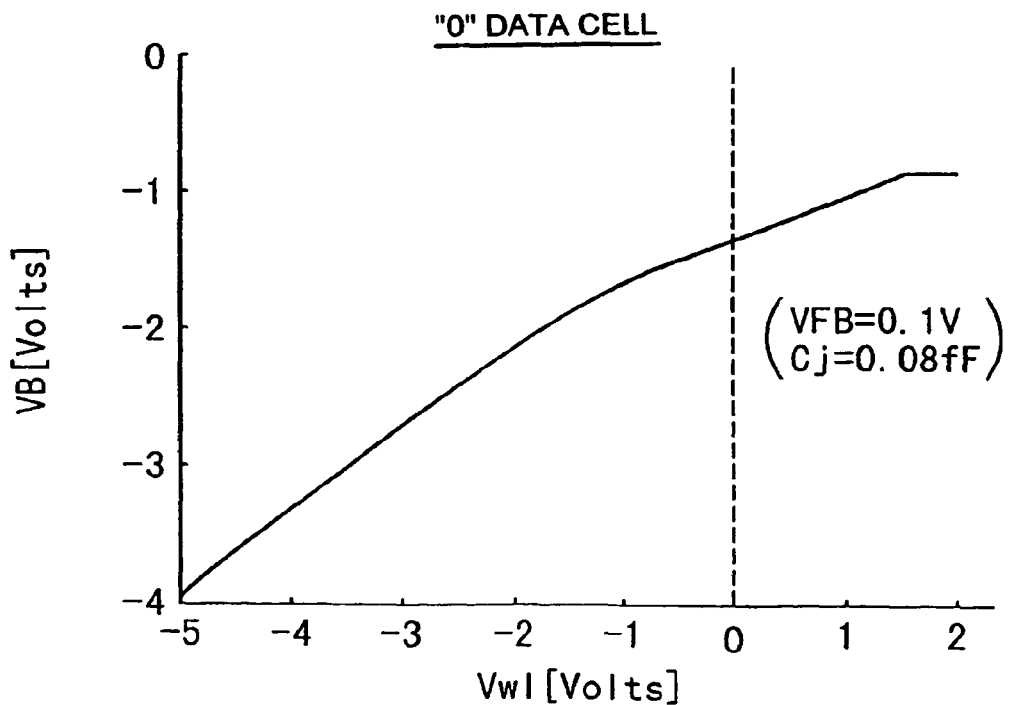
FIG. 22 is a diagram showing the relation between a word line potential Vwl and a bulk potential VB of the "0" data cell.

If this Formula 22 is computed, the change ΔVb of the bulk voltage VB can be derived from the voltage change ΔVg of the gate voltage Vwl (word line). The computational result for the "0" data cell under the same parameter conditions as those in the computation in FIG. 21 shown above will be shown in FIG. 22. It is known from this result that if a "0" write is performed while the word line is set at 2.0 V, the bulk is set at −0.7 V, and then the word line is decreased to −2.0 V to hold the data, for example, the bulk potential is held at −2.1 V. If the word line is further raised to 1.0 V and a read is performed, the bulk increases to only about −0.9 V. Namely, as for the "0" data cell, the bulk potential in a read is lower than that in a write, and hence the read margin is extended by 0.2 V.

Figure 23:
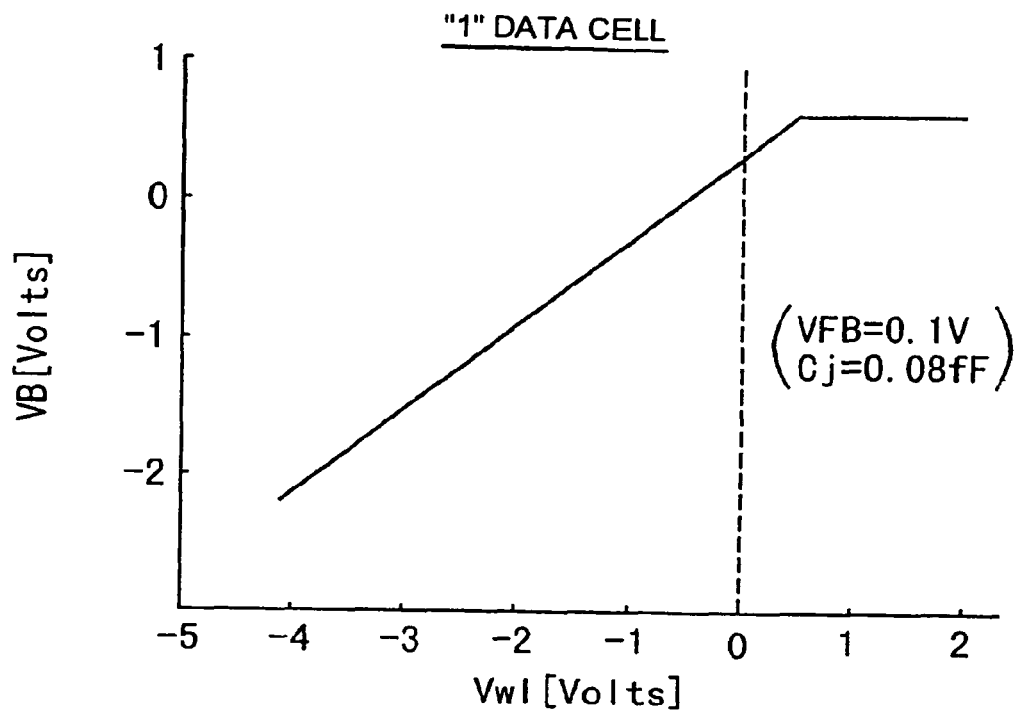
FIG. 23 is a diagram showing the relation between the word line potential Vwl and the bulk potential VB of an "1" data cell of the DRAM cell.
Figure 24:
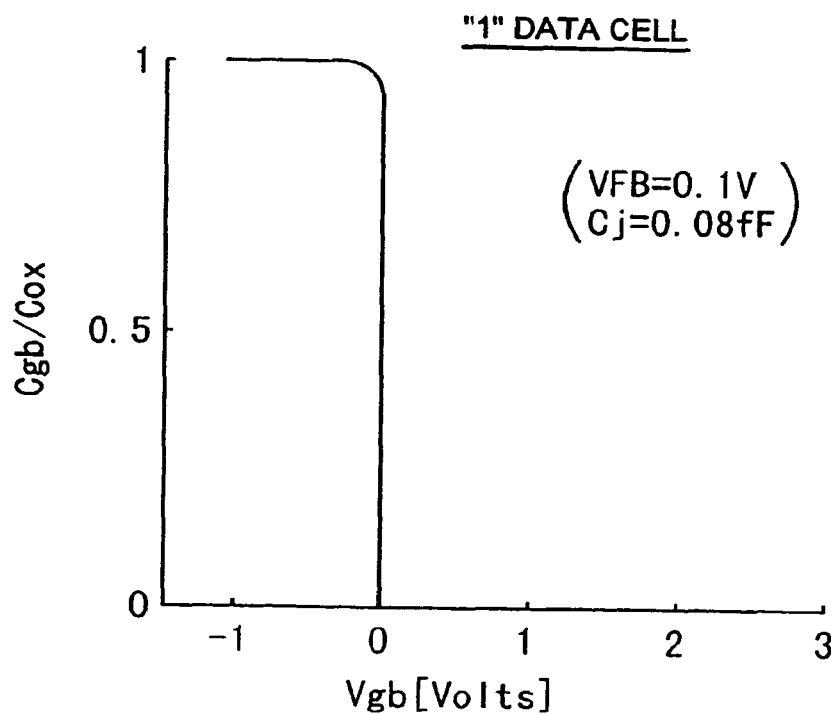
FIG. 24 is a diagram showing a gate capacitance Cgb-voltage Vgb curve of the "1" data cell (in the case of the p-type polycrystalline silicon gate)

The result when the same computation is performed for the "1" data cell is shown in FIG. 23. The dependency of the capacitance Cgb on the voltage Vgb on this occasion is shown in FIG. 24. The parameters used are the same as those in FIG. 21 and FIG. 22. It is known that in the case of the "1" data, the bulk is 0.6 V immediately after write and −1.0 V in a state where the word line is held at −2.0 V. "0" data can be written in principle up to a bulk potential of −1.0 V, but the bulk increases by 0.3 V to −0.7 V by the capacitive coupling (the coupling ratio is 18%) of the pn junction when the bit line (which has been decreased to 1.5 V in a "0" write) is returned to 0 V. Accordingly, in the "0" data in FIG. 22, the potential immediately after write is set at −0.7 V.

Also in the case of a "1" write, there is capacitive coupling from the bit line, but it differs from the case of a "0" write in that while the "1" data is written while the bulk current Isub is passed, the bulk potential is higher than a built-in voltage of 0.6 V to the potential V shown by the following Formula 23.

$$Isub = Is[\exp\{V/(\eta \cdot Vt) - 1\}] \quad \text{(Formula 23)}$$

When Isub=14 nA, Is=6.36×10$^{-20}$ A, Vt=0.031 V, and η=1.2 are substituted, V=0.96 V is obtained. Therefore, the bulk potential is nearly 1 V immediately after the "1" data is written, and 0.6 V or more even if it is decreased by 0.3 V by a decrease in the bit line from 1.5 V to 0 V and coupling, and thereafter becomes 0.6 V by a forward current from a diode. Namely, the bulk potential immediately after the "1" data is written is substantially 0.6 V.

The computation up to here is for the case where the flat band voltage is VFB=0.1 V. This corresponds to the case where a gate electrode (word line) made of p-type polycrystalline silicon is formed on a p-type silicon layer of an SOI substrate. Next, the result of the similar computation performed in the case where a gate electrode made of n-type polycrystalline silicon film is used in the same SOI substrate will be shown. In this case, the flat band voltage is VFB=−1.1 V.

Figure 25:
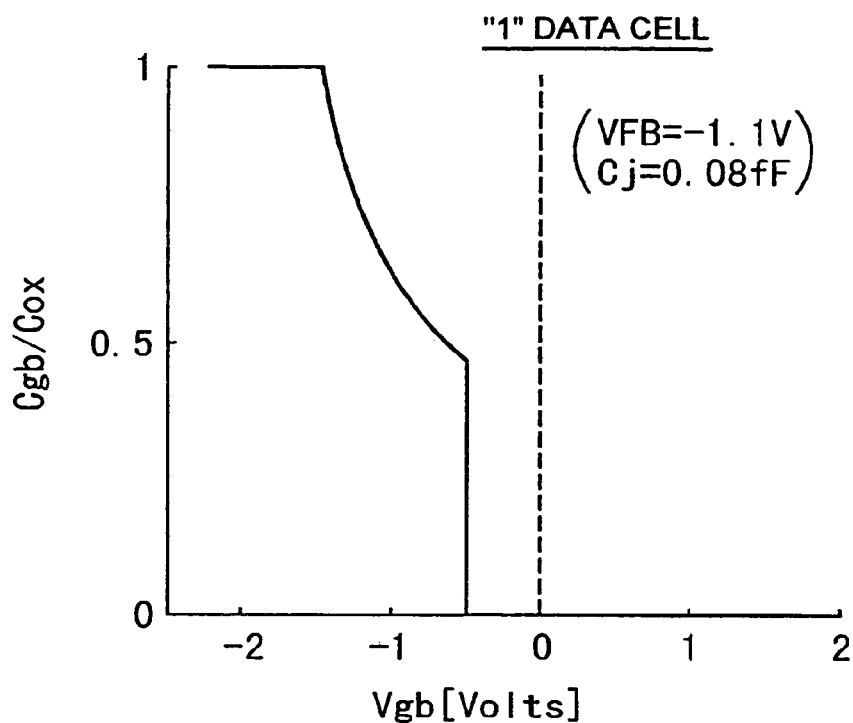
FIG. 25 is a diagram showing a gate capacitance Cgb-voltage Vgb curve of the "1" data cell (in the case of an n-type polycrystalline silicon gate)
Figure 26:
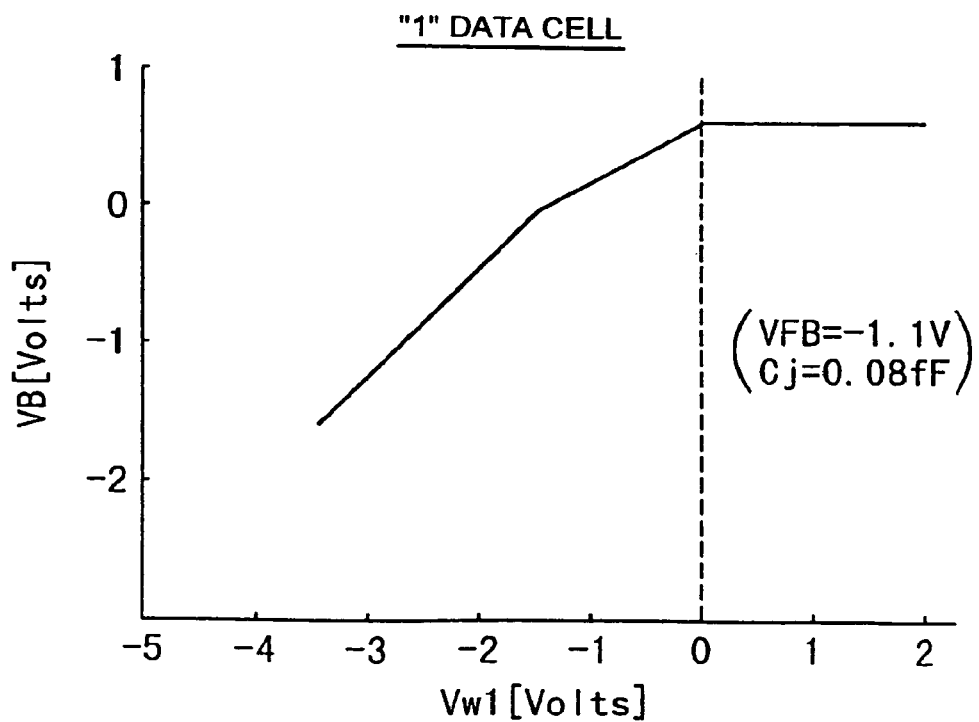
FIG. 26 is a diagram showing the relation between the word line potential Vwl and the bulk potential VB of the "1" data cell (in the case of the n-type polycrystalline silicon gate)

FIG. 25 shows the result of examining a capacitance Cgb-voltage Vgb characteristic regarding the "1" data cell. Similarly, FIG. 26 shows the result of examining the relation between the word line voltage Vwl and the bulk voltage VB regarding the "1" data cell. Parameters other than the flat band voltage are the same as those in FIG. 21 and FIG. 22. In all cases, the threshold is set at Vth1=0 V.

From these results, assuming that the threshold Vth0=1 V of the "0" data can be secured, the word line voltage is 1.5 V at the time of a write, and 0.5 V at the time of a read. Assuming that the word line voltage while holding the data is −2.5 V, the bulk voltage of the "1" data cell decreases to −0.8 V. Accordingly, compared with the case of VFB=0.1 V where the p-type polycrystalline silicon gate is used, it is disadvantageous by 0.2 V for the same word line amplitude.

Figure 27:
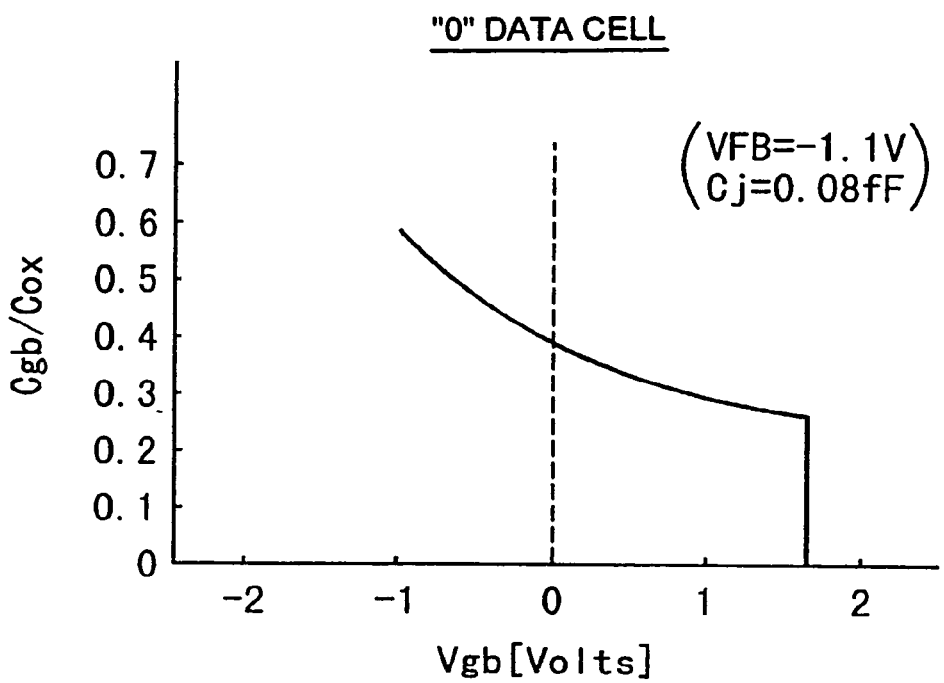
FIG. 27 is a diagram showing a gate capacitance Cgb-voltage Vgb curve of the "0" data cell (in the case of the p-type polycrystalline silicon gate)
Figure 28:
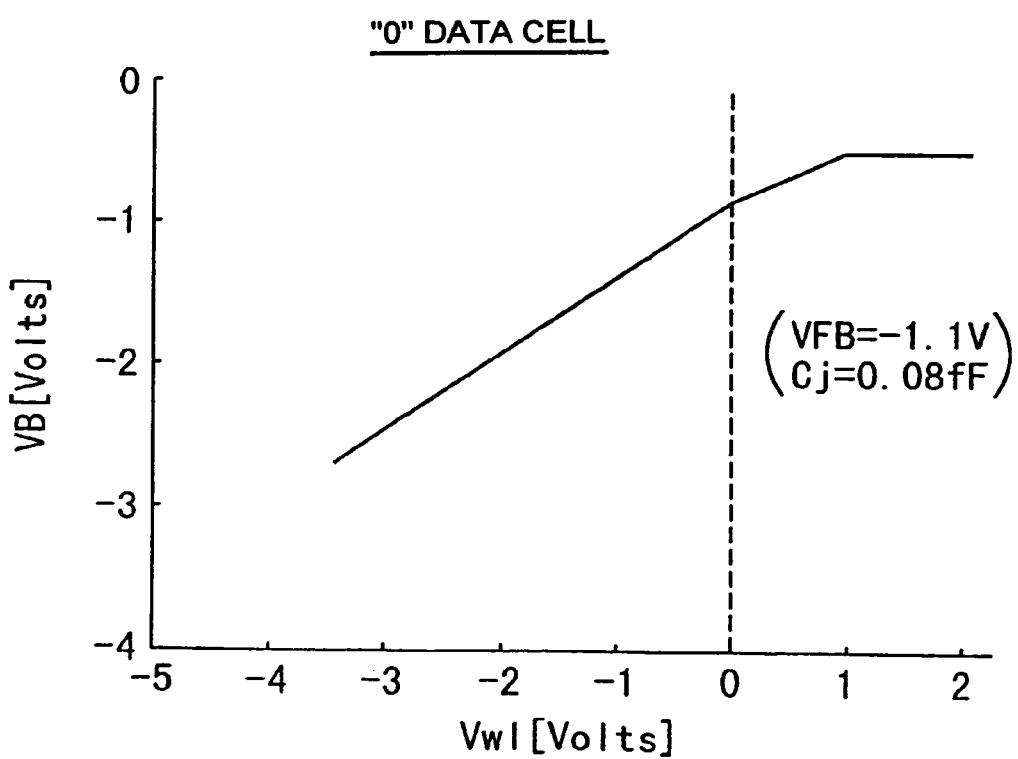
FIG. 28 is a diagram showing the relation between the word line potential Vwl and the bulk potential VB of the "0" data cell (in the case of the n-type polycrystalline silicon gate)

FIG. 27 and FIG. 28 show the results of examining a capacitance Cgb-voltage Vgb characteristic and a word line voltage Vwl-bulk voltage VB characteristic at VFB=−1.1 V. The threshold is set here at Vth0=1 V. It is supposed that the bulk potential immediately after the "0" data is written is −0.8 V, but that when the bit line returns to a value near a precharge potential of 0 V, the bulk potential is raised by 0.3 V by the coupling of the pn junction to −0.5 V. Also in this case, the word line at the time of a write is 1.5 V, but that at the time of a read is 0.5 V. Thus, the bulk potential is restored by only 0.15 V to −0.65 V.

Operating conditions in the above cases of the p-type polycrystalline silicon gate and the n-type polycrystalline silicon gate are placed on the following Table 1 and Table 2.

TABLE 1 p-type polycrystalline silicon gate

Vwl (read) = 1 V
Vwl (hold) = −2 V
Vwl (write) = 2 V
Vbl ("0" write) = −1.6 V
Vbl ("1" write) = 1.6 V
Vth0 = 1.5 V
Vth1 = 0.5 V TABLE 1-continued p-type polycrystalline silicon gate bulk potential VB when "1" data cell is read = 0.6 V
bulk potential VB when "0" data cell is read = −1 V

TABLE 2 n-type polycrystalline silicon gate

Vwl (read) = 0.5 V
Vwl (hold) = −2.5 V
Vwl (write) = 1.5 V
Vbl ("0" write) = −1.4 V
Vbl ("1" write) = 1.4 V
Vth0 = 1.0 V
Vth1 = 0 V
bulk potential VB when "1" data cell is read = 0.6 V
bulk potential VB when "0" data cell is read = −0.6 V Incidentally, in the above Tables 1 and 2, the bit line level Vbl ("1" write) at the time of a "1" write is unfixed since it is fixed by a substrate current (hole current) and a write time, and a provisional set value is shown here. From the above, the advantage of the use of the p-type polycrystalline silicon gate becomes clear. In either case, the word line amplitude is 4 V. The following measures are required to lower this voltage:

(A) reduction in dispersion of the threshold Vth;

(B) secureness of a memory cell current; and (C) reduction in the ratio of Cj/Cox.

As for (A) and (B), although ΔVth=Vth0−Vth1=1.0 V has been premised up to here, it is possible to tightly control this to the extent of 0.8 V to 0.6 V. If ΔVth=0.6 V can be realized, it is possible to hold down the word line amplitude to 2×1.2 V=2.4 V.

(C) will be examined in detail below, because it is a method capable of lowering the voltage of the word line amplitude without decreasing the margin of ΔVth.

The demand of (C) can be complied with by making a thickness Tsi of the silicon layer of the SOI substrate thinner than the 100 nm that has been assumed so far, and simultaneously with this or independently from this, by lowering the impurity concentration of the n-type source/drain diffusion regions. The former corresponds to a reduction in the pn junction capacitance Cj by a reduction in the area of the pn junction. The latter also reduces the junction capacitance Cj between the source/drain diffusion regions and the bulk region as well since a condition is given that the depletion layer extends to the n-type diffusion region side.

Figure 29:
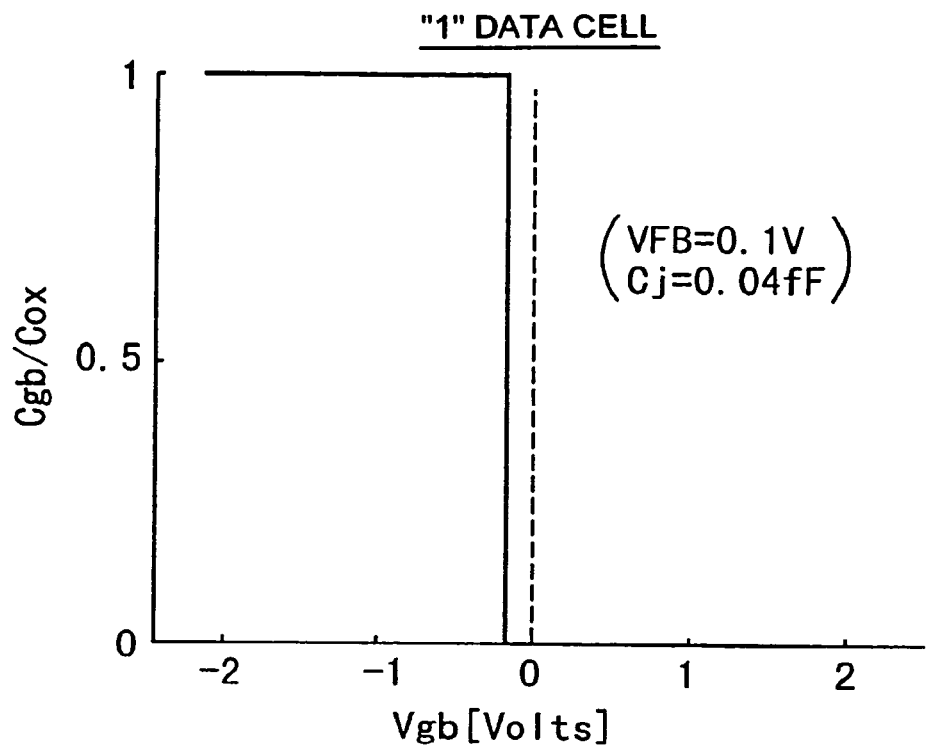
FIG. 29 is a diagram showing a gate capacitance Cgb-voltage Vgb curve of the "1" data cell when a thin silicon layer is used (in the case of the p-type polycrystalline silicon gate)
Figure 30:
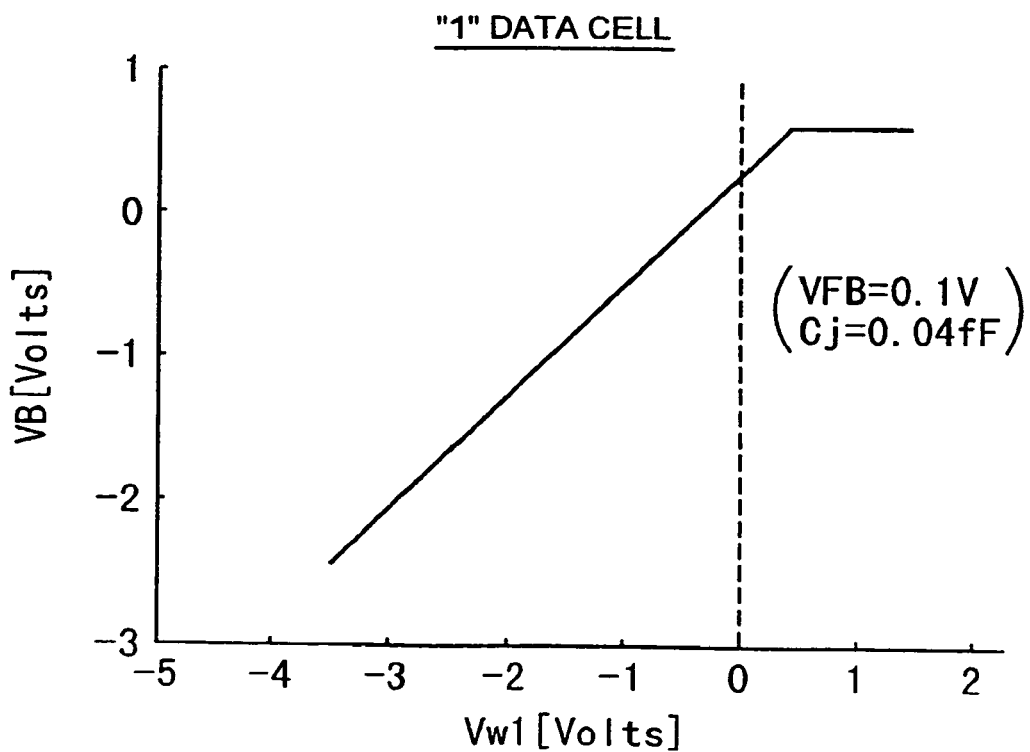
FIG. 30 is a diagram showing the relation between the word line potential Vwl and the bulk potential VB of the "1" data cell.

Concerning the case where in place of the junction capacitance Cj=0.08 fF used for verification up to here, Cj=0.04 fF (which is half) is used. A Cgb-Vgb curve and a Vwl-VB curve are shown respectively in FIG. 29 and FIG. 30. Conditions other than Cj are the same as those in FIG. 23 and FIG. 24, and the gate electrode is p-type polycrystalline silicon. Cj=0.04 fF corresponds to the case where the thickness of the silicon layer is 50 nm.

From this result, if the word line potential is lowered to −2.0 V after a bulk potential of 0.6 V is written regarding the "1" data cell, the bulk potential drops to −1.3 V. Accordingly, it is found that the word line potential necessary to lower the bulk potential to −1 V, that is, the word line potential Vwl (hold) necessary to hold data, is Vwl (hold)=−1.6 V.

Figure 31:
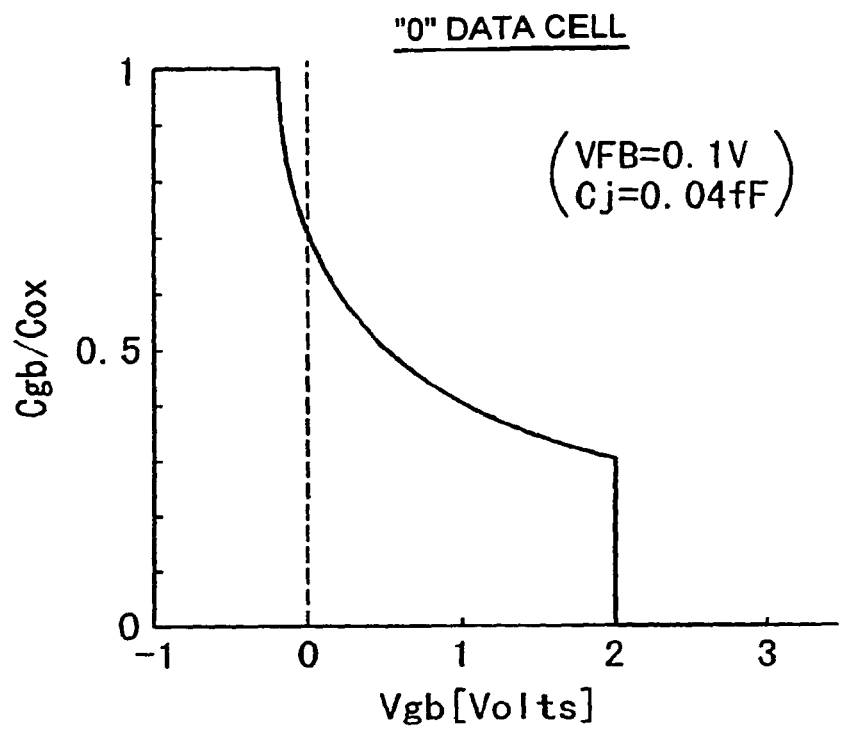
FIG. 31 is a diagram showing a gate capacitance Cgb-voltage Vgb curve of the "0" data cell when the thin silicon layer is used (in the case of the p-type polycrystalline silicon gate)
Figure 32:
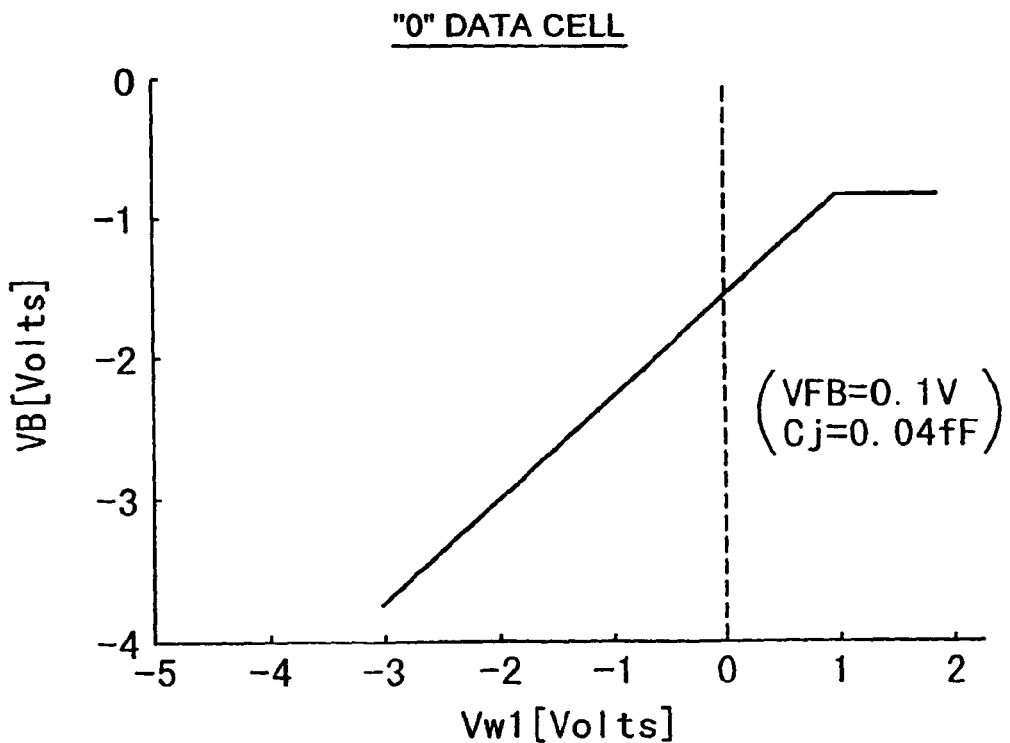
FIG. 32 is a diagram showing the relation between the word line potential Vwl and the bulk potential VB of the "0" data cell.

Similarly, regarding the "0" data cell, a Cgb-Vgb curve and a Vwl-VB curve when Cj=0.04 fF is used are respectively shown in FIG. 31 and FIG. 32. Conditions other than Cj are the same as those in FIG. 21 and FIG. 22.

Operating conditions of the DRAM cell when Cj is reduced by using the SOI substrate with the thin silicon layer (Tsi=50 nm) as described above are put in order in the following Table 3 by contrast with Table 1.

TABLE 3

| |
|---|
| Vwl (read) = 0.8 V |
| Vwl (hold) = −1.6 V |
| Vwl (write) = 1.6 V |
| Vbl ("0" write) = −1.6 V |
| Vbl ("1" write) = 1.6 V |
| Vth0 = 1.3 V |
| Vth1 = 0.3 V |
| bulk potential VB when "1" data cell is read = 0.6 V |
| bulk potential VB when "0" data cell is read = −1 V |

From the above result, it is known that if the thickness Tsi of the silicon layer is reduced to half from 100 nm to 50 nm to reduce the capacitance Cj, the word line amplitude can be decreased from 4 V to 3.2 V. It is noteworthy that 1 V can be still secured as the threshold difference ΔVth between the data "0" and "1".

If the silicon layer of the SOI substrate can be further thinned to approximately 30 nm, it is possible to make the voltage lower. However, if the silicon layer is excessively thinned, the silicon layer is completely depleted, which causes the danger of losing the memory function itself. Accordingly, approximately 50 nm is appropriate for the thickness of the silicon layer.

Figure 33:
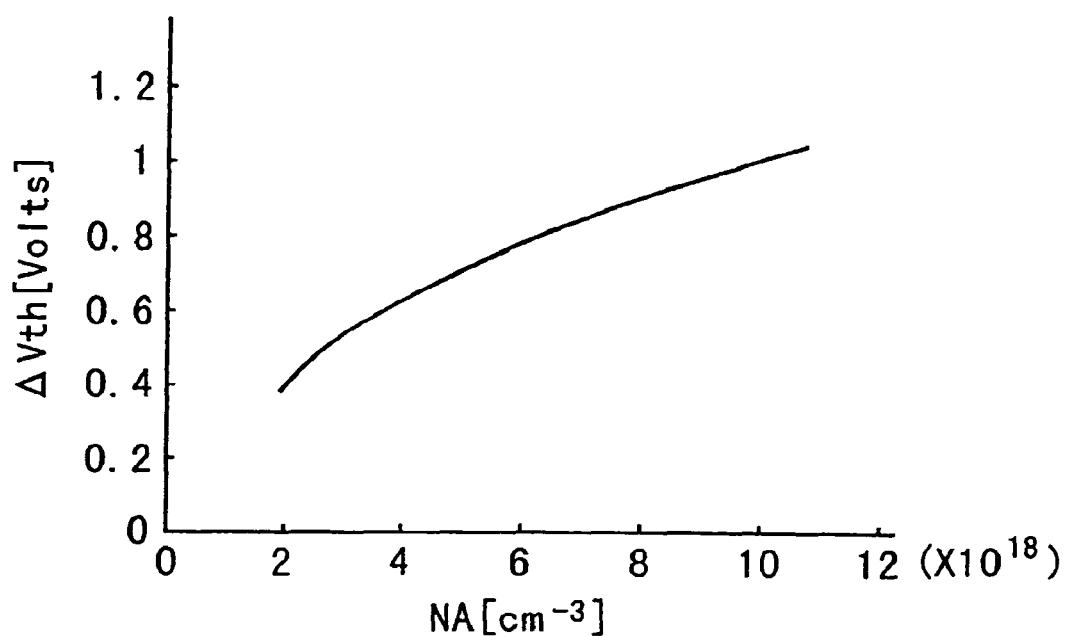
FIG. 33 is a diagram showing the relation between an impurity concentration of a silicon layer and a difference in threshold between the "0" and "1" data.

FIG. 33 shows the relation between the threshold difference ΔV between the bulk potentials VB of −1 V and 0.6 V and an impurity concentration NA of the silicon layer, provided that the gate oxide film thickness is Tox=2.5 nm and that the temperature is T=85° C. From this relation, it is known that NA=$1.0 \times 10^{19}$/cm$^3$, more or less, is necessary in order to secure ΔVth=1 V, in which case the impurity concentration is, however, too much, and hence the impurity concentration is set at NA=$8 \times 10^{18}$/cm$^3$, resulting in ΔVth=0.8 V. On this occasion, the operating conditions in Table 3 are amended partly, whereby the following Table 4 is provided.

TABLE 4

| |
|---|
| Vwl (read) = 0.7 V |
| Vwl (hold) = −1.6 V |
| Vwl (write) = 1.4 V |
| Vbl ("0" write) = −1.6 V |
| Vbl ("1" write) = 1.4 V |
| Vth0 = 1.1 V |
| Vth1 = 0.3 V |
| bulk potential VB when "1" data cell is read = 0.6 V |
| bulk potential VB when "0" data cell is read = −1 V |

In Table 4, 1.4 V is a provisional set value since the bit line level Vbl ("1" write) at the time of "1" write is fixed by the substrate current (hole current) and write time. It seems to be possible to lower the voltage to such an extent by making the cell transistor have an ordinary structure instead of an LDD structure and increasing the substrate current lsub.

Under the above operating conditions, the maximum voltage related to the cell transistor is 3.0 V. The gate oxide film thickness is Tox=2.5 nm. Therefore, an electric field of approximately 12 MV/cm is applied to the gate oxide film the moment the "1" data is written, which causes uncertainty to reliability. It is undesirable, however, to increase the gate oxide film thickness in order to secure the reliability, since the capacitive coupling ratio to control the bulk potential is deteriorated. As a result, it is desirable to use a different insulating film with high dielectric constant such as $Al_2O_3$ in place of the silicon oxide film.

In order to further lower the voltage, it is desirable to reduce the thickness Tsi of the silicon layer of the SOI substrate to approximately 30 nm, enhance the threshold controllability of the cell transistor, and increase mobility. In consideration of these points, the lowering of the voltage to approximately 2.0 V to 2.5 V seems to be possible.

Figure 34:
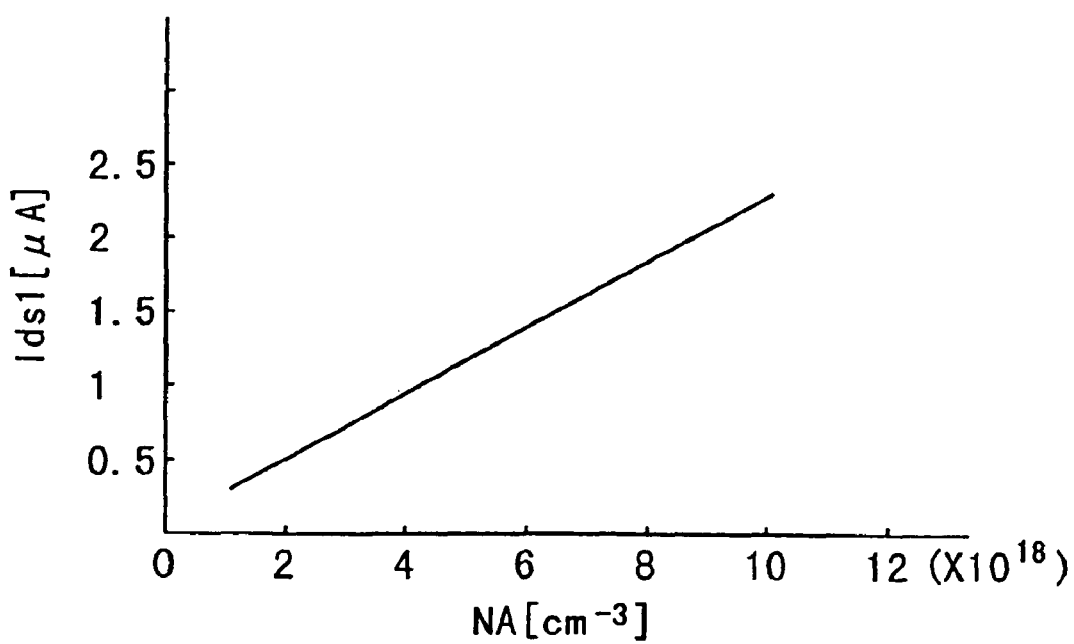
FIG. 34 is a diagram showing the relation between the impurity concentration of the silicon layer and a cell current of the "1" data cell.
Figure 35:
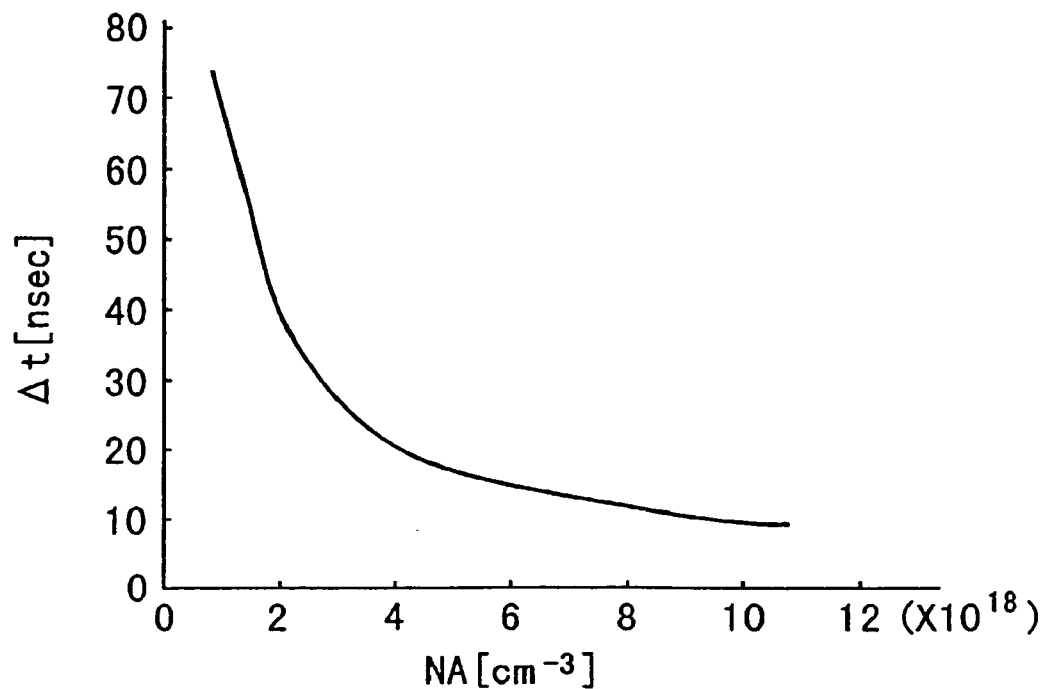
FIG. 35 is a diagram showing the relation between the impurity concentration of the silicon layer and a time of a change in the potential of the bit line.

A cell current Ids1 of the "1" write cell transistor which can be secured at the threshold difference ΔVth shown in FIG. 33 and a data read time Δt corresponding thereto are shown in FIG. 34 and FIG. 35 respectively. The cell current is found from Ids1=$(k/2)(\Delta Vth/2)^2$. The read time Δt is found as a period of time during the setting of the word line potential at the time of read at an intermediate value between Vth0 and Vth1, the turning on of only the "1" data cell, and a discharging of 200 mV of the bit line with a capacitance of Cbl=100 fF from the precharge potential.

From this result, Ids1=1.4 μA and Δt=15 nsec at NA=$6 \times 10^{18}$/cm$^3$ are obtained.

Figure 36:
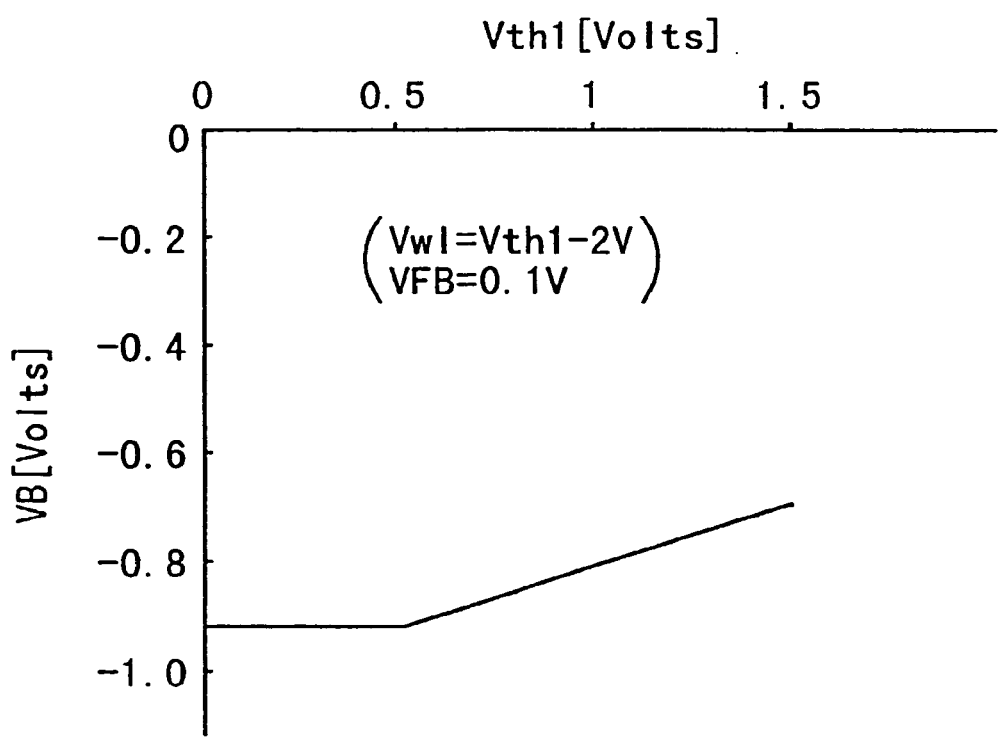
FIG. 36 is a diagram showing the relation between a bulk potential and a threshold when the "1" data cell holds data (in the case of the p-type polycrystalline silicon gate)

FIG. 36 shows the result of examining a reduction in the bulk potential VB at the time of hold in the "1" data cell in relation to the threshold Vth1. Conditions are the gate oxide film thickness tox=2.5 nm, impurity concentration NA=$5 \times 10^{18}$/cm$^3$, flat band voltage VFB=0.1 V, bulk potential VB1 of "1" data=0.6 V, gate oxide film capacitance Cox=0.14 fF, and junction capacitance Cj=0.04 fF. The hold potential of the word line is Vwl=Vth1−2 V.

From this result, in the case of Vth1=0.5 V or more, the bulk potential at the time of hold increases with Vth1. In the case of Vth1<0.5 V, the bulk potential is saturated at −0.93 V. This means that if the potential of the word line lowers to a value of Vth1<0.5V, the capacitance Cgb is saturated as the gate oxide film capacitance Cox.

Accordingly, when the flat band voltage is VFB=0.1 V, that is, when the gate electrode is a p-type polycrystalline silicon film, the setting at Vth1<0.5 V should be performed. Meanwhile, since it is known that ΔVth=Vth0−Vth=0.8V can be secured, Vth0<1.3 V is obtained. Hence, it may safely be said that Vth0=1.1 V and Vth1=0.3V are good selections.

The above operating points are set forth in the following Table 5, and device parameters are set forth in the following Table 6.

TABLE 5

| |
|---|
| Vth0 = 1.1 V, Vth1 = 0.3 V |
| Vwl (read) = 0.7 V |
| Vwl (hold) = −1.7 V |
| Vwl (write) = 1.5 V |
| Vbl ("0" write) = −1.5 V |
| Vbl ("1" write) = 1.5 V |
| VB ("1" read) = 0.6 V |
| VB ("0" read) = −1.0 V |
| VB ("1" write) = 0.6 V |
| VB ("0" write) = −0.9 V |
| VB ("1" hold) = −1.0 V |
| VB ("0" hold) = −2.4 V |
| Vmax = 3.2 V (Vds between non-selected WL and "1" write BL) |

TABLE 6

| |
|---|
| p-type polycrystalline silicon gate |
| NA = $5 \times 10^{18}$/cm$^3$ |
| tox = 2.5 nm |
| channel length L = 0.1 μm, channel width W = 0.1 μm |
| Tsi = 50 nm |
| k = (W/L)(εox/tox)μeff = $2.0 \times 10^{-5}$ A/V$^2$ |

On this occasion, it is the read characteristic of the DRAM cell that the time required to give a potential difference of 200 mV to the bit line capacitance Cbl=100 fF is Δt=15 nsec.

Figure 37:
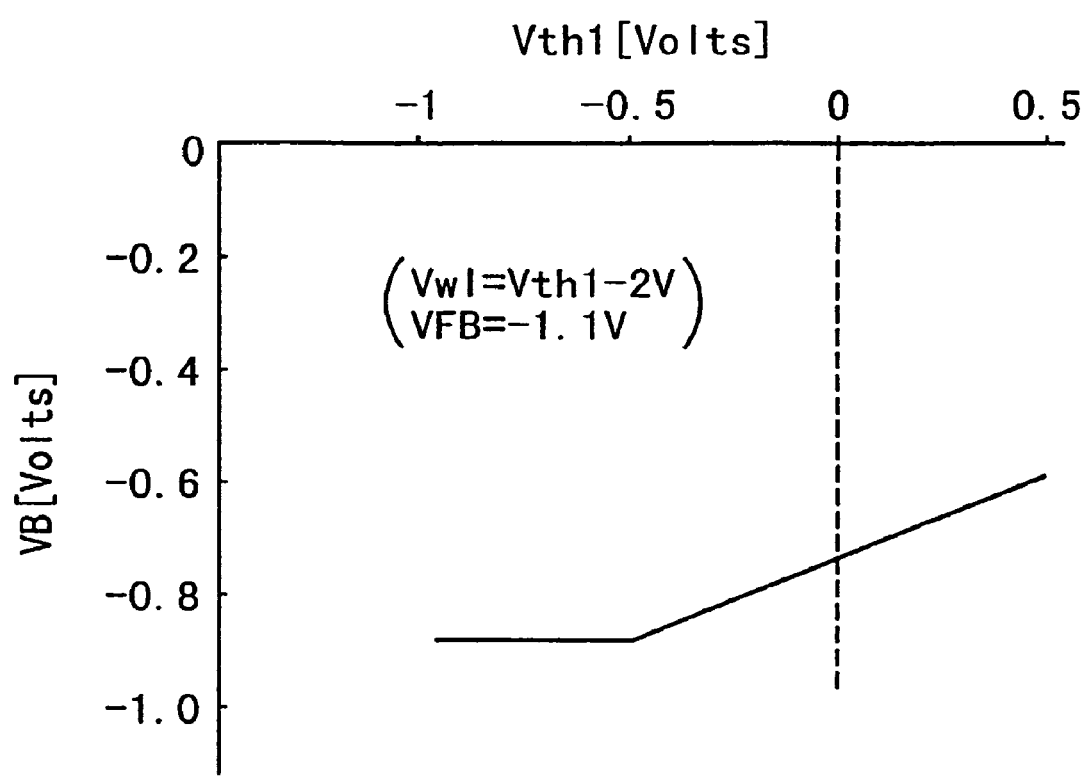
FIG. 37 is a diagram showing the relation between the bulk potential and the threshold when the "1" data cell holds data (in the case of the n-type polycrystalline silicon gate)
Figure 38:
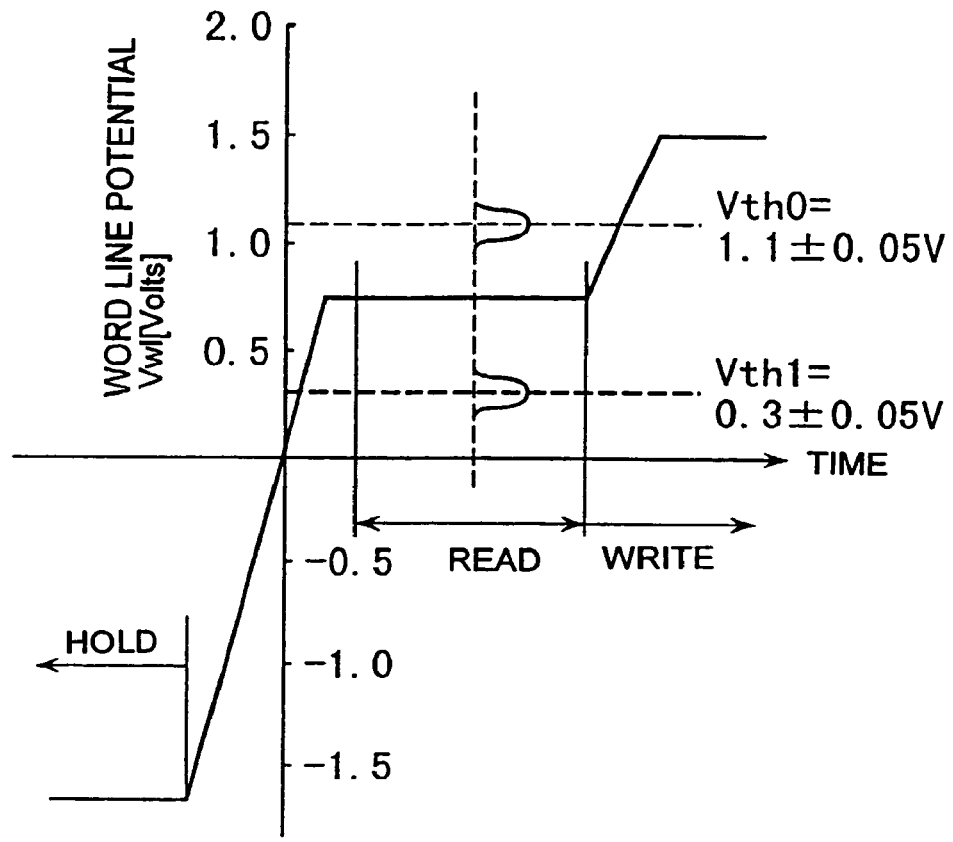
FIG. 38 is a diagram showing the relation between a change in the potential of the word line and threshold dispersion.

FIG. 37 shows the result of examining a reduction in the bulk potential VB at the time of hold in the "1" data cell in relation to the threshold Vth1 similarly in the case of VFB=−1.1 V (that is, in the case of the n-type polycrystalline silicon gate). Other conditions are the same as those in FIG. 36. Also in this case, Vth1<−0.5 V is suggested. Operating points and device parameters in this case are shown in the following Table 7 and Table 8 as against Table 5 and Table 6.

TABLE 7

| |
| --- |
| Vth0 = 0.1 V, Vth1 = −0.7 V |
| Vwl (read) = 0.3 V |
| Vwl (hold) = −2.7 V |
| Vwl (write) = 0.5 V |
| Vbl ("0" write) = −1.5 V |
| Vbl ("1" write) = 0.5 V |
| VB ("1" read) = 0.6 V |
| VB ("0" read) = −1.0 V |
| VB ("1" write) = 0.6 V |
| VB ("0" write) = −0.9 V |
| VB ("1" hold) = −1.0 V |
| VB ("0" hold) = −2.4 V |
| Vmax = 3.2 V (Vds between non-selected WL and "1" write BL) |

TABLE 8

| |
| --- |
| v-type polycrystalline silicon gate |
| NA = 5 × 10$^{18}$/cm$^3$ |
| tox = 2.5 nm |
| channel length L = 0.1 μm, channel width W = 0.1 μm |
| Tsi = 50 nm |
| k = (W/L)(εox/tox)μeff = 2.0 × 10$^{−5}$ A/V$^2$ |

On this occasion, it is the read characteristic of the DRAM cell that the time required to give a potential difference of 200 mV to the bit line capacitance Cbl=100 fF is Δt=15 nsec. However, it is a problem as to whether the sufficient substrate current Isub is passed or not when the Vbl ("1" write) is 0.5 V. If it needs to increase to 0.5 V or more, the maximum voltage Vmax rises with this increase. The use of p-type polycrystalline silicon for the gate electrode is more advantageous at this point. Specifically, the word line level Vwl (write) at the time of a write is fixed with respect to the threshold Vth0 fixed by the read characteristic and the "1" write characteristic, but when the bit line potential Vbl ("1" write) fixed by the "1" write characteristic independent of the word line level is higher than this word line potential Vwl, Vmax is fixed by Vbl ("1" write)−Vwl (hold). If Vwl (write)≧Vbl ("1" write) is provided, Vmax=Vwl (write)−Vwl (hole) is obtained, which can minimize the operating voltage.

The above computation is performed for the standard DRAM cell. Actually, there are variations in the threshold of a cell transistor between lots, between wafers, in a wafer, and in a chip, and there is a variation in k caused by the manufacturing process. There is also variation in bit line capacitance, variation in designed word line level, and the like. Moreover, it is necessary to consider coupling noise between bit lines.

In addition to the above, there is also variation in threshold Vth due to temperature. In the case where the method in which reference cells are used are close to memory cells, it is possible that some factors of the above-described variation in threshold are compensated and exert no influence.

In other words, by adopting such a read method, a limit can be basically set only to local variation in the chip that is a factor of the above described threshold variations. Variation in a threshold accompanying a variation in temperature can be completely cancelled systematically.

Figure 39:
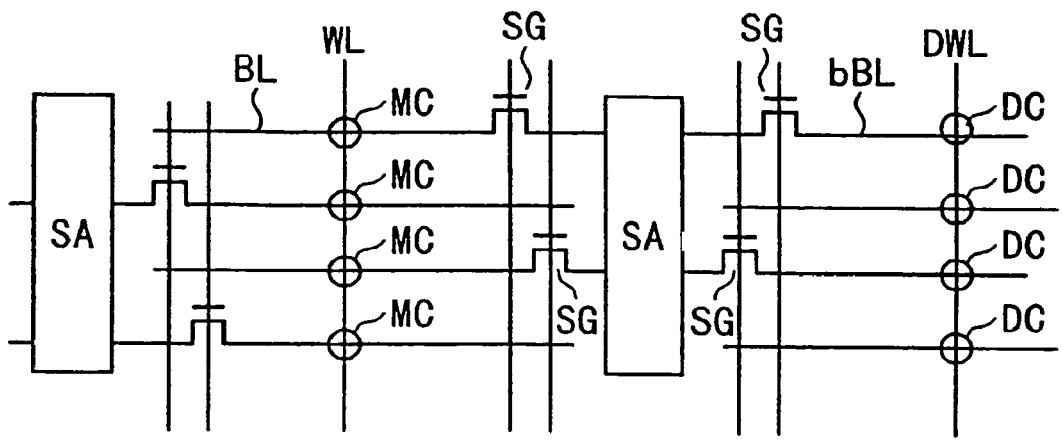
FIG. 39 is a diagram showing an example of the layout of sense amplifiers according to the first embodiment.

The memory cell according to the embodiment of the present invention uses non-destructive read-out and current read-out in principle as described above. FIG. 39 shows an example of the layout of sense amplifiers utilizing this memory cell characteristic. Bit lines BL and bBL, which make a pair, are arranged on both sides of a sense amplifier SA to form an open bit line system. When a word line WL is activated in one of the bit lines BL and bBL, a dummy word line DWL which selects a dummy cell DC is activated in the other. The dummy cell DC is composed of the same MOS transistor as the memory cell MC and gives an intermediate bulk potential between the data "0" and "1" to its bulk region.

In the example in FIG. 39, two pairs of bit lines BL and bBL are selected by a select gate SG and connected to one sense amplifier SA. Bit lines connected to some sense amplifier SA and bit lines connected to a sense amplifier SA adjacent thereto are alternately arranged. In this case, there are two sense amplifiers SA with respect to four memory cells MC selected simultaneously by one word line WL. Specifically, out of four data in the simultaneously selected four memory cells MC, two data are actually detected by the sense amplifier SA, and the remaining memory cell data are read out but not sent to the sense amplifier. In the embodiment of the present invention, unlike an ordinary DRAM, destructive read-out is not performed, and hence such a sense amplification system is possible.

Incidentally, it is important to fulfill the following two conditions at the same time in realizing the DRAM cell according to the first embodiment of the present invention as the 0.1 μm rule DRAM generation:

Condition 1: full utilization of substrate bias effect; and
Condition 2: reduction in leakage current from the pn junction.

These conditions 1 and 2 are demands that are contrary to each other with respect to the impurity concentration in the bulk region.

Figure 41:
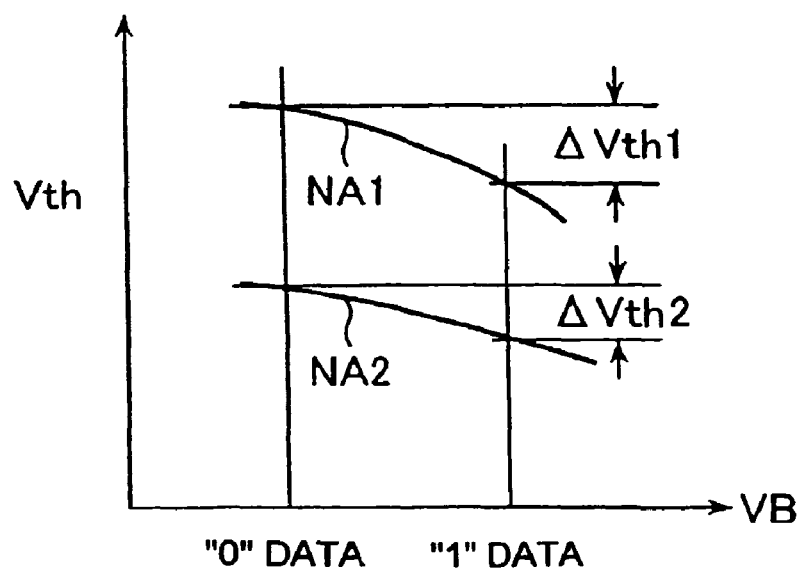
FIG. 41 is a diagram showing the relation between a bulk potential and a threshold voltage of an MOS transistor.

Condition 1 is required to increase the difference in threshold voltage between the "0" and "1" data by a large substrate bias effect. To attain this, the impurity concentration (acceptor concentration) NA of the p-type silicon layer 12 (bulk region) in FIG. 1 needs to be, for example, NA=5×10$^{18}$/cm$^3$ or more. This will be explained referring to FIG. 41. FIG. 41 shows the situation in which the relation between the bulk potential VB and the threshold Vth of the NMOS transistor differs depending on the acceptor concentration NA.

Assuming that when the acceptor concentration is NA1, the difference in threshold voltage between the "0" and "1" data is Δth1, and the threshold voltage difference at an acceptor concentration NA2 which is lower than NA1 is Δth2, such that Δth1>Δth2 is obtained. Namely, in order to increase the difference in threshold voltage between the "0" and "1" data, it is necessary that the acceptor concentration is higher than a certain level.

Incidentally, the acceptor concentration of not less than NA=5×10$^{18}$/cm$^3$ is needed also for a certain operation in a micro MOS transistor with a channel length of approximately L=0.1 μm.

Meanwhile, condition 2 is required to guarantee the data holding characteristic, in which case it is naturally desirable that the impurity concentration in the bulk region be low. In order to hold data for ten seconds in the bulk region in the 0.1 μm rule DRAM generation, it is necessary to keep a leakage from the pn junction of the source and the drain at or below 3×10$^{−17}$ A/cm$^2$. To decrease a tunnel current which is a main component of the leakage current, an electric field in the depletion layer formed at a pn junction portion needs to be kept at or below $2.5 \times 10^5$ V/cm. This value can be realized when the acceptor concentration in the bulk region is $NA=1.0 \times 10^{17}/cm^3$ or less. At the above acceptor concentration demanded by the condition 1, the electric field in the depletion layer is $1.7 \times 10^6$ V/cm (at the time of a reverse bias of 2 V), which can not comply with the demand of the condition 2.

Figure 40:
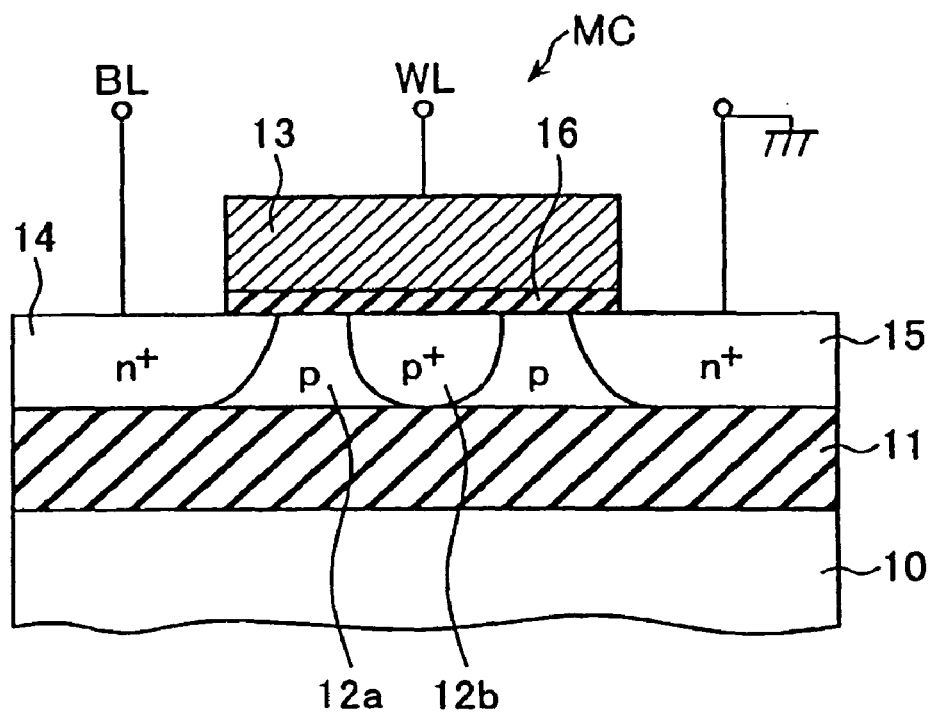
FIG. 40 is a sectional view of a DRAM cell structure according to a second embodiment shown by contrast with FIG. 1.

FIG. 40 shows the structure of a DRAM cell MC according to a second embodiment having possibility of fulfilling the above contrary conditions 1 and 2 by contrast with FIG. 1. A point of difference from the cell structure in FIG. 1 lies in the bulk region composed of the p-type silicon layer 12. Specifically, in this embodiment, the bulk region is composed of a p-type diffusion region 12a which has a relatively low boron concentration (acceptor concentration) and touches the drain/source diffusion regions 14 and 15 and a p⁺-type diffusion region 12b which has a high boron concentration (acceptance concentration) and is located in the central portion in the channel length direction away from the drain/source diffusion regions 14 and 15. The p⁺-type diffusion region 12b is formed deep to reach the silicon oxide film 11 at the bottom.

In this cell structure, one NMOS transistor with a high threshold voltage is equivalently sandwiched between two NMOS transistors with a low threshold voltage. On this occasion, the entire threshold voltage is dominated by the p⁺-type diffusion region 12b in the center. Meanwhile, the drain/source diffusion regions 14 and 15 each form a pn junction between the p-type diffusion region 12a with a low concentration and itself, and therefore the leakage current is smaller compared with the case where the entire bulk region is formed by the p⁺-type diffusion region with a high concentration. As a result, it is possible to fulfill the above two contrary conditions 1 and 2.

Figure 42A:
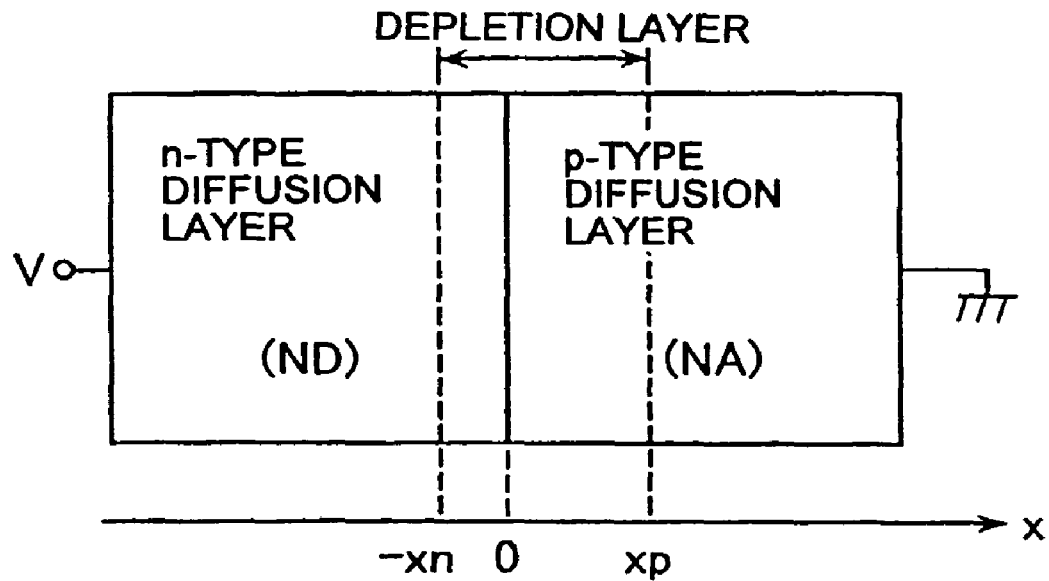
FIG. 42A is a diagram showing a basic pn junction structure for preliminary examination to examine the effectiveness of the cell structure in FIG. 40.
Figure 42B:
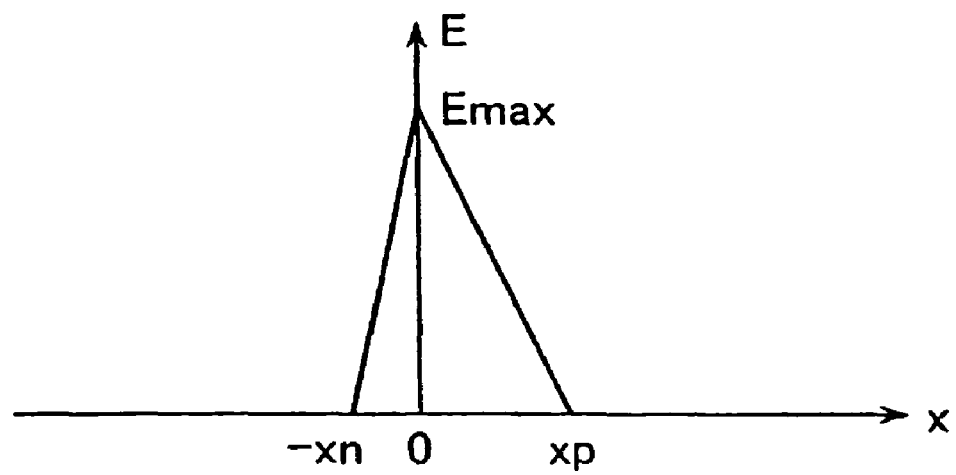
FIG. 42B is a diagram showing an electric field distribution of the pn junction structure shown in FIG. 42B.

More specifically, the result of examining whether some effect can be obtained from the cell structure in FIG. 40, what concentration setting or position setting is necessary, and so on will be explained below. First, upon preliminary examination, as shown in FIG. 42A and FIG. 42B, extension of the depletion layer and intensity distribution of an internal electric field E are found when a reverse bias with a voltage V is applied to the pn junction of the n-type diffusion layer (donor concentration ND) and the p-type diffusion layer (acceptor concentration NA). It is supposed that the pn junction is an abrupt junction. As shown in FIG. 42A and FIG. 42B, the X-axis is defined as a direction in which the pn junction is traversed.

In this case, assuming that the potentials in the n-type diffusion layer and the p-type diffusion layer are φD and φA respectively, that the forward end position in the n-type diffusion layer of the depletion layer is −xn, and that the forward end position in the p-type diffusion layer thereof is xp, Poisson's equations, and electric fields ED and EA in the n-type diffusion layer and the p-type diffusion layer are derived from Formula 24. ∈ is the dielectric constant of silicon.

$$d^2 \phi D / dx^2 = -(q/2\varepsilon)ND \quad (-xn < x < 0)$$
$$d^2 \phi A / dx^2 = (q/2\varepsilon)NA \quad (0 < x < xp)$$
$$ED = -d\phi D / dx \quad (-xn < x < 0)$$
$$EA = -d\phi A / dx \quad (0 < x < xp)$$
(Formula 24)

Boundary conditions are shown by the following Formula 25 with the built-in potential as φbi.

$$ED(-xn)=0$$
$$\phi D(-xn)=\phi bi+V$$
$$ED(0)=EA(0)$$
$$\phi D(0)=\phi A(0)$$
$$EA(xp)=0$$
$$\phi A(xp)=0$$
(Formula 25)

When Formula 24 is solved by substituting these boundary conditions therefor, the following Formula 26 can be obtained.

$$ED = (q/\varepsilon)ND \cdot x + A \quad (-xn < x < 0)$$
$$\phi D = -(q/2\varepsilon)ND \cdot x^2 - A \cdot x + B \quad (-xn < x < 0)$$
$$EA = -(q/\varepsilon)NA \cdot x + C \quad (0 < x < xp)$$
$$\phi A = (q/2\varepsilon)NA \cdot x^2 - C \cdot x + D \quad (0 < x < xp)$$
(Formula 26)

In Formula 26, A to D are constants fixed by the boundary conditions in Formula 25. When solutions of Formula 26 are substituted for Formula 25 which shows boundary conditions, the following Formula 27 can be obtained.

$$-(q/\varepsilon)ND \cdot xn + A = 0$$
$$-(q/2\varepsilon)ND \cdot xn^2 + A \cdot xn + B = \phi bi + V$$
$$A=C$$
$$B=D$$
$$-(q/\varepsilon)NA \cdot xp + C = 0$$
$$(q/2\varepsilon)NA \cdot xp^2 - C \cdot xp + D = 0$$
(Formula 27)

Formula 27 is equations for fixing six unknowns, xn, xp, A, B, C, and D. The following Formula 28 is obtained by solving these equations.

$$xn = \{2\varepsilon NA(\phi bi+V)/qND(NA+ND)\}^{1/2}$$
$$xp = \{2\varepsilon ND(\phi bi+V)/qNA(NA+ND)\}^{1/2}$$
(Formula 28)

A maximum field intensity Emax is an electric field at the point of x=0, and shown by the following Formula 29.

$$Emax = A$$
$$= (q/\varepsilon)ND \cdot xn$$
$$= \{2qNA \cdot ND(\phi bi + V)/\varepsilon(NA + ND)\}^{1/2}$$
(Formula 29)

An width of the entire depletion layer W=xn+Xp is derived from the following Formula 30.

$$W = \{2\varepsilon(NA+ND)(\phi bi+V)/qNA \cdot ND\}^{1/2}$$
(Formula 30)

The field intensity distribution is as shown in FIG. 42B.

Figure 43A:
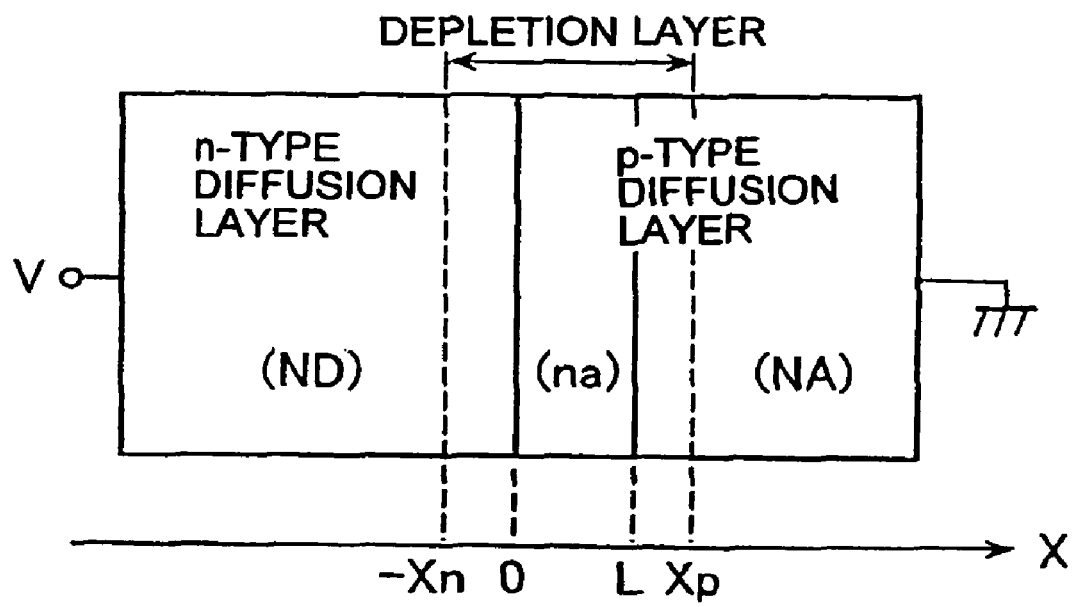
FIG. 43A is a diagram showing the pn junction structure on the drain side to examine the effectiveness of the cell structure in FIG. 40.
Figure 43B:
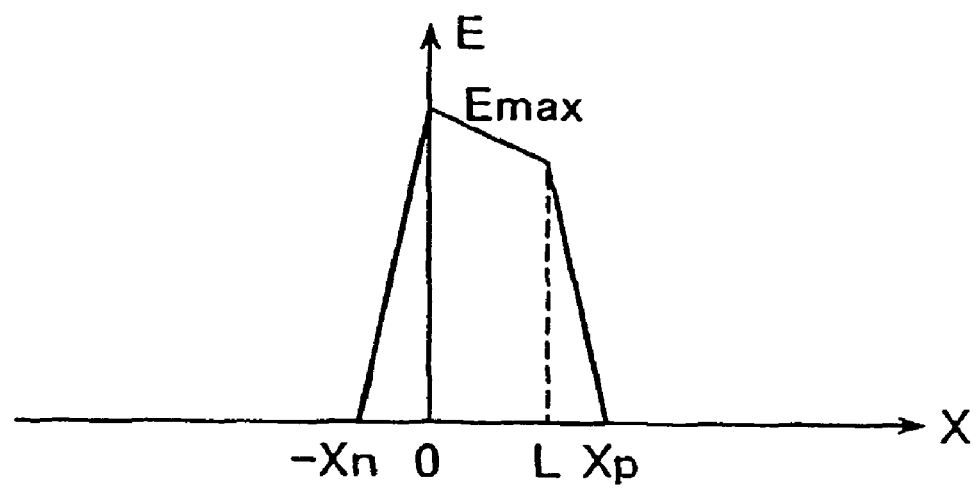
FIG. 43B is diagram showing an electric field distribution of the pn junction structure on the drain side to examine the effectiveness of the cell structure in FIG. 40.

Next, the case where the p-type diffusion layer is divided into two portions with a high acceptor concentration NA and a low acceptor concentration na as shown in FIG. 43A and FIG. 43B will be examined based on the above preliminary examination results. This corresponds to the structure of the drain junction side of the cell structure in the embodiment in FIG. 40. Also in this case, the junction is an abrupt junction. For comparison with the preliminary examination results, a capital letter X in place of a small letter x is used for a distance axis. It is supposed that a forward end position Xp of the depletion layer which extends to the p-type diffusion layer goes beyond a region with the low acceptor concentration na, and Xp>L is premised.

On this occasion, by contrast with Formula 24, Poisson's equations and electric field expressions are provided by the following Formula 31 by dividing the p-type diffusion layer into the regions with the high acceptor concentration NA and the low acceptor concentration na. The potential and electric field of the region with the low acceptor concentration na are represented by φa and Ea respectively as against the potential φA and the electric field EA of the region with the high acceptor concentration NA.

$$d^2\phi D/dX^2 = -(q/2\varepsilon)ND \quad (-Xn < X < 0)$$
$$d^2\phi a/dX^2 = (q/2\varepsilon)na \quad (0 < X < L)$$
$$d^2\phi A/dX^2 = (q/2\varepsilon)NA \quad (L < X < Xp)$$
$$ED = -d\phi D/dX \quad (-Xn < X < 0)$$
$$Ea = -d\phi a/dX \quad (0 < X < L)$$
$$EA = -d\phi A/dX \quad (L < X < Xp)$$
(Formula 31)

Boundary conditions are shown by the following Formula 32.

$$ED(-Xn)=0$$
$$\phi D(-Xn)=\phi bi+V$$
$$ED(0)=Ea(0)$$
$$\phi D(0)=\phi a(0)$$
$$Ea(L)=EA(L)$$
$$\phi a(L)=\phi A(L)$$
$$EA(Xp)=0$$
$$\phi A(Xp)=0$$
(Formula 32)

Formula 31 is solved to obtain the following Formula 33.

$$ED = (q/\varepsilon)ND \cdot X + A \quad (-Xn < X < 0)$$
$$\phi D = -(q/2\varepsilon)ND \cdot X^2 - A \cdot X + B \quad (-Xn < X < 0)$$
$$Ea = -(q/\varepsilon)na \cdot X + C \quad (0 < X < L)$$
$$\phi a = (q/2\varepsilon)na \cdot X^2 - C \cdot X + D \quad (0 < X < L)$$
$$EA = -(q/\varepsilon)NA \cdot X + E \quad (L < X < Xp)$$
$$\phi A = (q/2\varepsilon)NA \cdot X^2 - E \cdot X + F \quad (L < X < Xp)$$
(Formula 33)

In Formula 33, A to F are constants fixed by the boundary conditions in Formula 32. When solutions of Formula 33 are substituted for Formula 32 which shows boundary conditions, the following Formula 34 can be obtained.

$$-(q/\varepsilon)ND \cdot Xn+A=0$$
$$-(q/2\varepsilon)ND \cdot Xn^2+A \cdot Xn+B=\phi bi+V$$
$$A=C$$
$$B=D$$
$$-(q/\varepsilon)na \cdot L+C=-(q/\varepsilon)NA \cdot L+E$$
$$(q/2\varepsilon)na \cdot L^2-C \cdot L+D=(q/2\varepsilon)NA \cdot L^2-E \cdot L+F$$
$$-(q/\varepsilon)NA \cdot Xp+E=0$$
$$(q/2\varepsilon)NA \cdot Xp^2-E \cdot Xp+F=0$$
(Formula 34)

Formula 34 includes equations for fixing eight unknowns, Xn, Xp, A, B, C, D, E, and F. The following Formula 35 is obtained by solving these equations.

$$Xn = -L \cdot (NA - na)/(NA + ND) + L \cdot \{(NA/ND)(NA-na)(ND+na)/(NA+ND)^2 + (xn/L)^2\}^{1/2}$$
$$XP = (1/NA) \cdot [ND \cdot Xn + (NA - na) \cdot L]$$
(Formula 35)

xn in Formula 35 shows the extension of the depletion layer to the n-type diffusion layer which is already solved concerning the pn junction in FIG. 42, and it is indicated by Formula 28. Moreover, the maximum electric field Emax is an electric field at the point of X=0, and derived from the following Formula 36.

$$Emax=A=(q/\varepsilon)ND \cdot Xn$$
(Formula 36)

The field intensity distribution on this occasion is as shown in FIG. 43B. In Formula 35, it is confirmed that if L is brought as close as possible to 0 or the acceptor concentration na is brought as close as possible to NA, Xn=xn is obtained.

Figure 44:
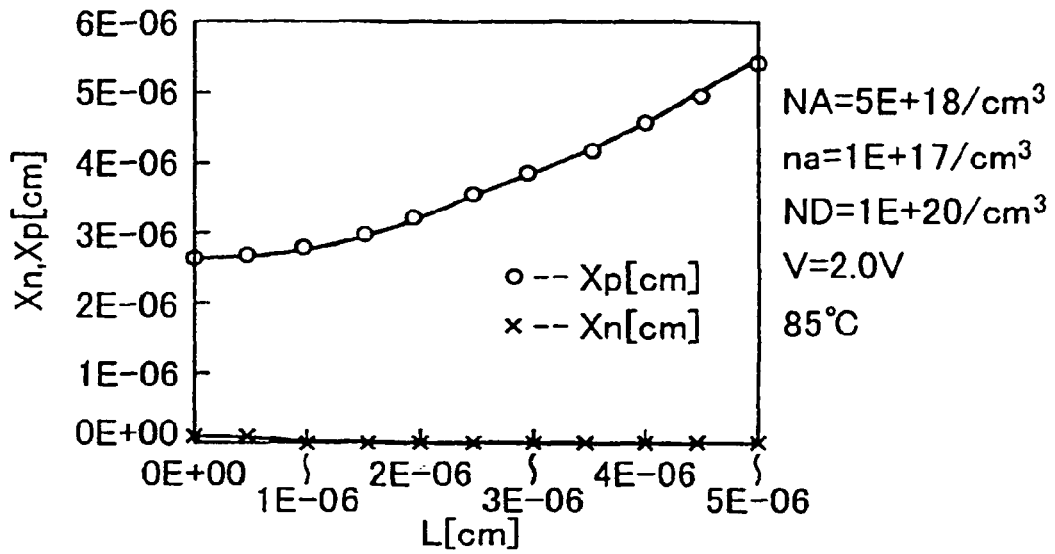
FIG. 44 is a diagram showing the relation between the width of a low concentration p-type layer and the extension of a depletion layer in FIG. 43.

Based on the above examination results, optimization conditions of the cell structure in FIG. 40 will be concretely examined now. FIG. 44 shows the relation between a width L of the low acceptor concentration region and extensions Xn and Xp of the depletion layer, assuming that the high acceptor concentration of the p-type diffusion layer is NA=5×10$^{18}$/cm$^3$, the low acceptor concentration thereof is na=1×10$^{17}$/cm$^3$, the donor concentration of the n-type diffusion layer is ND=1×10$^{20}$/cm$^3$, the applied voltage is V=2.0 V, and the ambient temperature is 85° C.

Assuming that in the cell in FIG. 40, the channel length is 0.1 μm and the extensions of depletion layer from the source and the drain are symmetric, Xp<5×10$^{-6}$ cm is necessary so as not to cause punch-through. To fulfill this condition, from FIG. 44, L<4.0×10$^{-6}$ cm=0.04 μm is needed. L=0.02 μm is appropriate in consideration of a certain measure of allowance, in which case the extension Xp of the depletion layer to the p-type diffusion layer encroaches upon the region with the high acceptor concentration NA by 0.01 μm.

Figure 45:
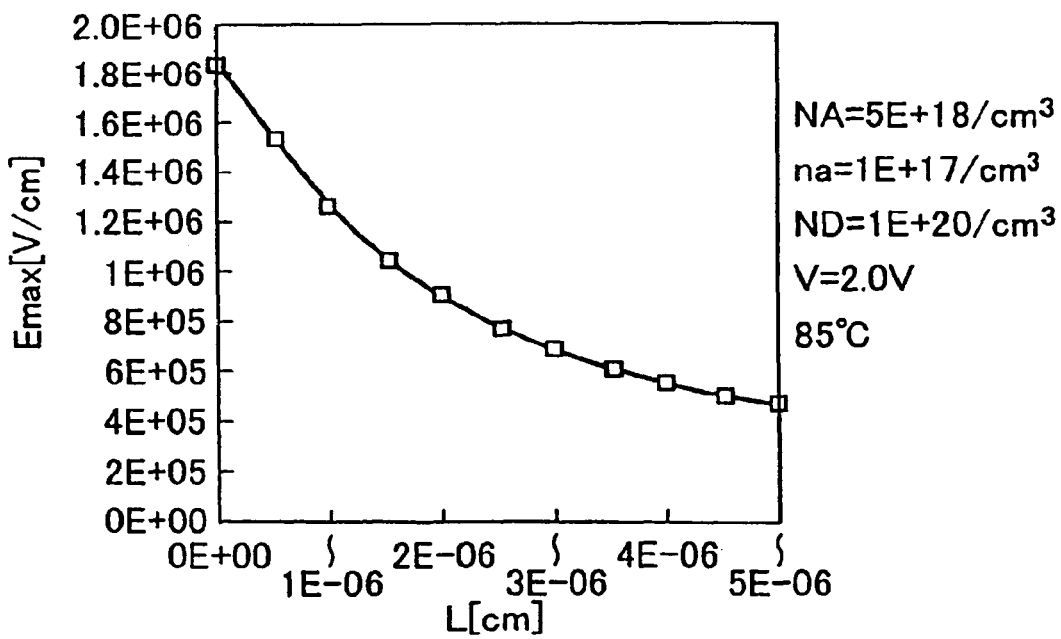
FIG. 45 is a diagram showing the relation between the width of the low concentration p-type layer and the maximum electric field intensity.

The dependency of the maximum electric field intensity Emax on the distance L under the same conditions in FIG. 44 is shown in FIG. 45. In the case of the appropriate distance L=0.02 μm obtained above, the maximum field intensity is Emax=9.0×10$^5$ V/cm. This value is smaller compared with the case where the entire bulk region is composed of only the region with the high acceptor concentration NA=5×10$^{18}$/cm$^3$, but the maximum electric field is reduced only to about half. Furthermore, it is desirable to reduce this electric field to about one third.

Then, in FIG. 43, the effect of lowering the donor concentration ND of the n-type diffusion layer is examined. This is because the depletion layer further comes to extend to the n-type diffusion layer side, and hence it is expected to lower the maximum field intensity.

Figure 46:
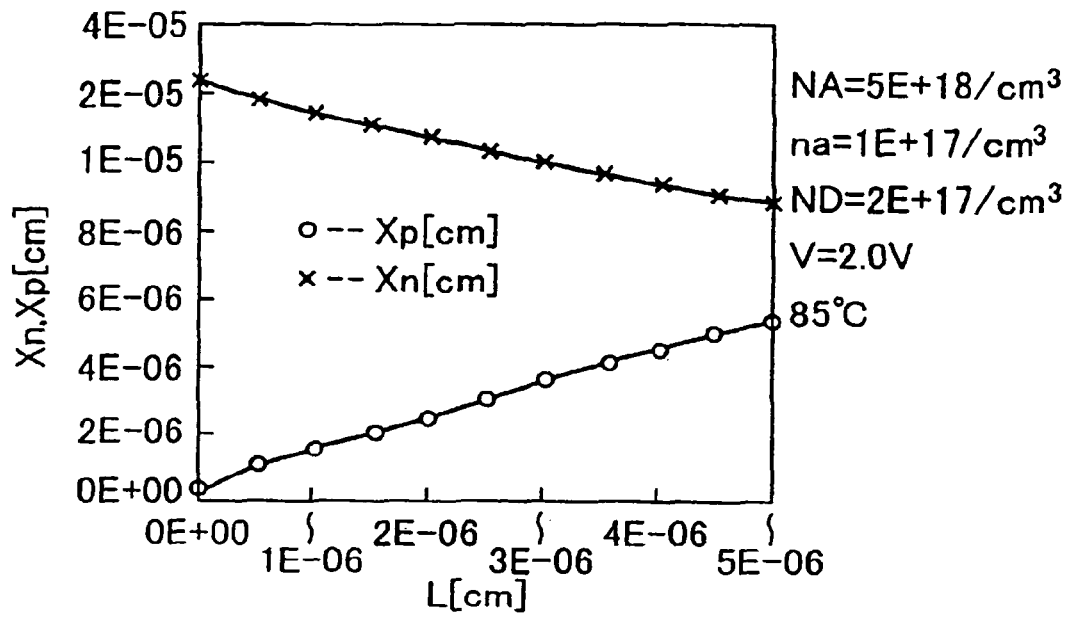
FIG. 46 is a diagram showing the relation between the width of the low concentration p-type layer and the extension of the depletion layer by contrast with FIG. 44 when the concentration of an n-type diffusion region is further lowered.
Figure 47:
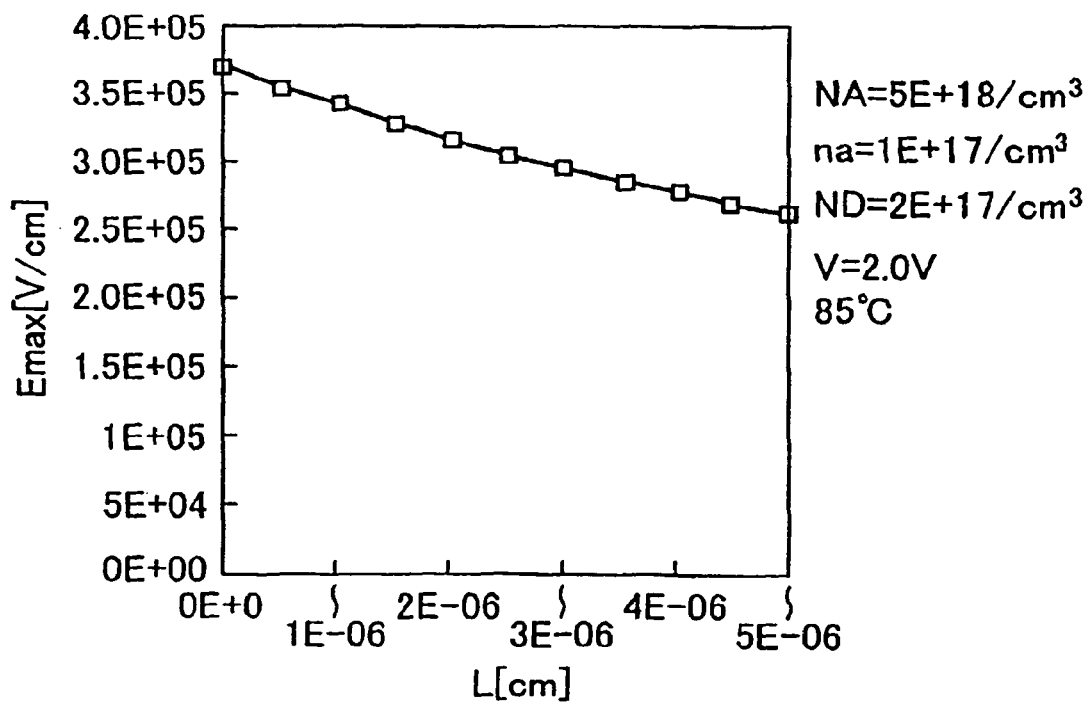
FIG. 47 is a diagram showing the relation between the width of the low concentration p-type layer and the maximum electric field intensity.

FIG. 46 shows the result of examining the relation between the width L of the low acceptor concentration region and the extensions of the depletion layer Xn and Xp when the donor concentration ND of the n-type diffusion layer is lowered to ND=1×10$^{17}$/cm$^3$ as against FIG. 43. Moreover, FIG. 47 shows the dependency of the maximum field intensity Emax on the length L on this occasion by contrast with FIG. 35.

From this result, if the concentration of the source/drain diffusion layers is lowered, the maximum field intensity Emax=3.0×10$^5$ V/cm is obtained in the case of L=0.25 μm and Xp=0.03 μm. Dimensions and the situation of the extension of the depletion layer in the cell structure in FIG. 40 under the above optimization conditions are shown in FIG. 48.

When the concentration of the source/drain n-type diffusion layers is lowered, contact resistance to these comes into question. To solve this, it is preferable to perform diffusion again for contact holes in the same manner as for a bit line contact of the ordinary DRAM. Alternatively, it is also effective to adopt a salicide structure in which a metal silicide film is formed on the surface of the source/drain diffusion regions.

Figure 48:
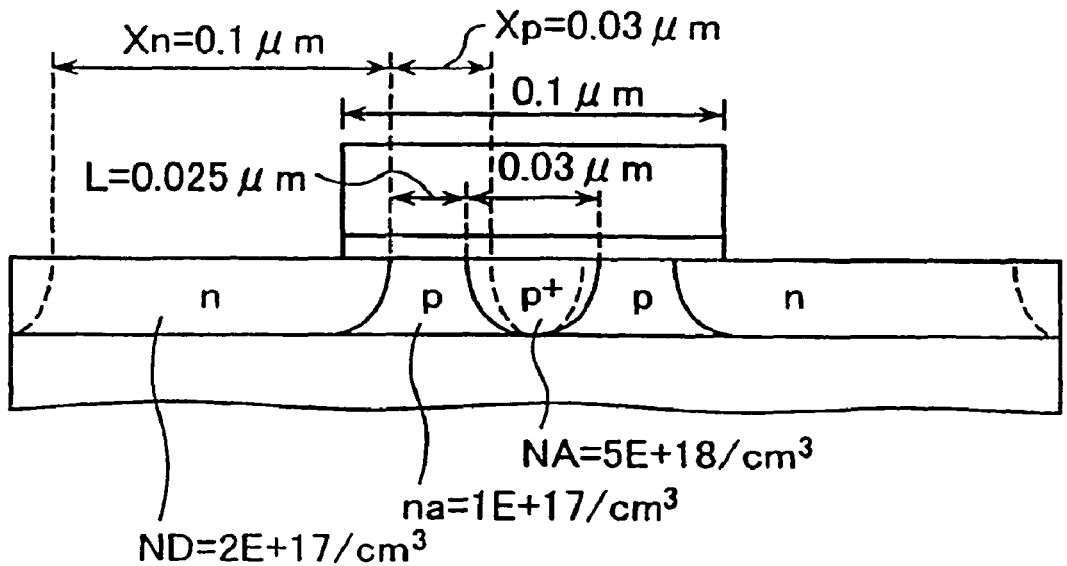
FIG. 48 is a diagram showing the situation of the extension of the depletion layer under optimization conditions of the cell structure in FIG. 40.

When the concentration of the source/drain n-type diffusion regions is as low as ND=1×10$^{17}$/cm$^3$, the depletion layer with a large width of Xn=0.1 μm extends into the source/drain layers as shown in FIG. 48. In order to prevent the source/drain from being depleted largely as described above, it is desirable to adopt a so-called LDD structure.

Figure 49:
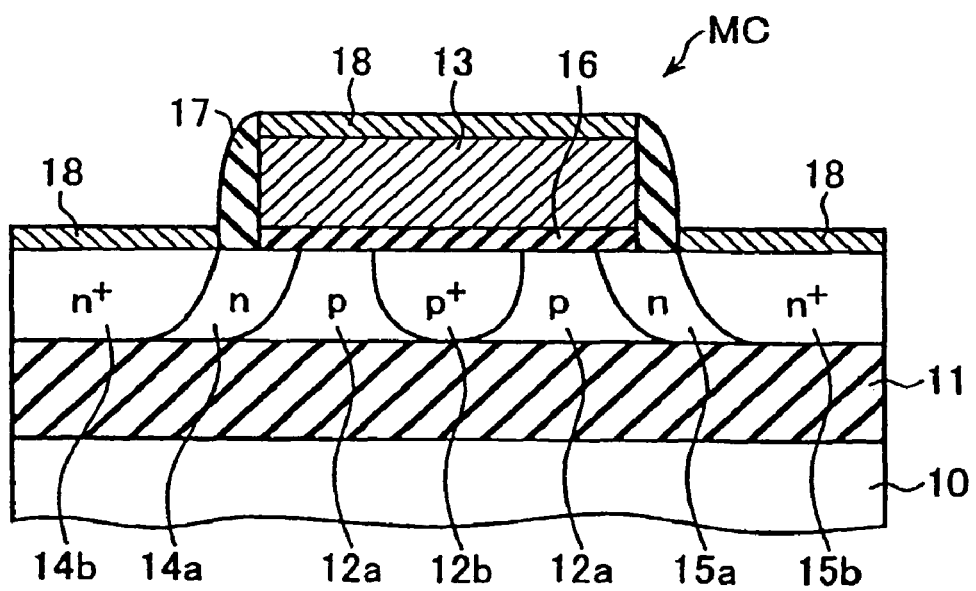
FIG. 49 is a sectional view showing a cell structure of an embodiment in which the cell structure in FIG. 40 is improved.

Relative to the cell structure in FIG. 40, an embodiment of a cell structure in which the LDD structure is adopted is shown in FIG. 49. The drain diffusion region 14 is composed of an n-type diffusion region 14a with a low donor concentration which is in contact with the channel region and an n$^+$-type diffusion region 14b with a high donor concentration. The source diffusion region 15 is also composed of an n-type diffusion region 15a with a low donor concentration which is in contact with the channel region and an n$^+$-type diffusion region 15b with a high donor concentration. A metal silicide film 18 is formed on the source/drain diffusion regions and the gate electrode by a salicide process.

However, this LDD structure can be adopted, for example, only for the drain side connected to the bit line out of the drain and the source.

Figure 50A:
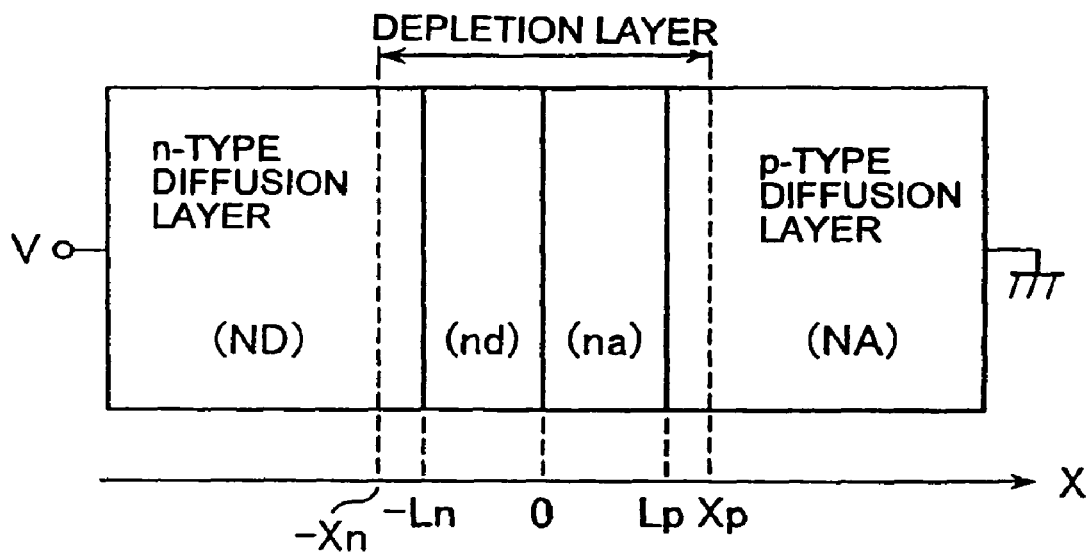
FIG. 50A is a diagram showing a pn junction structure on the drain side to examine the effectiveness of the cell structure in FIG. 49.
Figure 50B:
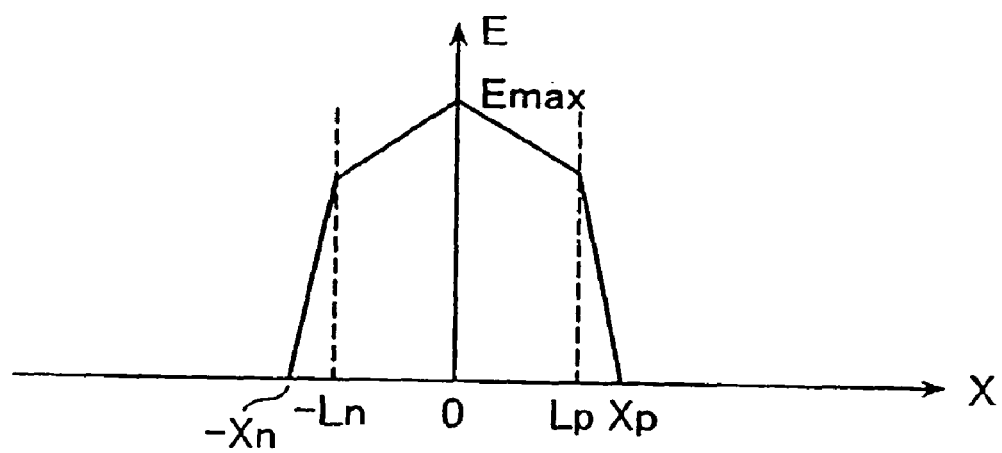
FIG. 50B is diagrams showing an electric field distribution of the pn junction structure on the drain side to examine the effectiveness of the cell structure in FIG. 49.

Next, the extension of the depletion layer and the field intensity distribution of the cell structure adopting such an LDD structure will be examined concretely. FIG. 50A and FIG. 50B show a schematic pn junction structure and field distribution when attention is paid, for example, to the drain side junction of this cell structure by contrast with FIG. 43A and FIG. 43B. The n-type diffusion layer is composed of a region with a low donor concentration nd and a region with a high donor concentration ND, and the p-type diffusion layer is composed of a region with a low acceptor concentration na and a region with a high acceptor concentration NA. The width of the region with the low donor concentration nd is taken here as Ln and the width of the region with the low acceptor concentration na is taken as Lp. The regions with the high donor concentration ND and the high acceptor concentration NA respectively have concentrations fixed by resistance of bit line contact and source line contact and restrictions required in terms of a transistor characteristic.

Such a reverse bias condition that the extension of the depletion layer is Xp>Lp and Xn>Ln is premised. On this occasion, Poisson's equations are shown by the following Formula 37 relative to Formula 32. The potential and electric field of the region with the low acceptor concentration na are represented by φa and Ea respectively in relation to the potential φA and the electric potential EA of the region with the high acceptor concentration NA, and the potential and electric field of the region with the low donor concentration na are represented by φd and Ed respectively in relation to the potential φD and the electric potential ED of the region with the high donor concentration ND.

$$\begin{aligned}
d^2\phi D/dX^2 &= -(q/2\varepsilon)ND & (-Xn < X < -Ln)\\
d^2\phi d/dX^2 &= -(q/2\varepsilon)nd & (-Ln < X < 0)\\
d^2\phi a/dX^2 &= (q/2\varepsilon)na & (0 < X < Lp)\\
d^2\phi A/dX^2 &= (q/2\varepsilon)NA & (Lp < X < Xp)\\
ED &= -d\phi D/dX & (-Xn < X < -Ln)\\
Ed &= -d\phi d/dX & (-Ln < X < 0)\\
Ea &= -d\phi a/dX & (0 < X < Lp)\\
EA &= -\phi A/dX & (Lp < X < Xp)
\end{aligned}$$
(Formula 37)

Boundary conditions are shown by the following Formula 38.

$$\begin{aligned}
&ED(-Xn)=0\\
&\phi D(-Xn)=\phi bi+V\\
&ED(-Ln)=Ed(-Ln)\\
&\phi D(-Ln)=\phi d(-Ln)\\
&Ed(0)=Ea(0)\\
&\phi d(0)=\phi a(0)\\
&Ea(Lp)=EA(Lp)\\
&\phi a(Lp)=\phi A(Lp)\\
&EA(Xp)=0\\
&\phi A(Xp)=0
\end{aligned}$$
(Formula 38)

Formula 37 is solved to obtain the following Formula 39.

$$\begin{aligned}
ED &= (q/\varepsilon)ND \cdot X + A & (-Xn < X < -Ln)\\
\phi D &= -(q/2\varepsilon)ND \cdot X^2 - A \cdot X + B & (-Xn < X < -Ln)\\
Ed &= (q/\varepsilon)nd \cdot X + C & (-Ln < X < 0)\\
\phi d &= (q/2\varepsilon)nd \cdot X^2 - C \cdot X + D & (-Ln < X < 0)\\
Ea &= -(q/\varepsilon)na \cdot X + E & (0 < X < Lp)\\
\phi a &= (q/2\varepsilon)na \cdot X^2 - E \cdot X + F & (0 < X < Lp)\\
EA &= -(q/\varepsilon)NA \cdot X + G & (Lp < X < Xp)\\
\phi A &= (q/2\varepsilon)NA \cdot X^2 - G \cdot X + H & (Lp < X < Xp)
\end{aligned}$$
(Formula 39)

In Formula 39, A to H are constants fixed by the boundary conditions in Formula 38. When solutions of Formula 39 are substituted for Formula 38, the following Formula 40 can be obtained.

$$\begin{aligned}
&-(q/\varepsilon)ND \cdot Xn + A = 0\\
&-(q/2\varepsilon)ND \cdot Xn^2 + A \cdot Xn + B = \phi bi + V
\end{aligned}$$
(Formula 40)

-continued $$-(q/\varepsilon)nd \cdot Ln + C = -(q/\varepsilon)ND \cdot Ln + A$$

$$-(q/2\varepsilon)nd \cdot Ln^2 + C \cdot Ln + D = -(q/\varepsilon)ND \cdot Ln^2 + A \cdot Ln + B$$

$$C = E$$

$$D = F$$

$$-(q/\varepsilon)na \cdot Lp + E = -(q/\varepsilon)NA \cdot Lp + G$$

$$(q/2\varepsilon)na \cdot Lp^2 - E \cdot Lp + F = (q/2\varepsilon)NA \cdot Lp^2 - G \cdot Lp + H$$

$$-(q/\varepsilon)NA \cdot Xp + G = 0$$

$$(q/2\varepsilon)NA \cdot Xp^2 - G \cdot Xp + H = 0$$

When ten equations in Formula 40 are solved, ten variables Xn, Xp, and A to H are found. The widths Ln and Lp of the depletion layer are derived from the following Formula 41.

$$Xn=[(ND-nd)Ln-(NA-na)Lp]/(NA+ND)+[1/(NA+ND)](NA/ND)^{1/2} \cdot [(NA-na)(ND+na)Lp^2+(ND-nd)(NA+nd)Ln^2+2(NA-na)(ND-nd)LpLn+(NA+ND)(2\varepsilon/q)(\phi bi+V)]^{1/2}$$

$$Xp=[(NA-na)Lp-(ND-nd)Ln]/(NA+ND)+[1/(NA+ND)](ND/NA)^{1/2} \cdot [(ND-nd)(NA+nd)Ln^2+(NA-na)(ND+na)Lp^2+2(ND-nd)(NA-na)LpLn+(NA+ND)(2\varepsilon/q)(\phi bi+V)^{1/2}$$ (Formula 41)

The field intensity distribution is as shown in FIG. 50B, and the maximum electric field Emax is an electric field at the point of X=0 and given by the following Formula 42 by means of the third equation in formula 39.

$$Emax=C=(q/\varepsilon)\{NA \cdot Xp-(NA-na)/Lp\}$$ (Formula 42)

The result of finding the values of Xp, Xn, and Emax computed above by substituting concrete numerical values therefor will be explained below.

Figure 51:
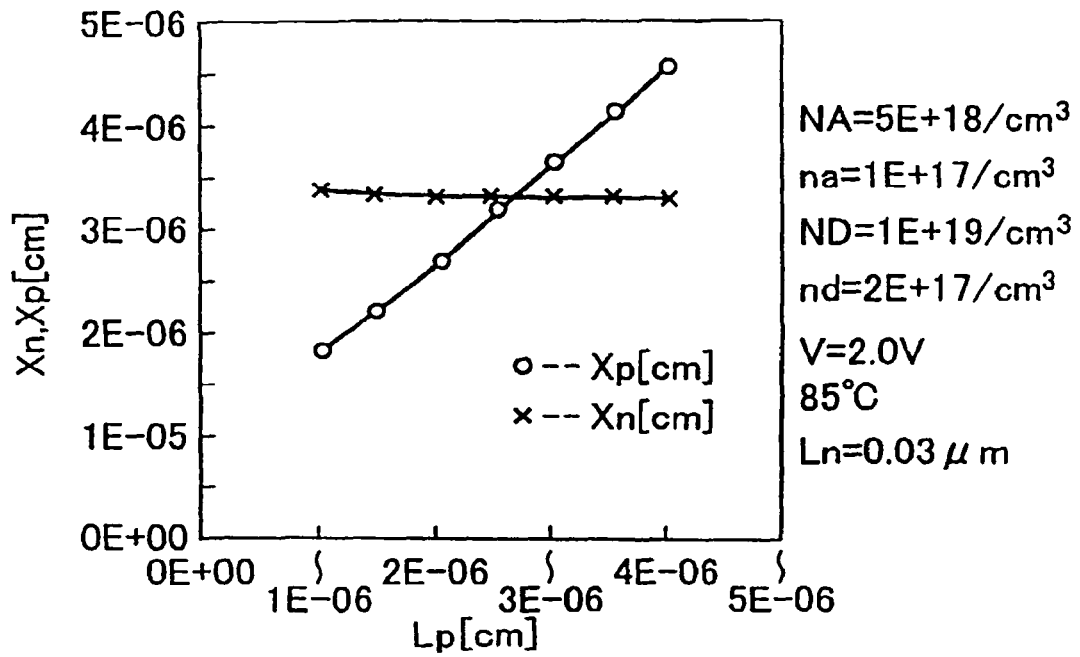
FIG. 51 is a diagram showing the relation between the width of a low concentration p-type layer and the extension of a depletion layer in FIG. 50.

FIG. 51 shows the result of examining the relation between the width Lp of the low acceptor concentration region and the extensions Xn and Xp of the depletion layer when the width of the low donor concentration region is fixed at Ln=0.03 μm, assuming that the high acceptor concentration of the p-type diffusion layer is NA=5×10$^{18}$/cm$^3$, the low acceptor concentration thereof is na=1×10$^{17}$/cm$^3$, the high donor concentration of the n-type diffusion layer is ND=1×10$^{19}$/cm$^3$, the low donor concentration thereof is nd=2×10$^{17}$/cm$^3$, the applied voltage is V=2.0 V, and the ambient temperature is 85° C.

Figure 52:
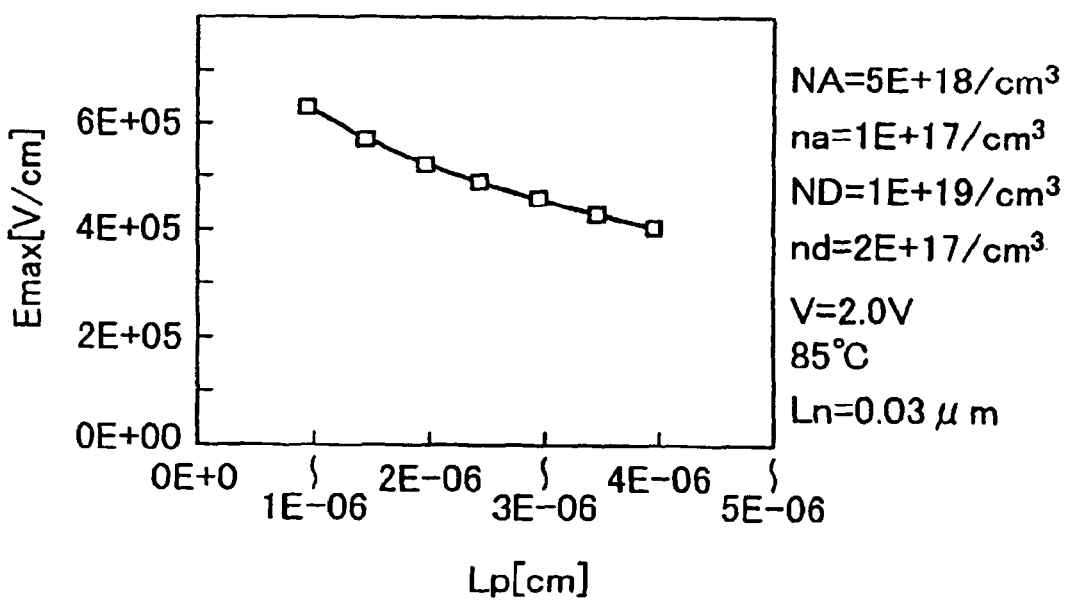
FIG. 52 is a diagram showing the relation between the width of the low concentration p-type layer and the maximum electric field intensity.

FIG. 52 shows the result of finding the maximum electric field intensity Emax under the same conditions.

From these results, if Lp=0.025 μm is set, then Xp=0.03 μm, and the maximum field intensity is Emax=5.0×10$^5$ V/cm$^3$.

Figure 53:
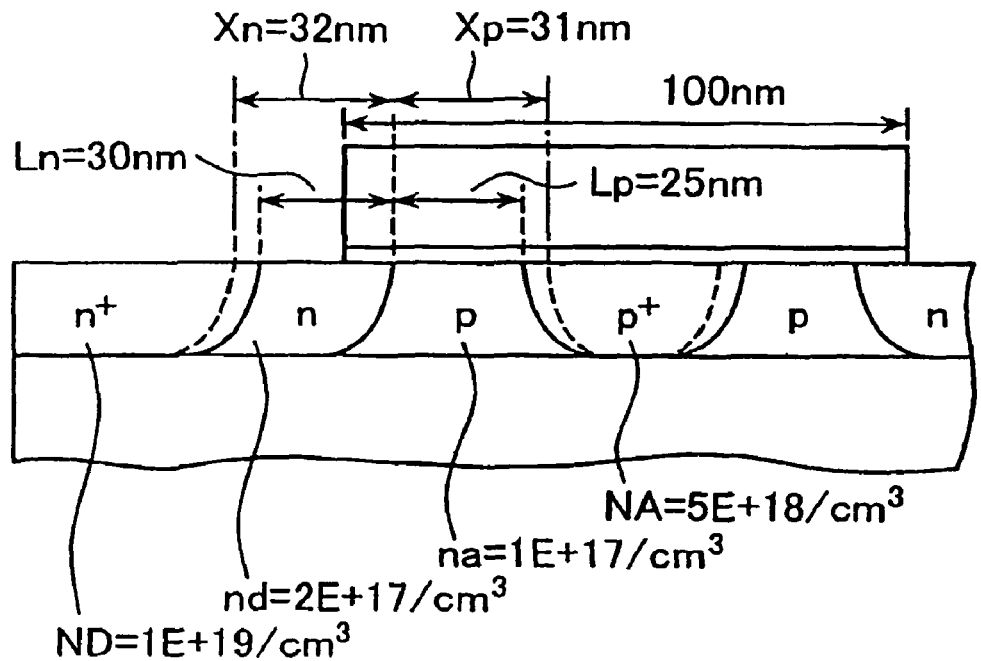
FIG. 53 is a diagram showing the situation of the extension of the depletion layer under optimization conditions of the cell structure in FIG. 49.

FIG. 53 shows the extension of the depletion layer and the dimensions of respective portions in the cell structure in FIG. 49 at the above maximum field intensity on the drain region side.

The above maximum field intensity is one third or less of that when the source/drain diffusion regions have no low concentration layer as analyzed in FIG. 43. Accordingly, as shown in FIG. 49, by forming the bulk region by the high concentration layer and the low concentration layer and making the drain and the source have the LDD structure, it becomes possible to lower the maximum field intensity to reduce the leakage current and to bring substrate bias effects into full play. Namely, the aforesaid contrary conditions 1 and 2 can be fulfilled and an excellent DRAM characteristic can be obtained.

Next, a concrete manufacturing method for realizing the structure of the memory cell MC shown in FIG. 49 will be explained with reference to FIG. 54 to FIG. 57. The memory cell MC in FIG. 49 is actually disposed in the same cell array as that explained in FIG. 3 and FIG. 4. Namely, the p-type silicon layer 12 is pattern-formed as an element region in a stripe form with its side face in the direction perpendicular to the paper surface touching an element isolation insulating film, but the explanation of the process of element isolation is omitted.

Figure 54:
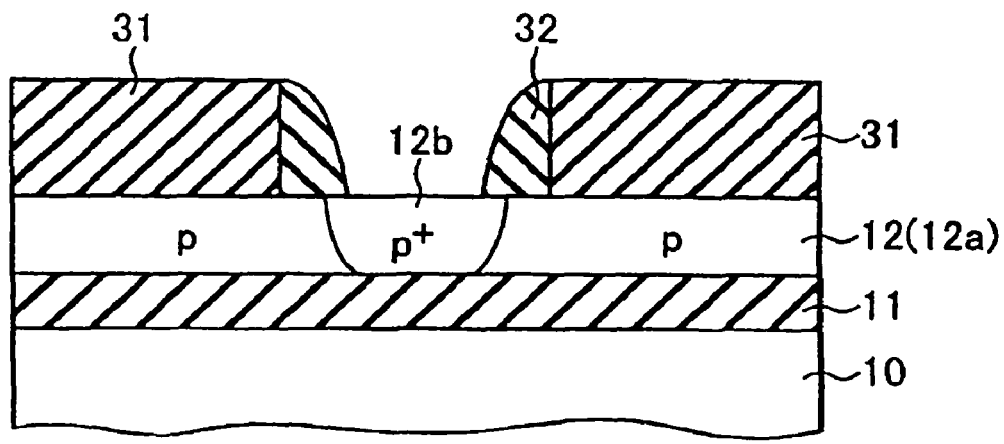
FIG. 54 is a diagram for explaining the process of manufacturing the cell in FIG. 49.

As shown in FIG. 54, a mask 31 having an opening in the element region is first formed on the surface of the p-type silicon layer 12 (which is the low concentration p-type region 12a), and a side wall insulating film 32 is then formed on a side wall of the opening of the mask 31. Specifically, as for the mask 31, for example, a silicon oxide film is deposited and patterned by RIE. A silicon nitride film is deposited and left as the side wall insulating film 32 by etch back. In this state, boron ion implantation is performed to form the high concentration P$^+$-type region 12b in the p-type silicon layer 12.

Figure 55:
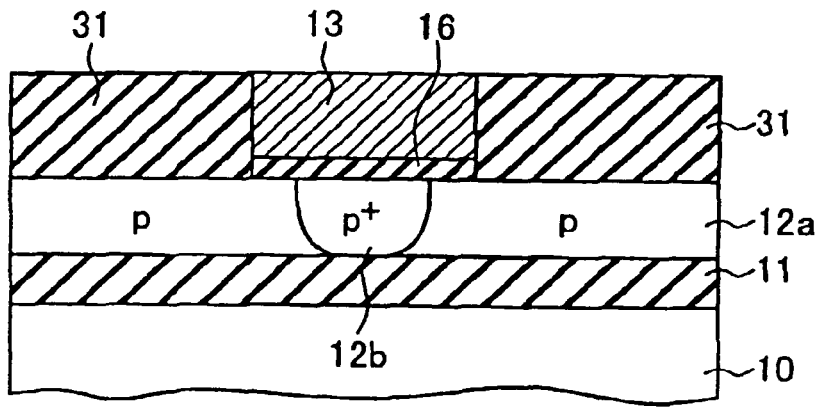
FIG. 55 is a diagram for explaining the process of manufacturing the cell in FIG. 49.

Then, as shown in FIG. 55, after the side wall insulating film 32 is selectively removed by etching, the gate insulator 16 is formed on the surface of the exposed p-type silicon layer 12. Subsequently, a polycrystalline silicon film is deposited, planarization processing is performed, and then the gate electrode 13 is buried therein.

Figure 56:
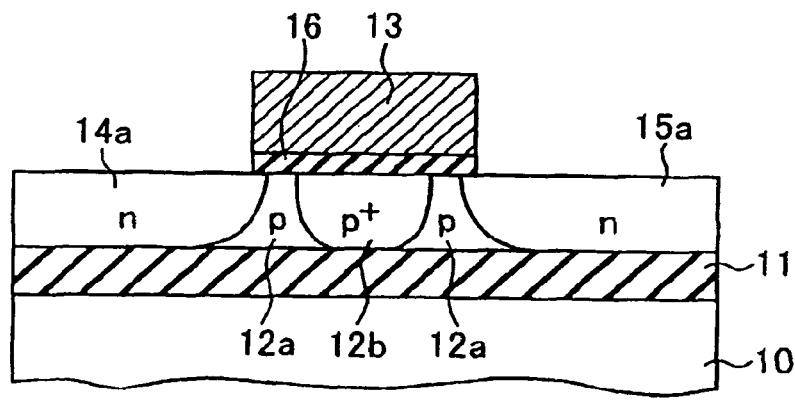
FIG. 56 is a diagram for explaining the process of manufacturing the cell in FIG. 49.
Figure 57:
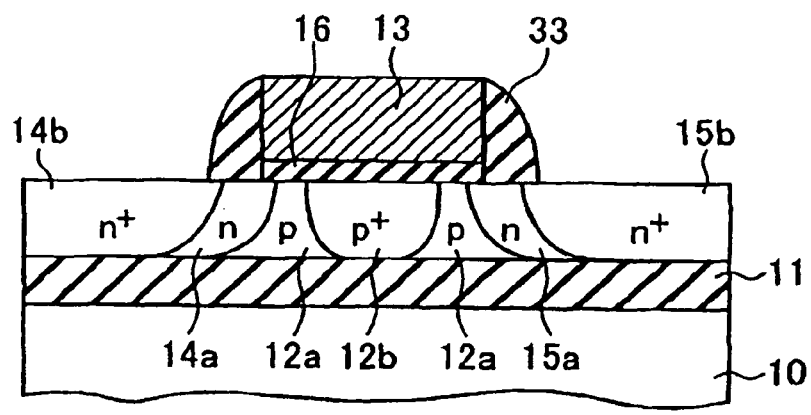
FIG. 57 is a diagram for explaining the process of manufacturing the cell in FIG. 49.

Thereafter, as shown in FIG. 56, the mask 31 is removed by etching. Arsenic ion implantation is performed with the gate electrode 13 as a mask to form the low concentration drain/source diffusion regions 14a and 15a. As shown in FIG. 57, a side wall insulating film 33 is formed on the side wall of the gate electrode 13. Subsequently, arsenic ion implantation is performed again to form the high concentration drain/source diffusion regions 14b and 15b. Thereafter, as shown in FIG. 49, the metal silicide film 18 is formed on the drain/source diffusion regions 14a and 15b and the gate electrode 13 by means of the silicide process. When the drain diffusion region 14 and the source diffusion region 15 do not have the LDD structure, the step shown in FIG. 57 is unnecessary. Namely, in the state of FIG. 56, the memory cell MC shown in FIG. 40 can be obtained.

By applying damascene to the formation of the gate electrode as described above, the p$^+$-type region 12b can be formed while being self-aligned in the center in the channel length direction of the bulk region of the transistor.

Figure 58A:
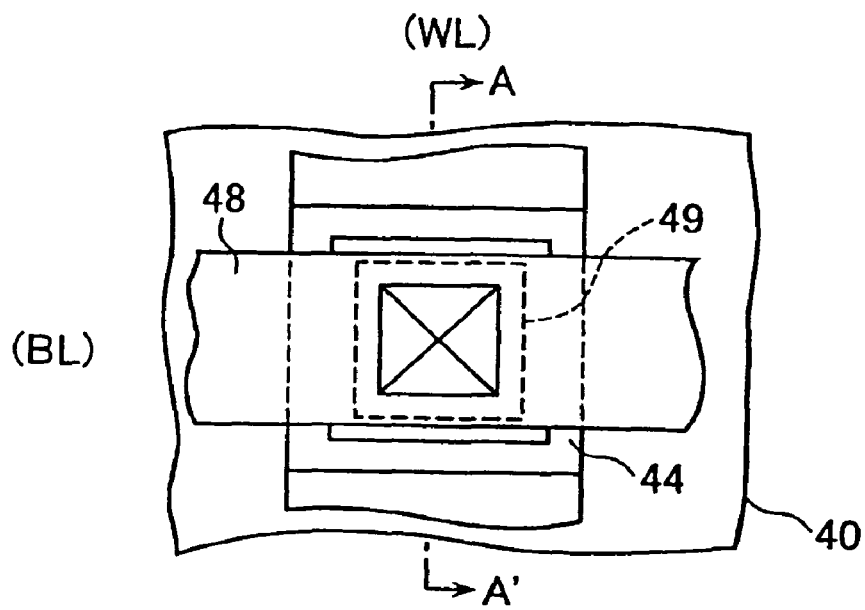
FIG. 58A is a plan view showing a cell structure according to a third embodiment.
Figure 58B:
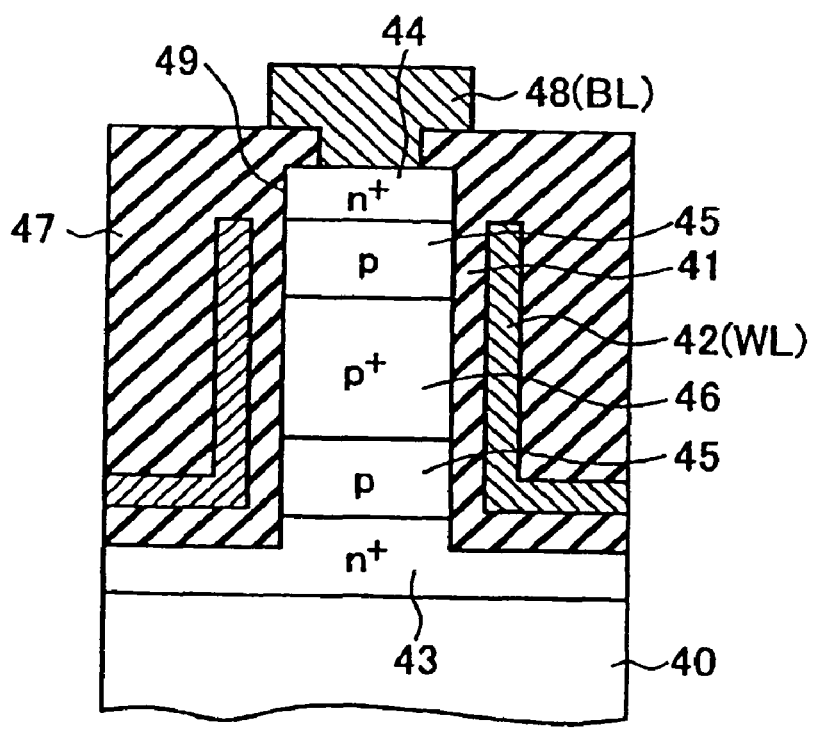
FIG. 58B is a sectional view taken along the line A-A' in FIG. 58A.

The structure in which the center of the bulk region of the cell transistor is formed by the high concentration layer is not limited to the case where the cell transistor has a planar structure. FIG. 58A and FIG. 58B show a plan view of one memory cell MC portion and a sectional view taken along the line A-A' regarding the one transistor/one cell structure according to a third embodiment, which is realized by using a pillar semiconductor layer (post type semiconductor portion).

A so-called SGT (Surrounding Gate Transistor) is made by forming a pillar silicon layer 49 on a silicon substrate 40 and utilizing a side peripheral face of this pillar silicon layer 49. The pillar silicon layer 49 has an n$^+$-type source diffusion region 43 formed at the bottom and a P$^+$-type layer 46 sandwiched between p-type layers 45 in a height direction. An n$^+$-type drain diffusion layer 44 is formed in the surface side of the pillar silicon layer 49.

A gate insulator 41 is formed on the side peripheral face of the pillar silicon layer 49, and a gate electrode 42 is formed to surround the gate insulator 41. The gate electrodes 42 are continuously formed in one direction to constitute a word line WL. The SGT thus formed is covered with an interlayer dielectric film 47, and a bit line (BL) 48 is formed thereon. The bit line 48 is connected to the n$^+$-type diffusion region 44.

Also in the memory cell with this SGT structure, a bulk region is floating, and by the same write method as explained in the aforesaid embodiment, dynamic data storage can be performed by the operation of holding excessive majority carriers in the bulk region or emitting them therefrom. Moreover, the optimization of the impurity concentrations and dimensions of the high concentration p$^+$-type layer 46 and the low concentration p-type layers 45 disposed in the center of the bulk region makes it possible to obtain a sufficient substrate bias effect capable of increasing the difference in threshold voltage between binary data, and to decrease a leakage current to obtain an excellent data holding characteristic.

Figure 59A:
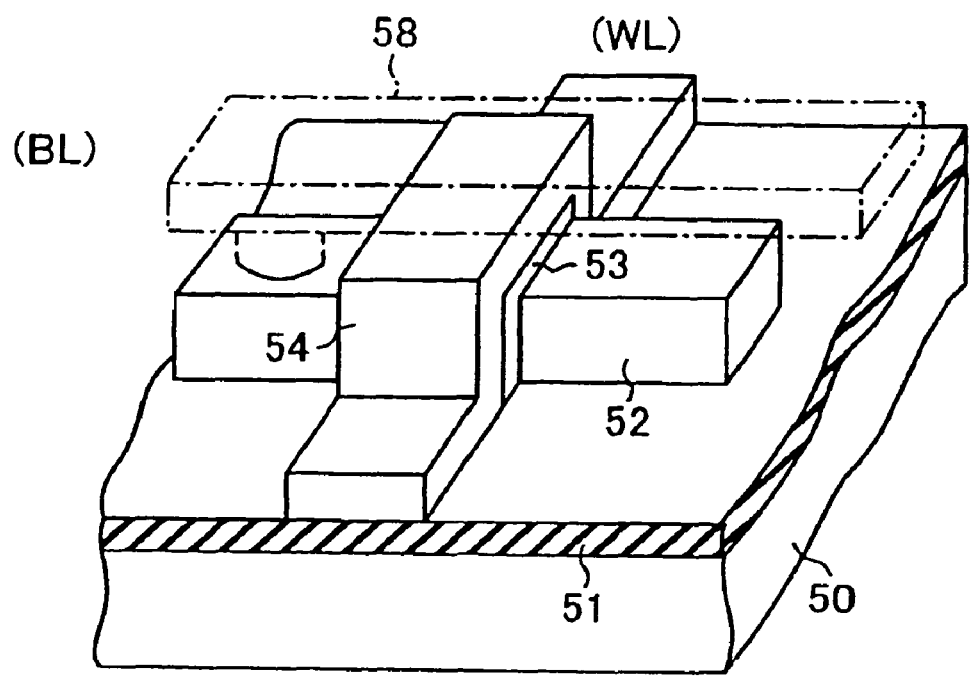
FIG. 59A is a perspective view showing a cell structure according to a fourth embodiment.
Figure 59B:
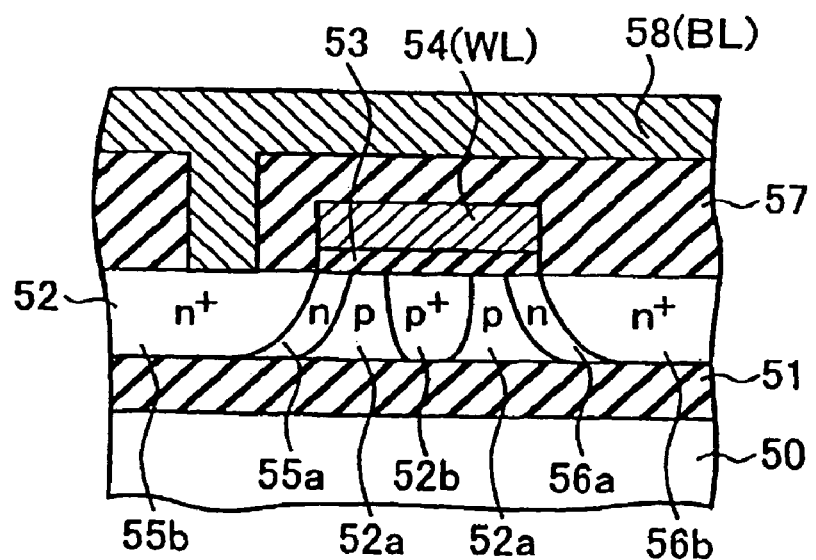
FIG. 59B is a sectional view taken along the direction of a bit line in FIG. 59A.

FIG. 59A and FIG. 59B show a one transistor/one cell DRAM cell structure according to a fourth embodiment. FIG. 59A is a perspective view showing a bit line (BL) 58 by a virtual line to make the structure thereunder clearly understandable, and FIG. 59B is a sectional view taken along the direction of the bit line 58.

In this embodiment, a p-type silicon layer 52 (a part of which becomes a low concentration region 52a) isolated by a silicon oxide film 51 is formed in the form of an island on a silicon substrate 50 with its upper face and both side faces exposed. A gate electrode 54 is formed on the upper face and both of the side faces of the silicon layer 52 via a gate insulator 53 to compose a cell transistor. The gate electrodes 54 are continuously patterned in one direction to constitute a word line WL.

A high concentration p$^+$-type region 52b is formed in the center in the channel direction of a transistor region of the silicon layer 52. Drain/source diffusion regions 55 and 56 have an LDD structure composed of low concentration n-type diffusion regions 55a and 56a and high concentration n$^+$-type diffusion regions 55b and 56b. The transistor region is covered with an interlayer dielectric film 57, and the bit line 58, which is in contact with the drain diffusion region 55, is formed on this interlayer dielectric film 57.

Also in a memory cell in this embodiment, a bulk region is floating, and by the same write method as explained in the aforesaid embodiment, dynamic data storage can be performed by the operation of holding excessive majority carriers in the bulk region or emitting them therefrom. Moreover, the optimization of the impurity concentrations and dimensions of the high concentration p$^+$-type regions 52b and the low concentration p-type regions 52a disposed in the center of the bulk region makes it possible to obtain a sufficient substrate bias effect capable of increasing the difference in threshold voltage between binary data, and to decrease a leakage current to obtain an excellent data holding characteristic.

Figure 60A:
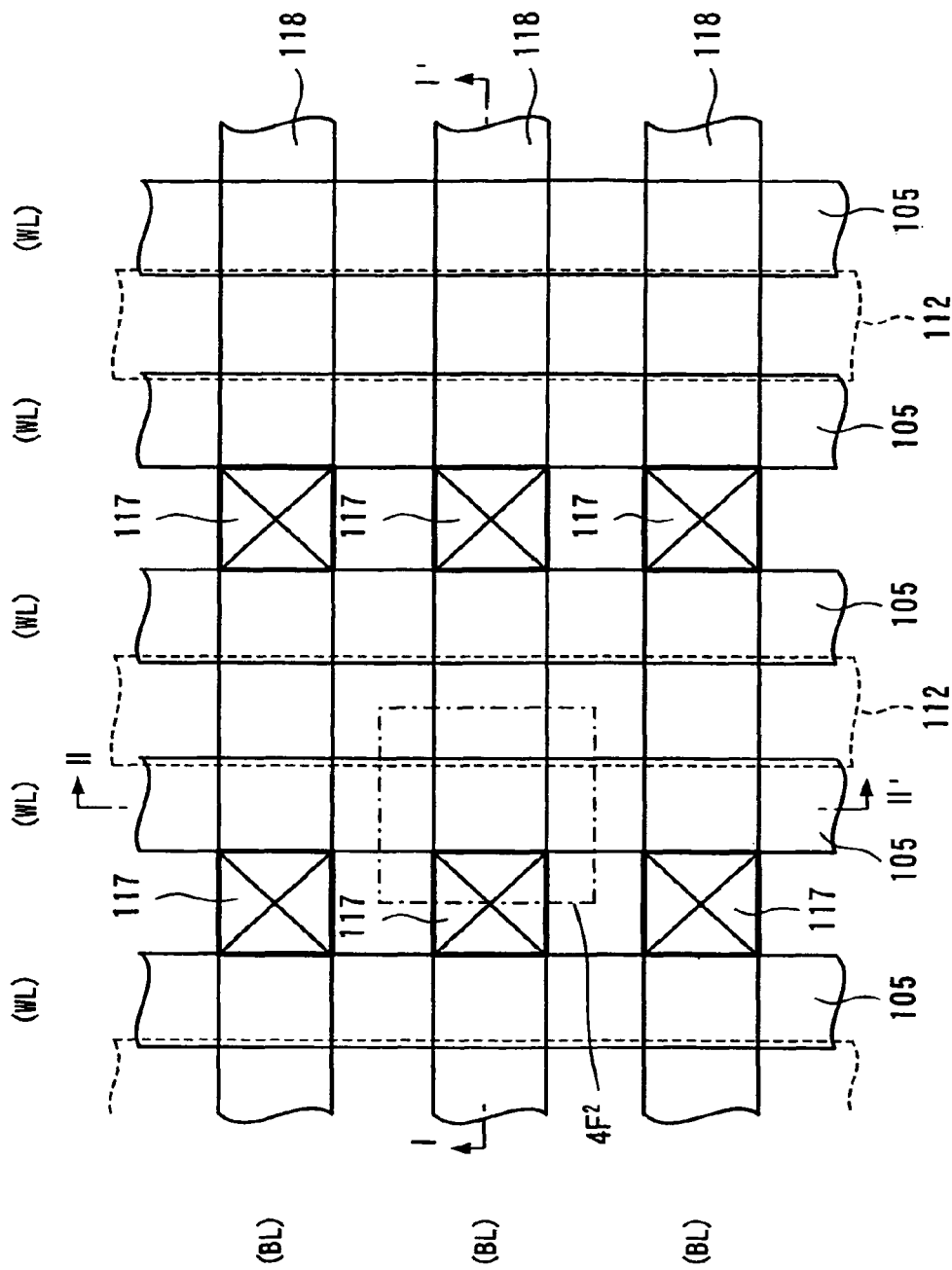
FIG. 60A is a layout of a DRAM cell array according to a fifth embodiment.
Figure 60B:
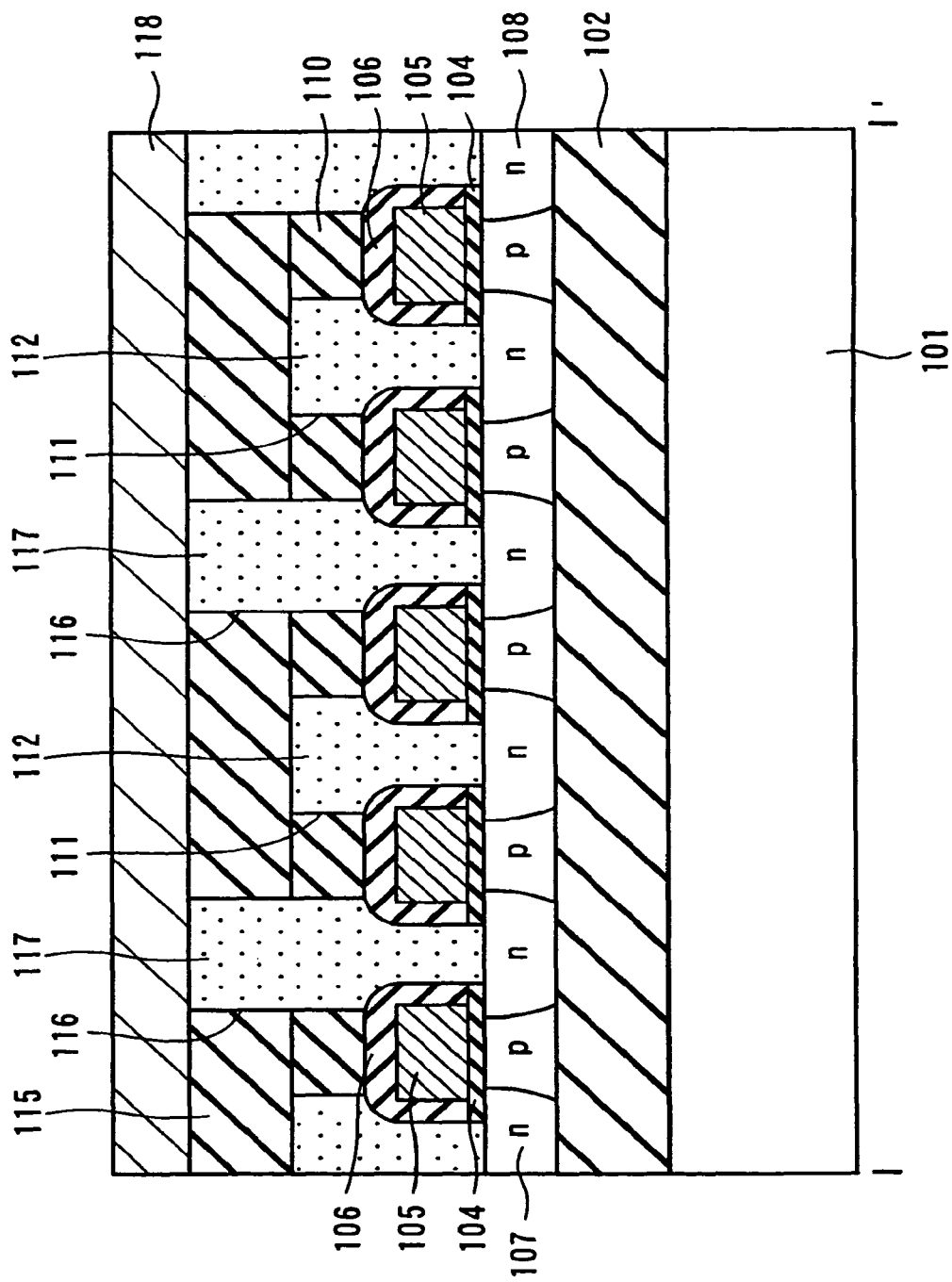
FIG. 60B is a sectional view taken along the line I-I' in FIG. 60A.
Figure 60C:
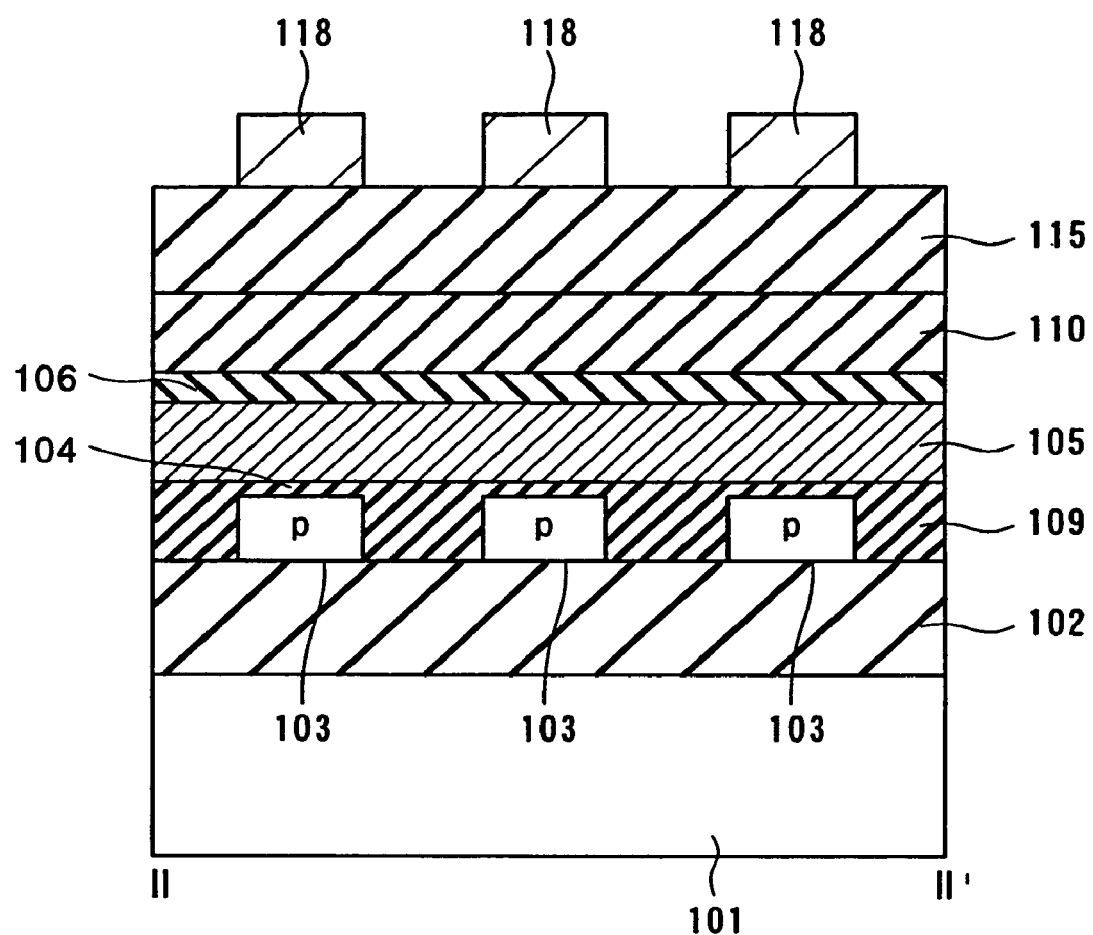
FIG. 60C is a sectional view taken along the line II-II' in FIG. 60A.

The cell array structure, in which a unit cell area is 4 F$^2$, is explained briefly hereinbefore on the basis of FIGS. 3 and 4, and then more specific cell array structure and one embodiment of the manufacturing method will be explained hereinafter. FIG. 60A is a diagram showing the layout of the memory cell array, FIG. 60B is a sectional view taken along the line I-I' in FIG. 60A, and FIG. 60C is also a sectional view taken along II-IP therein. The memory cell array has an SOI substrate, which is composed of a silicon substrate 101, an insulating film 102 which is formed on the silicon substrate 101 and which is a silicon oxide film and so on, and a p-type silicon layer 103 which is formed thereon. An element isolation insulating film 109 is embedded in the silicon layer 103 by using an STI method, so that the silicon layer 103 is divided in a given pitch in the direction of the word line WL into element forming regions in long stripes formed in the direction of the bit line BL.

The transistors are arranged in a matrix form in the silicon layer 103 element-isolated in this way. That is, gate electrodes 105 are pattern-formed continuously as the word lines WL on the silicon layer 103 via gate insulators 104. The upper face and both side faces of each of the gate electrodes 105 are covered with a silicon nitride film 106 as a protection film, which has a large etching selective ratio to interlayer dielectric films 110 and 115 that are formed later. Source/drain diffusion regions 107 and 108 are formed by a self-alignment process using the gate electrodes 105. The source/drain diffusion regions 107 and 108 are formed deep to reach the insulating film 102 at the bottom of the silicon layer 103.

The surface formed by the transistors is covered with the interlayer dielectric film 110, which is a silicon oxide film or the like and which is flattened. Contact holes 111 for the source diffusion region 107 are formed in the interlayer dielectric film 110 as stripes which continue in the direction of the word line WL. A source wiring portion 112, which is a polysilicon film, WSi film or the like, is embedded in each of the contact holes 111.

Furthermore, the interlayer dielectric film 115, which is a silicon oxide film and so on, is formed on the interlayer dielectric film 110 embedded in the source wiring portion 112 and which is flattened. Contact holes 116 for the drain diffusion regions 108 are formed in the interlayer dielectric film 115, and a contact plug 117 of a polysilicon film and the like is embedded in each of the contact holes 116. Then, bit lines 118 (BL) are formed on the interlayer dielectric film 115 so as to commonly connect the contact plugs 117, and the bit lines 118 cross the word lines WL.

Figure 61B:
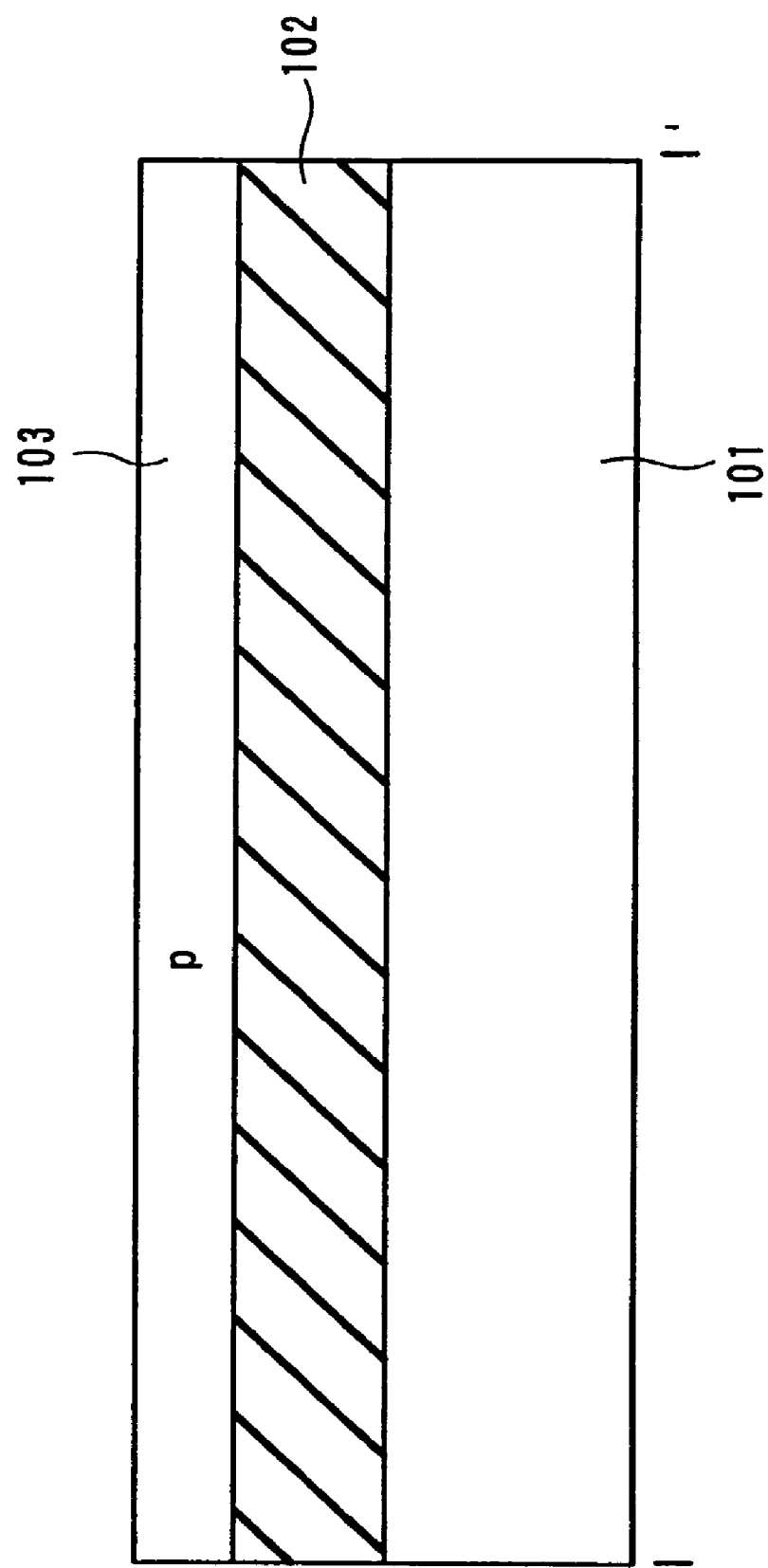
FIG. 61B is a sectional view taken along the line I-I' in FIG. 61A.
Figure 61C:
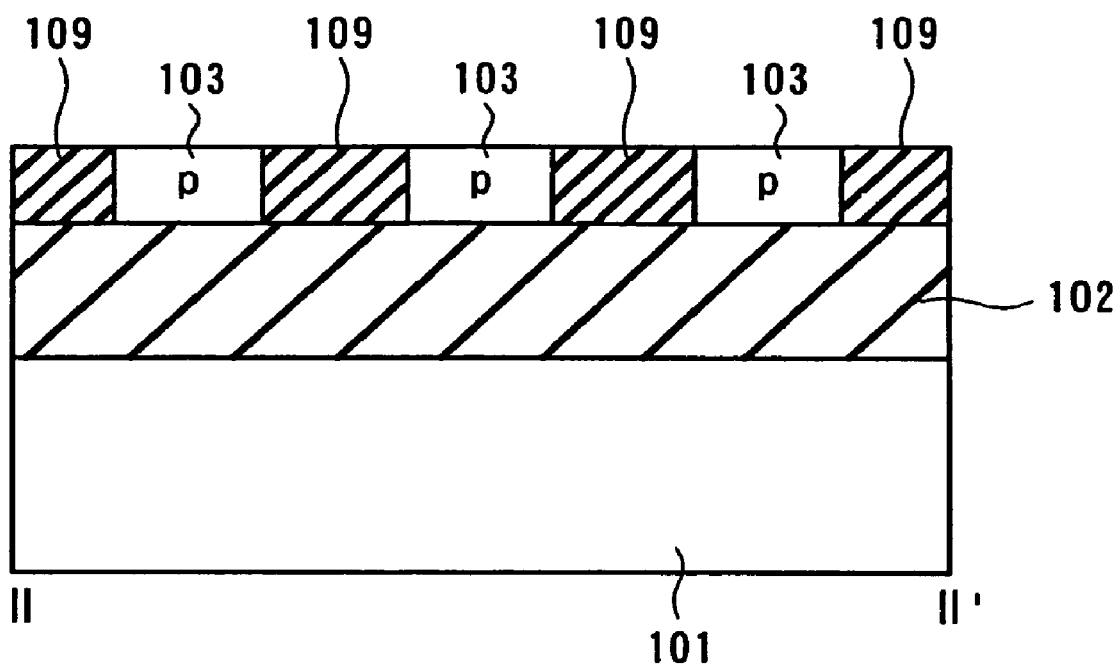
FIG. 61C is a sectional view taken along the line II-II' in FIG. 61A.

Next, one of the specific manufacturing methods is explained. FIGS. 61A, 61B and 61C are a plan view and sectional views taken along I-I' and II-II' in a stage where the element isolation insulating film 109 is formed in the p-type silicon layer 103 of the SOI substrate. For example, this is obtained by etching the silicon layer 103 with RIE so as to form element isolation grooves and embedding the element isolation insulating film 109 in the element isolation grooves. As a result, the silicon layer 103 is divided into the element forming regions in a plurality of stripes continuing in the direction of the bit line BL.

Figure 62A:
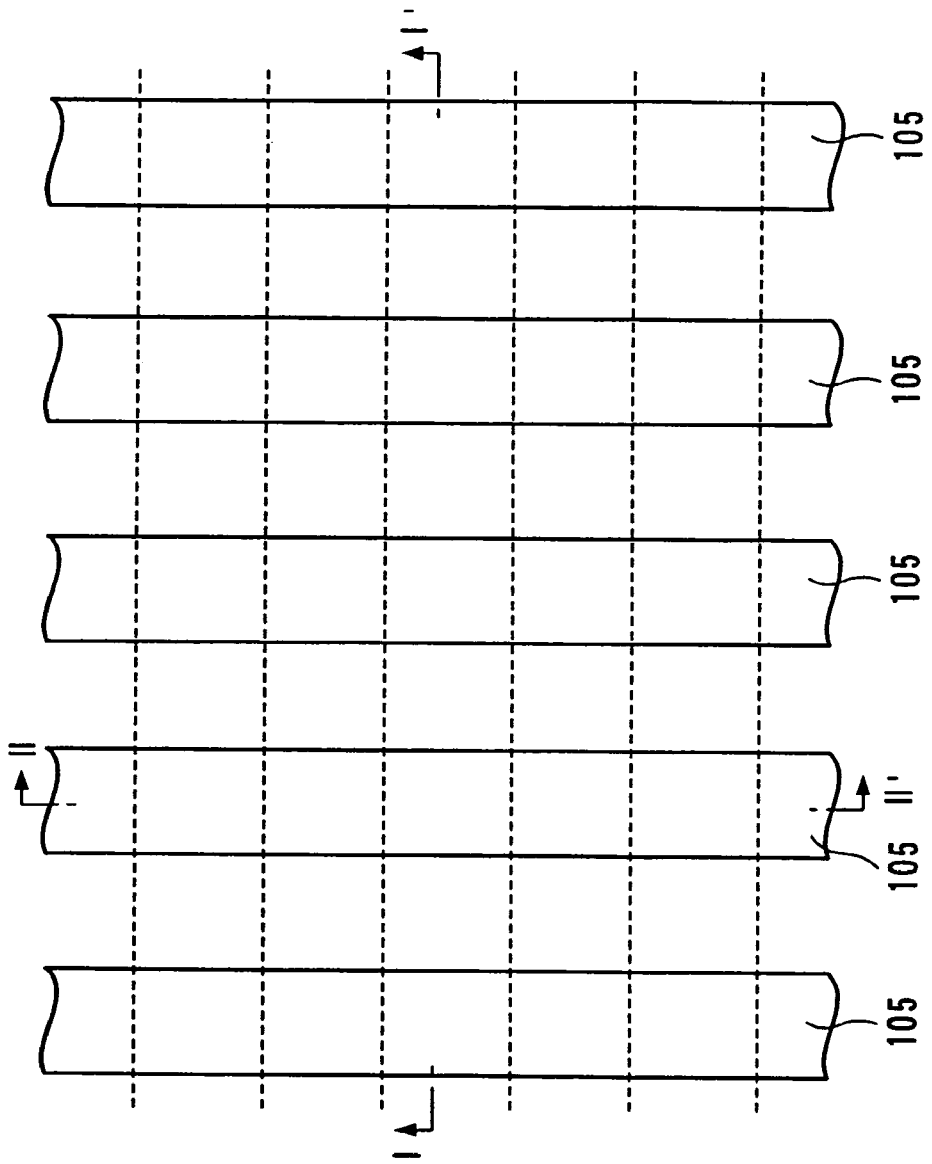
FIG. 62A is a plan view showing a transistor forming step in the embodiment.
Figure 62B:
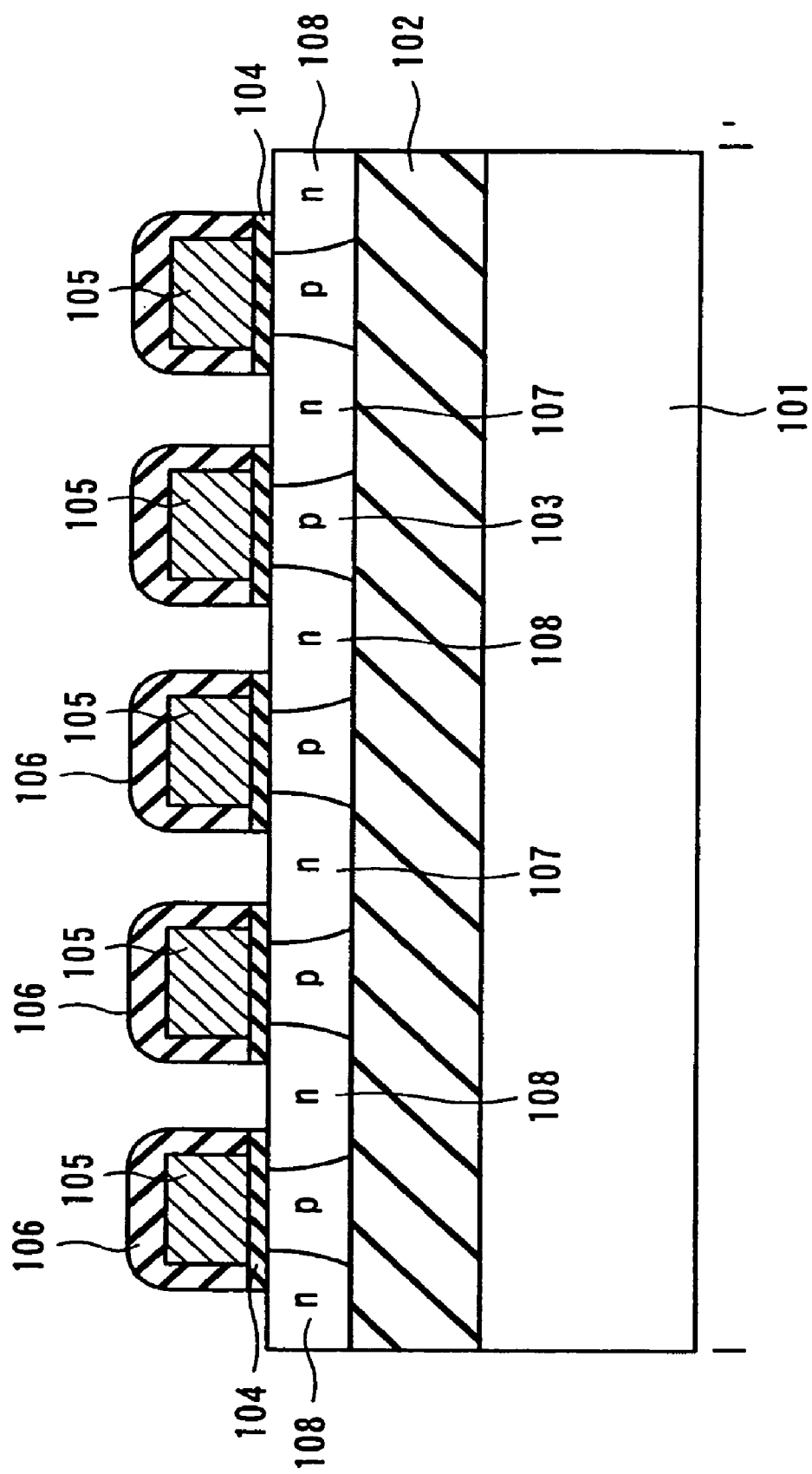
FIG. 62B is a sectional view taken along the line I-I' in FIG. 62A.
Figure 62C:
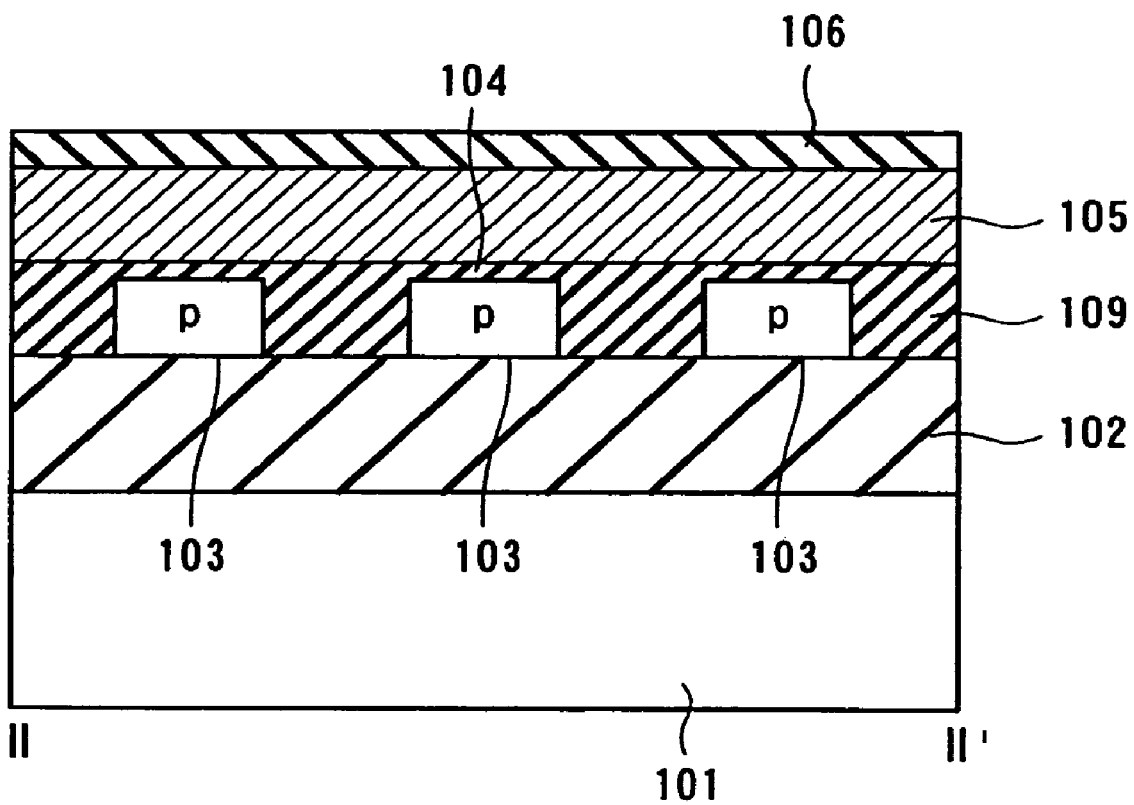
FIG. 62C is a sectional view taken along the line II-II' in FIG. 62A.

FIGS. 62A, 62B and 62C are a plan view and sectional views taken along I-I' and in a stage where the transistors are formed. That is, the gate electrodes 105 are pattern-formed via the gate insulator 104 as the continuous word lines WL. The upper face and both side faces of each of the gate electrodes 105 are covered with the silicon nitride film 106. Specifically, this gate electrode protecting structure is obtained through steps of patterning a laminated film of a polysilicon film and a silicon nitride film and forming a silicon nitride film on both the side faces thereof. Then, ion implantation is performed with the gate electrodes 105 being used as a mask, so that the source/drain diffusion regions 107 and 108 are formed.

Figure 63A:
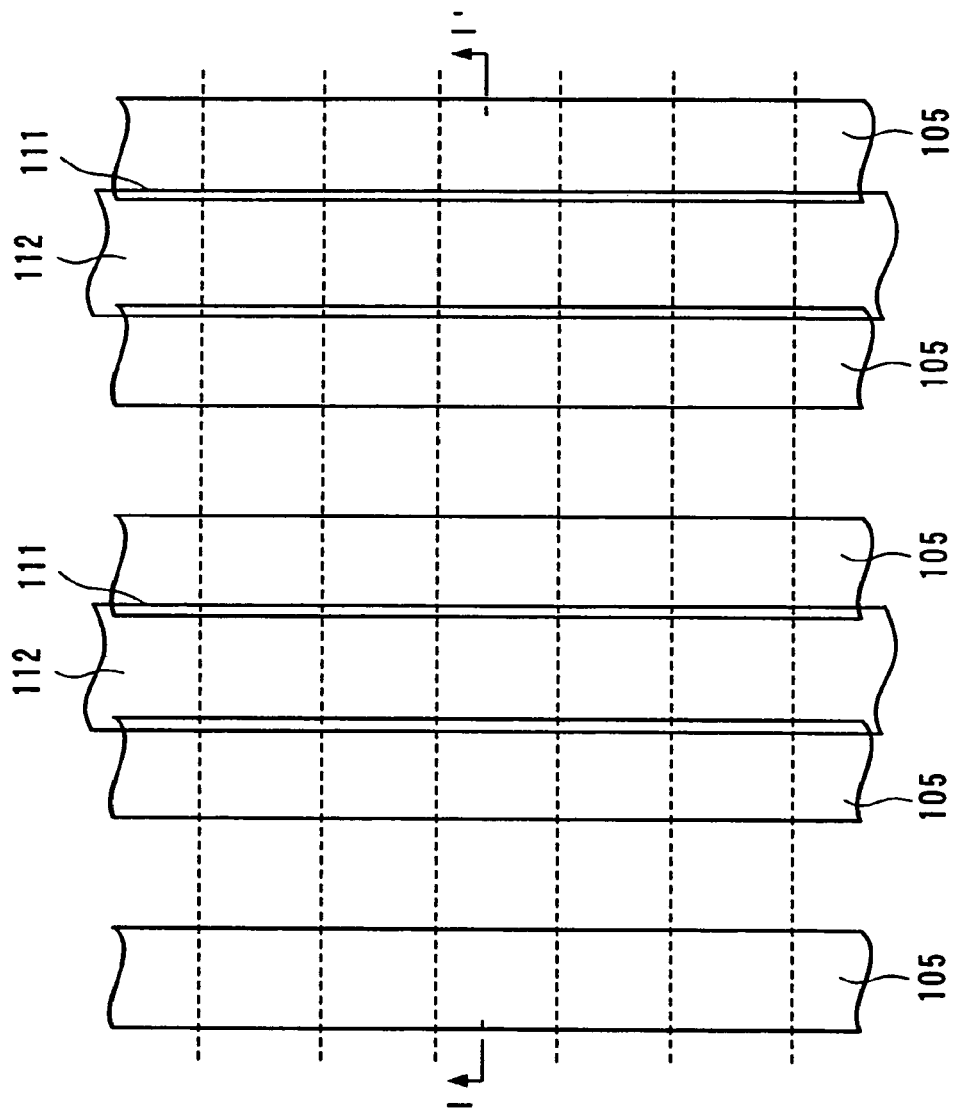
FIG. 63A is a plan view showing a source wiring portion forming step in the embodiment.
Figure 63B:
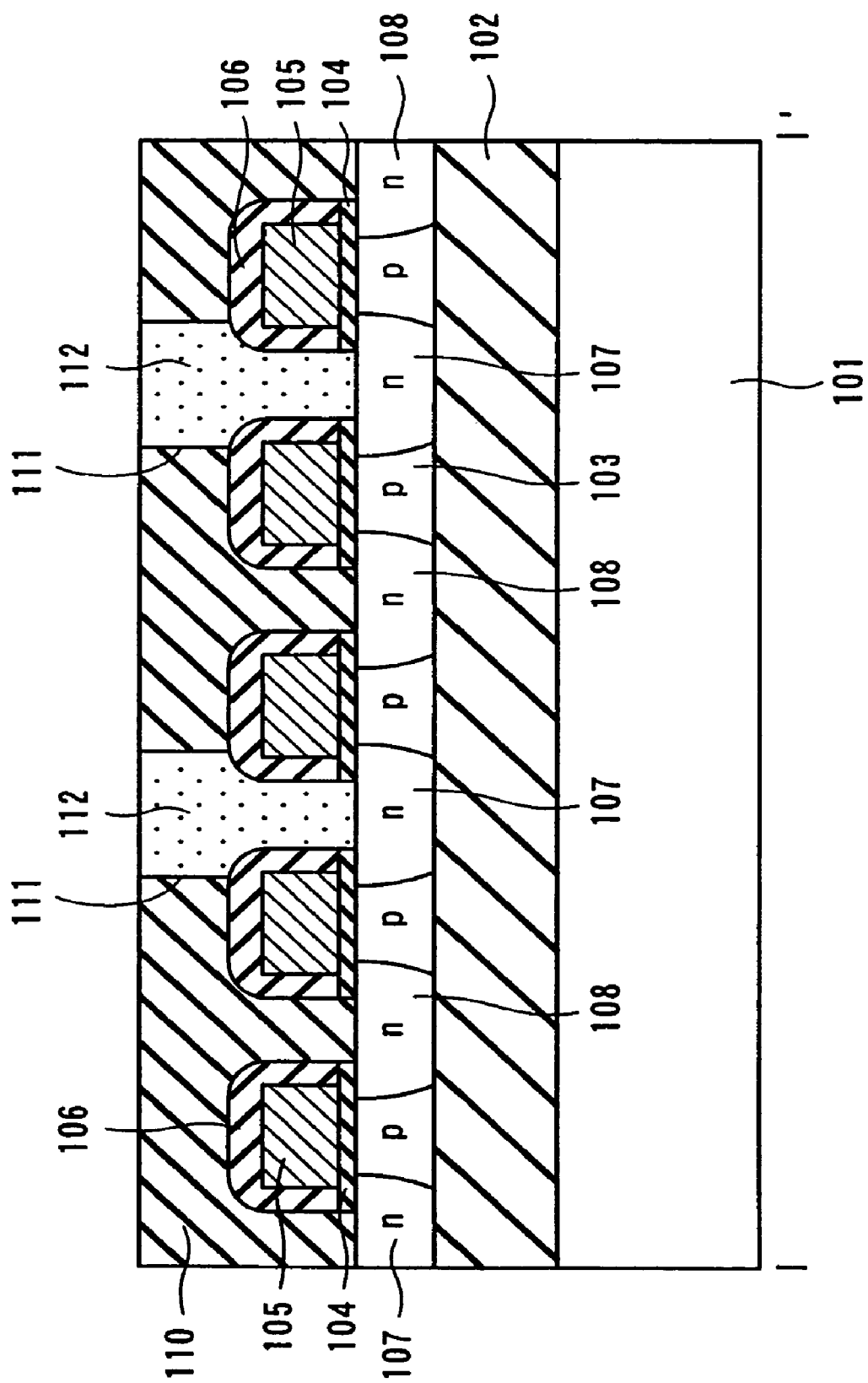
FIG. 63B is a sectional view taken along the line I-I' in FIG. 63A.

FIGS. 63A and 63B are a plan view and a sectional view taken along I-I' in a stage where the substrate is covered with the interlayer dielectric film 110 and the source wiring portions 112 are embedded in the interlayer dielectric film 110. That is, the interlayer dielectric film 110, which is a silicon oxide film and so on, is formed flatly, and the contact holes 111, which are in parallel with the word lines WL and in stripes, are formed on the source diffusion regions 107 by RIE. Then, a polysilicon film is formed and etched-back, so that the source wiring portions 112 embedded in the contact holes 111 are formed.

Figure 64A:
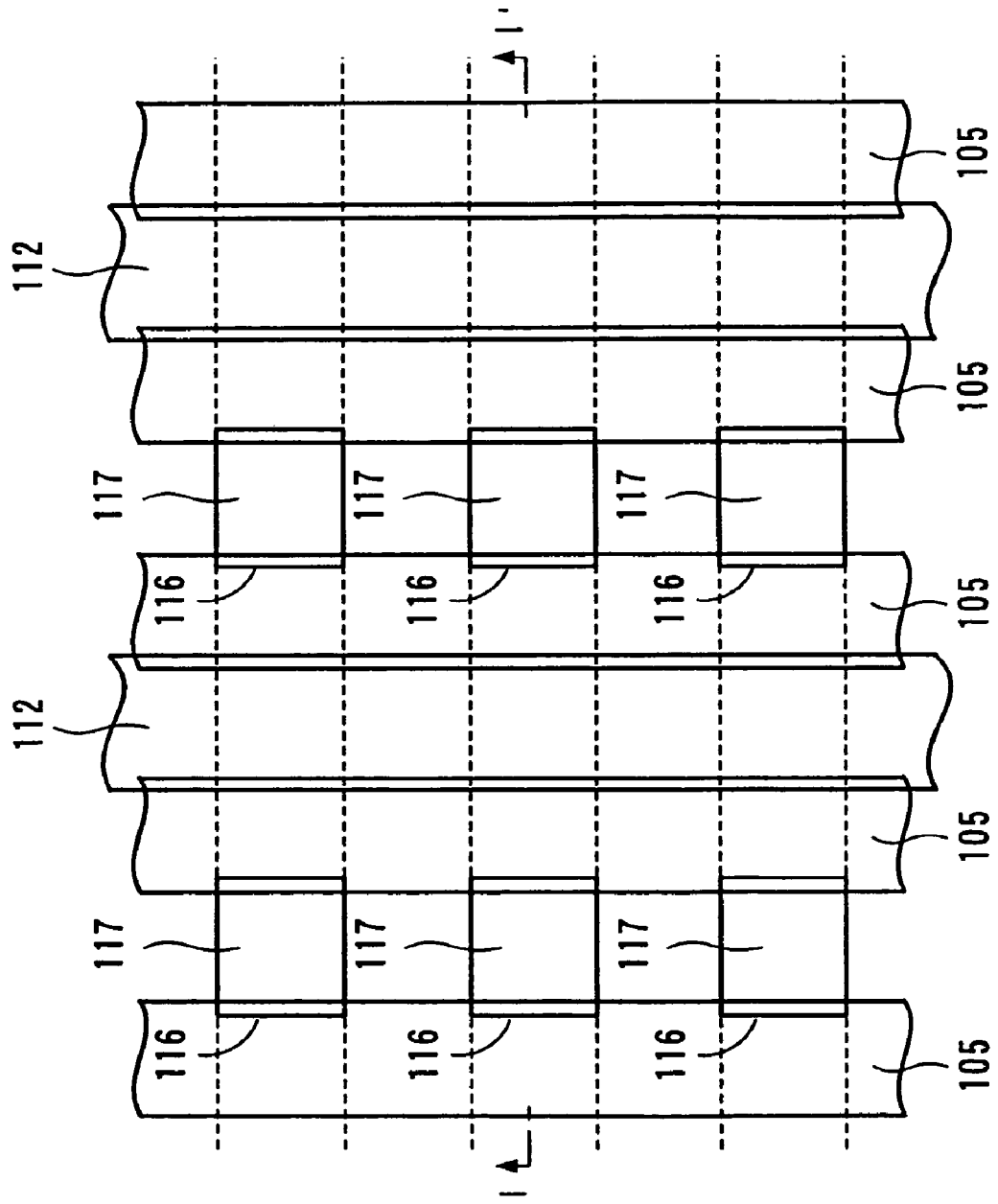
FIG. 64A is a plan view showing a bit line contact plug embedding step in the embodiment.
Figure 64B:
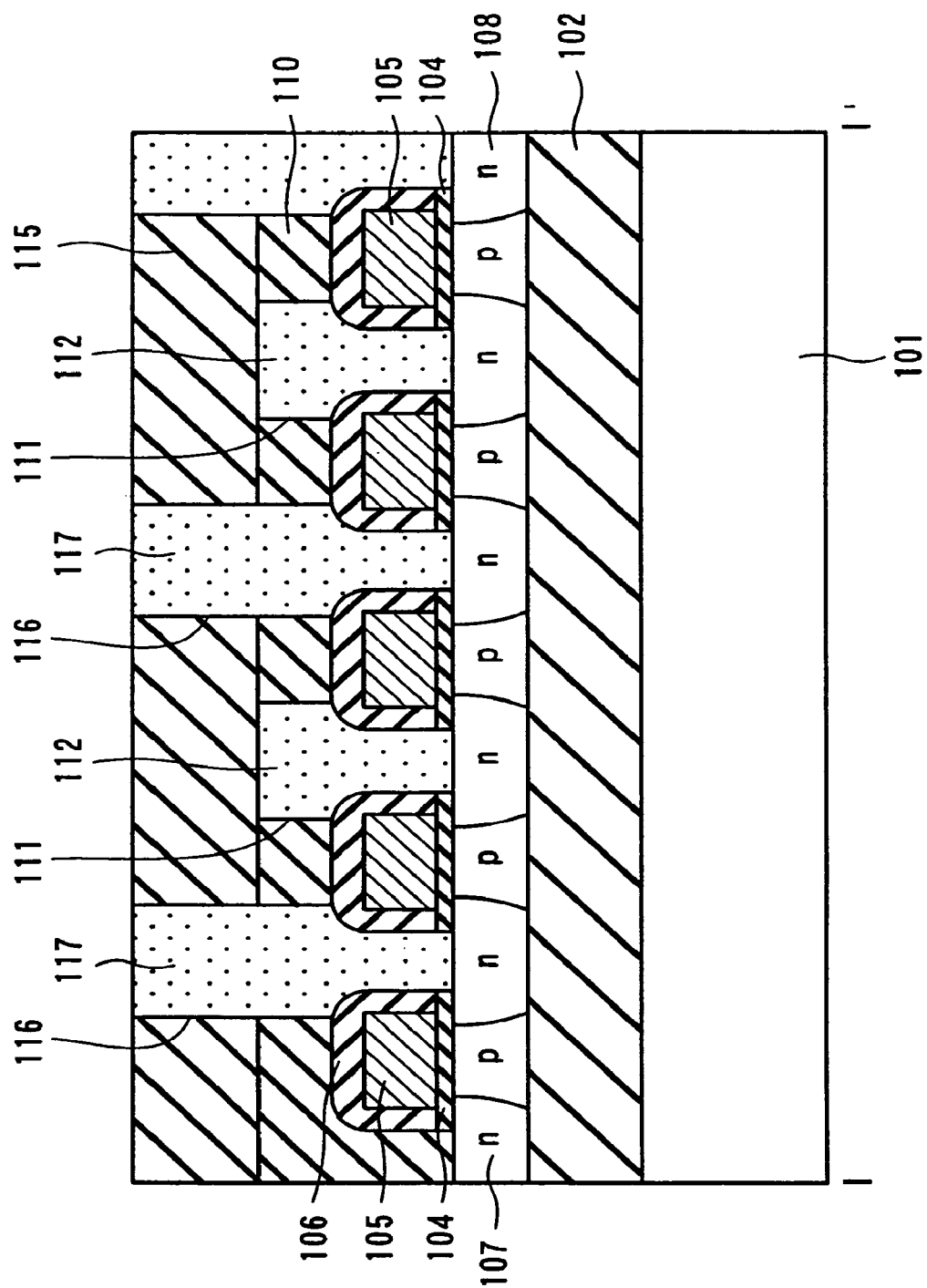
FIG. 64B is a sectional view taken along the line I-I' in FIG. 64A.

FIGS. 64A and 64B are a plan view and a sectional view taken along I-I' in a stage where the interlayer dielectric film 115 is formed on the interlayer film 110 in which the source wiring portions 112 are formed and then the contact plugs 117 are embedded in the interlayer dielectric film 115. Specifically, the interlayer dielectric film 115, which is a silicon oxide film and so on, is formed flatly, and the contact holes 116 are formed therein on the drain diffusion regions 108 by RIE. Then, a polysilicon film is formed and etched-back, so that the contact plugs 117 embedded in the contact holes 116 are formed. After this, as shown in FIG. 60B, the bit lines 118 are formed on the interlayer dielectric film 115 so as to commonly connect the contact plugs 117.

As a result, the DRAM cell array, which has a 4 $F^2$ cell area, is obtained as shown by one dotted chain line in FIG. 60A, and the word lines WL and the bit lines BL are formed with pitches of the minimum feature size F. In the case of the element isolation insulating structure as shown in FIG. 61A, the source diffusion regions 107 are formed discretely in the direction of the word line WL. However, in this embodiment, the source wiring portions 112 are formed so as to commonly connect the source diffusion regions 107, so that the common source lines with low resistance are obtained.

Both the contact holes 111 for the source wiring portions 112 and the contact holes 116 for the bit line contact plugs 117 are formed by self-alignment processes using the gate electrodes 105 protected by the silicon nitride film 106. Therefore, it is possible to make the contact holes without an influence of mask matching deviation by setting the width of mask hole in more than F in RIE of a contact hole opening process.

Figure 65:
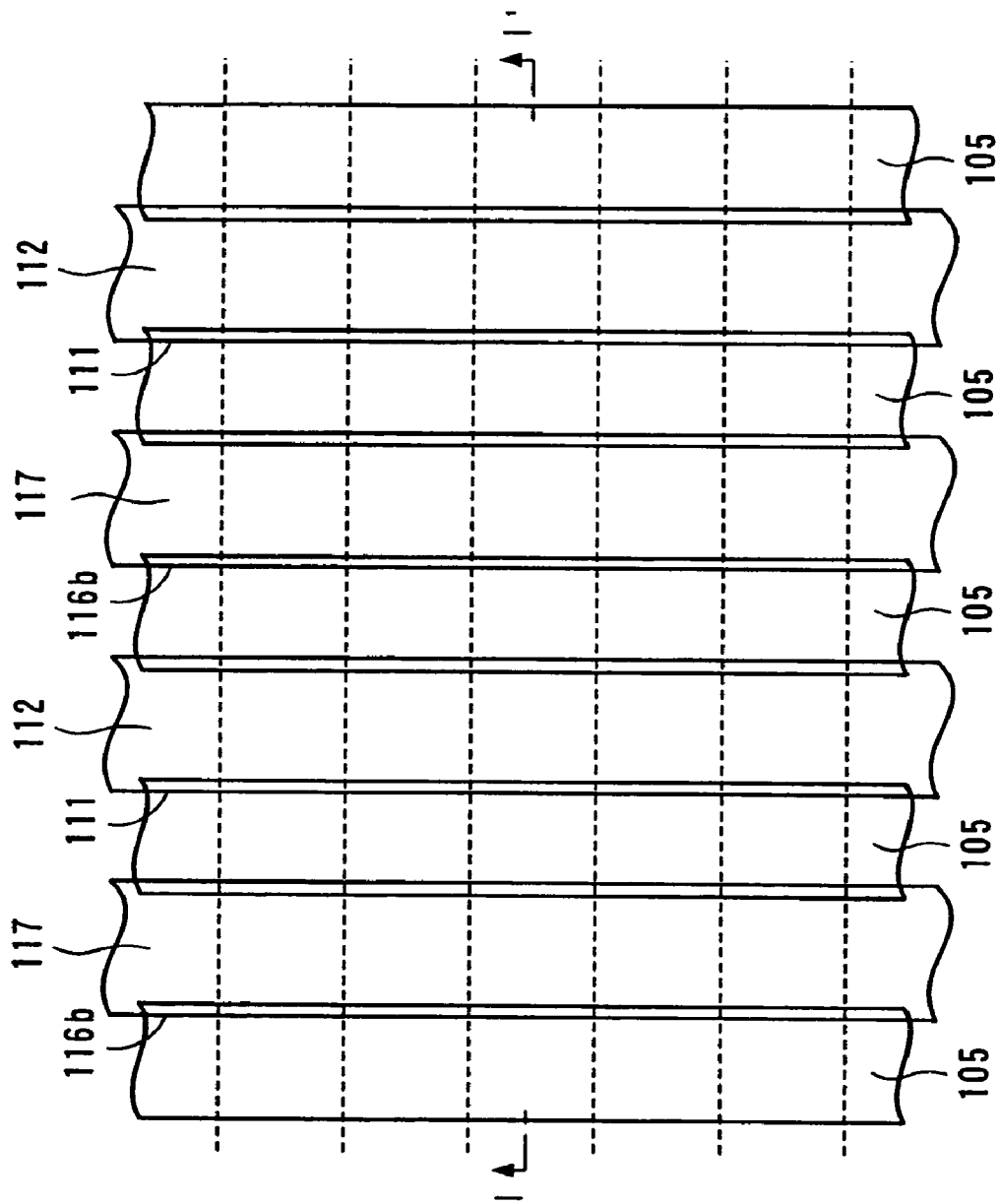
FIG. 65 is a plan view showing the bit line contact plug embedding step in another embodiment.

In this embodiment, as shown in FIG. 64A, the contact holes 116 are formed only on the drain diffusion regions 108. On the other hand, as shown in FIG. 65, contact holes 116b for the bit lines may be continuously formed along the direction of the word line WL in stripes in the same way as the contact holes 111 for the source diffusion regions 107. In this case, although contact plugs 117 are also embedded in the contact holes 116b in stripes, it is necessary that the contact plugs 117 only under the bit lines BL remain finally. For example, it can be realized by pattern-forming the bit lines BL and etching the contact plugs 117 by using the bit lines BL as a mask.

In the above-mentioned embodiment, if the upper face and both side faces of each of the source wiring portions 112 are covered with a protection film like the gate electrodes 105, a matching margin of the bit line contact will increase. Such an embodiment will be explained hereinafter.

Figure 66:
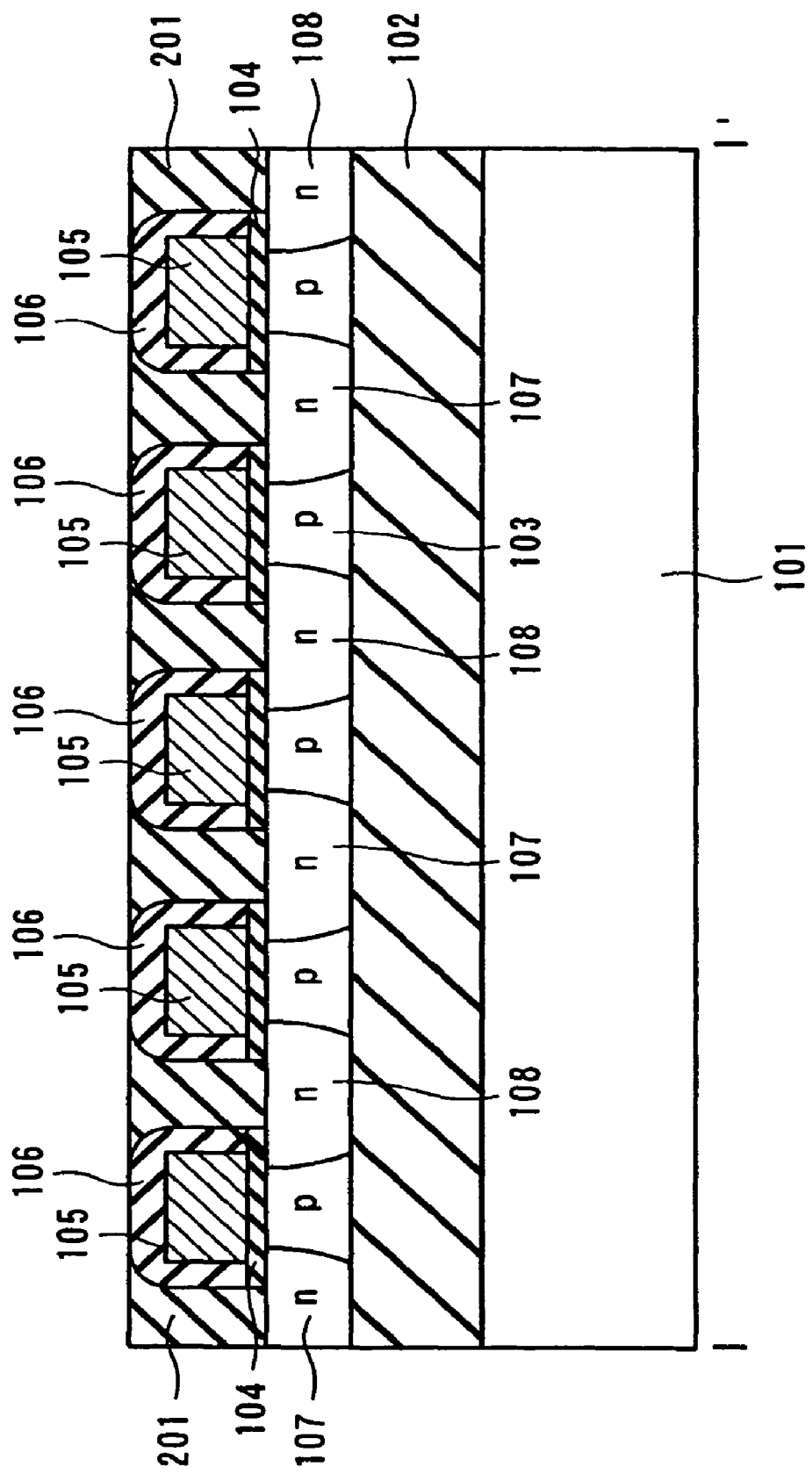
FIG. 66 is a sectional view showing an interlayer dielectric film forming step after forming elements according to a sixth embodiment.

Since a manufacturing method up to the element forming step in FIG. 62B is the same process as the above-mentioned embodiment, the manufacturing method after that step will be explained by referring only to sectional views which correspond to FIG. 62B. As shown FIG. 66, an interlayer dielectric film 201, which is a silicon oxide film and so on, is formed on the substrate in which elements are formed, and the interlayer dielectric film 201 is etched-back to be flat. In this process, the silicon nitride film 106 covering the gate electrode 105 is used as a stopper in an etching process, so that the interlayer dielectric film 201 is embedded in aperture between the gates.

Figure 67:
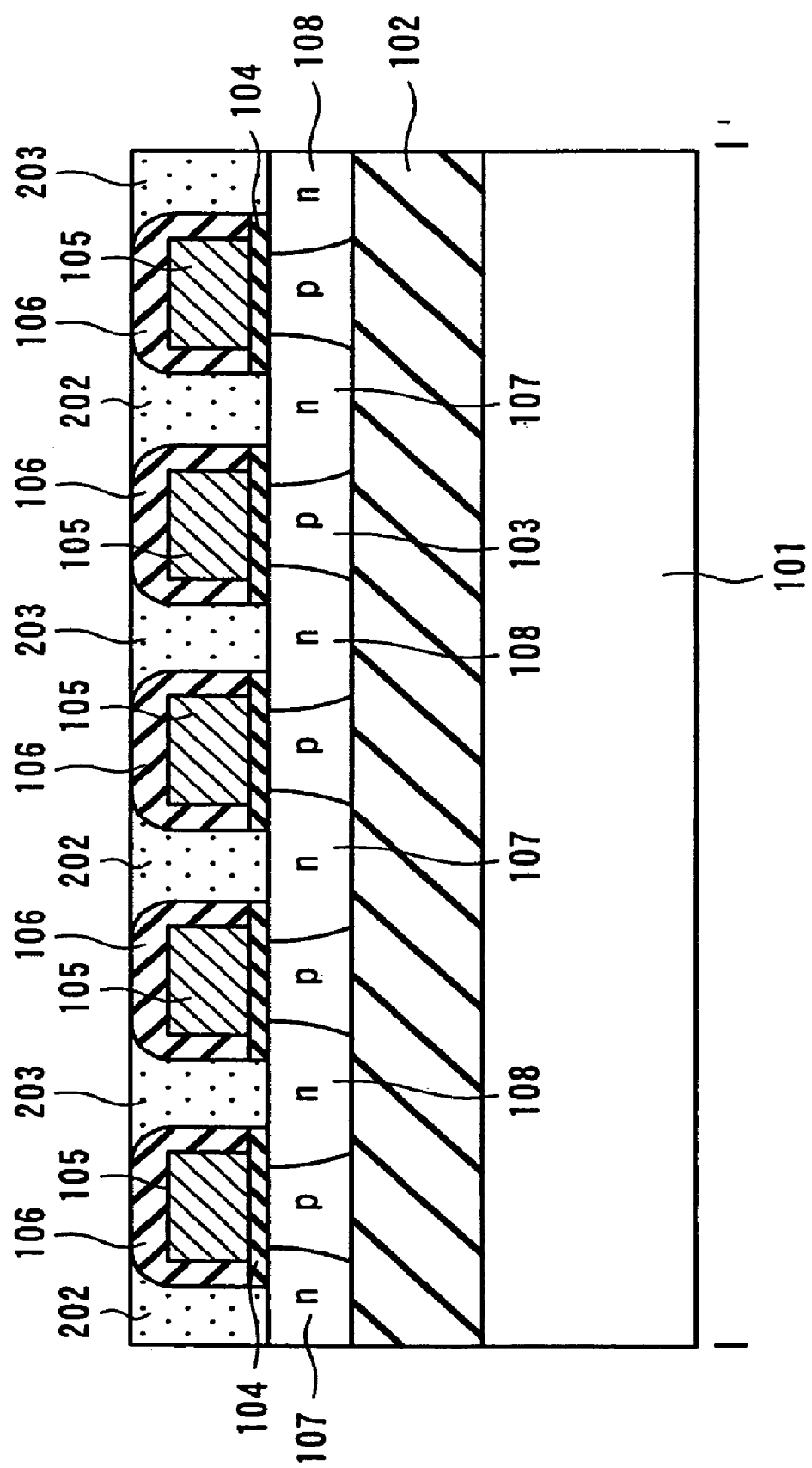
FIG. 67 is a sectional view showing a contact plug embedding step in the embodiment.

After this, as shown in FIG. 67, contact holes for the source/drain diffusion regions 107 and 108 are opened in the interlayer dielectric film 201, and contact plugs 202 and 203 are embedded in the contact holes by forming a polysilicon film and etching it back, respectively. If a mask which has openings in stripes continuing along the direction of the bit line BL is used, contact holes are formed between gate electrodes 105 by self-alignment. However, contact plugs 202 on the source diffusion regions 107 may continue in parallel with the word lines WL as in the case of the above-mentioned embodiment.

Figure 68:
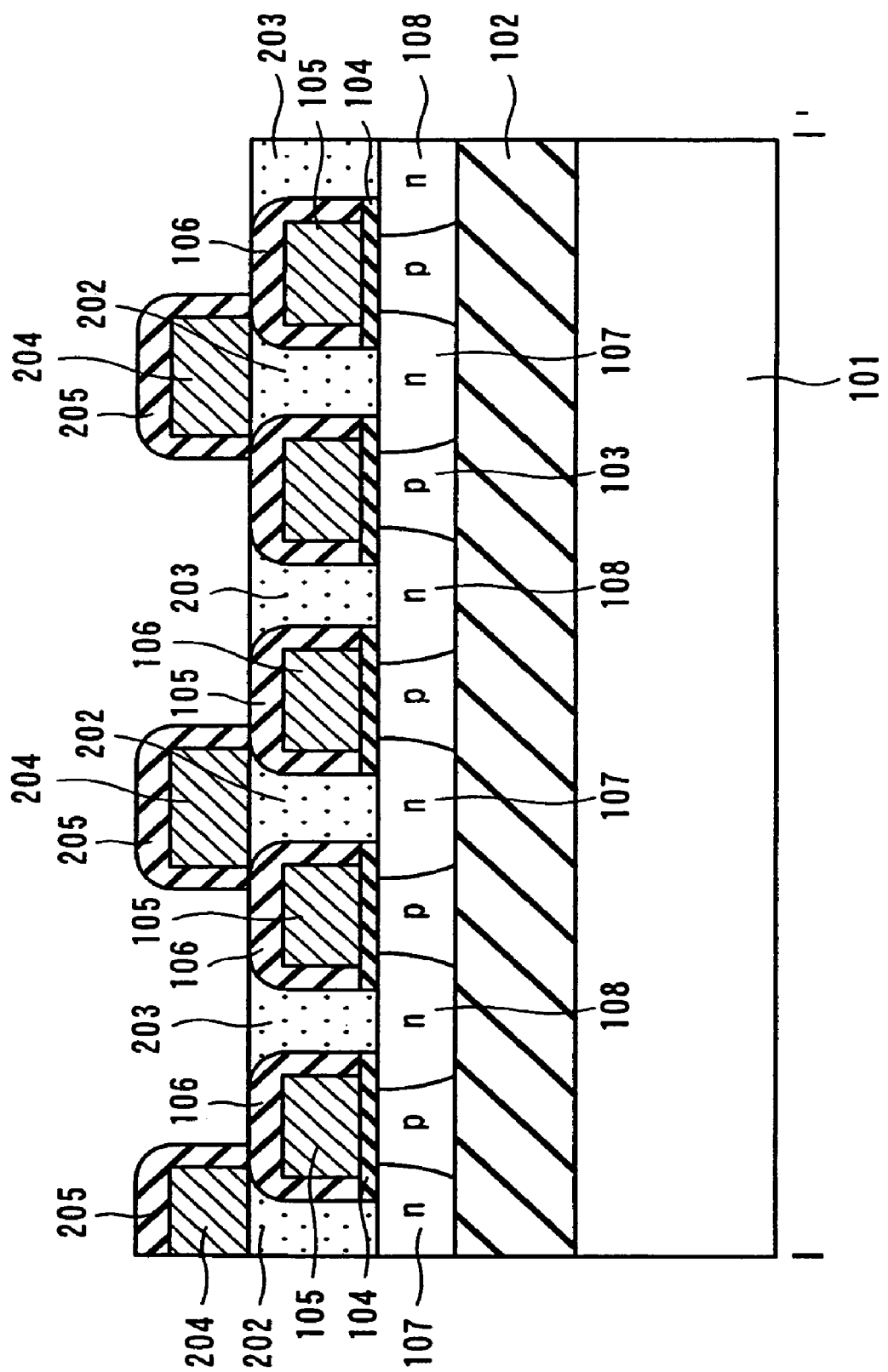
FIG. 68 is a sectional view showing a source wiring portion forming step in the embodiment.

After this, as shown in FIG. 68, source wiring portions 204 are formed so as to commonly connect the contact plugs 202 on the source diffusion regions 107. The upper face and both side faces of each of the source wiring portions 204 are covered with a silicon nitride film as a protection film. Specifically, this protection structure is obtained by patterning a laminate film of a polysilicon film and a nitride silicon film to form source wiring portions 204 and then forming the silicon nitride film 205 on both side faces thereof.

Figure 69:
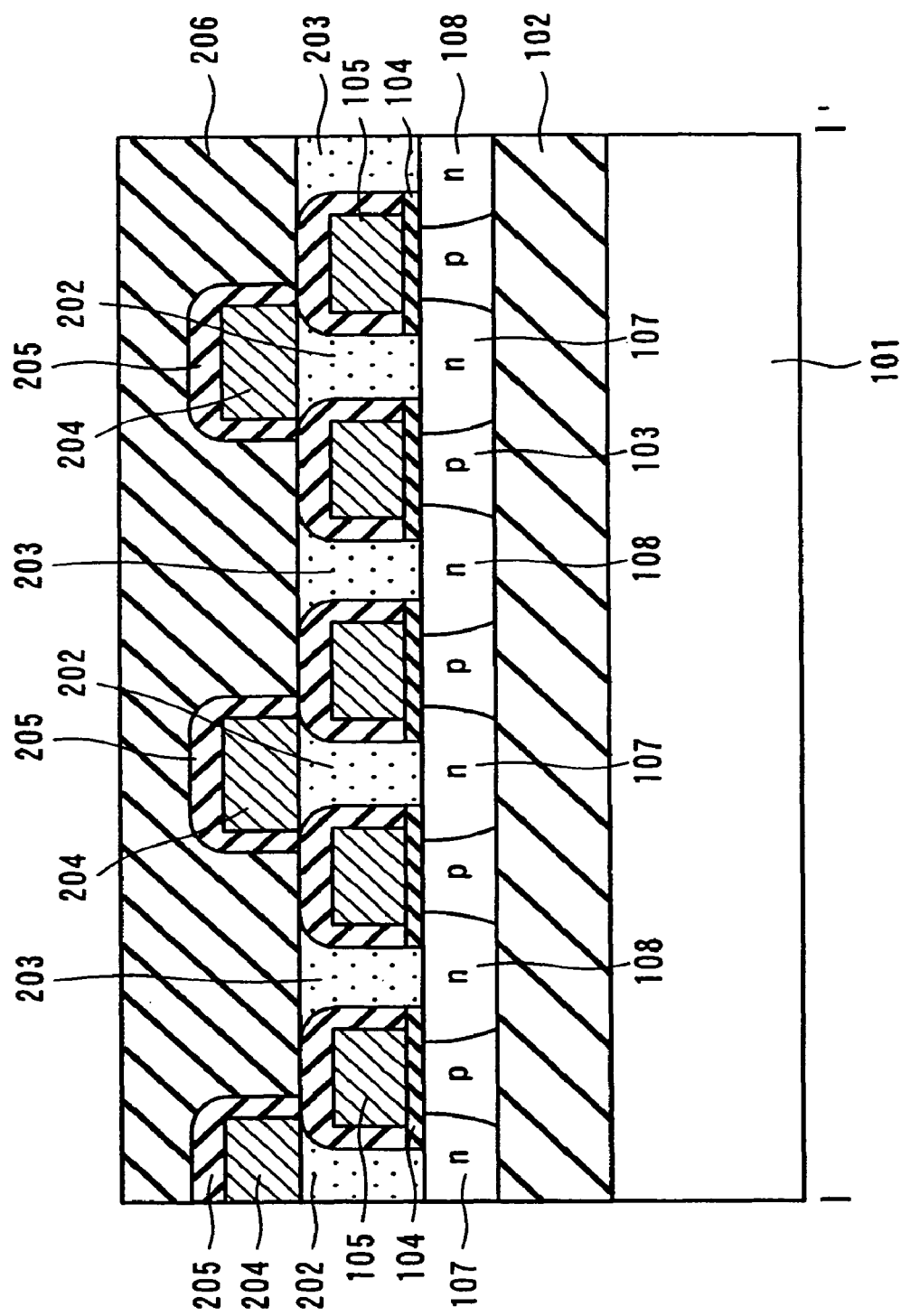
FIG. 69 is a sectional view showing an interlayer dielectric film forming step in the embodiment.
Figure 70:
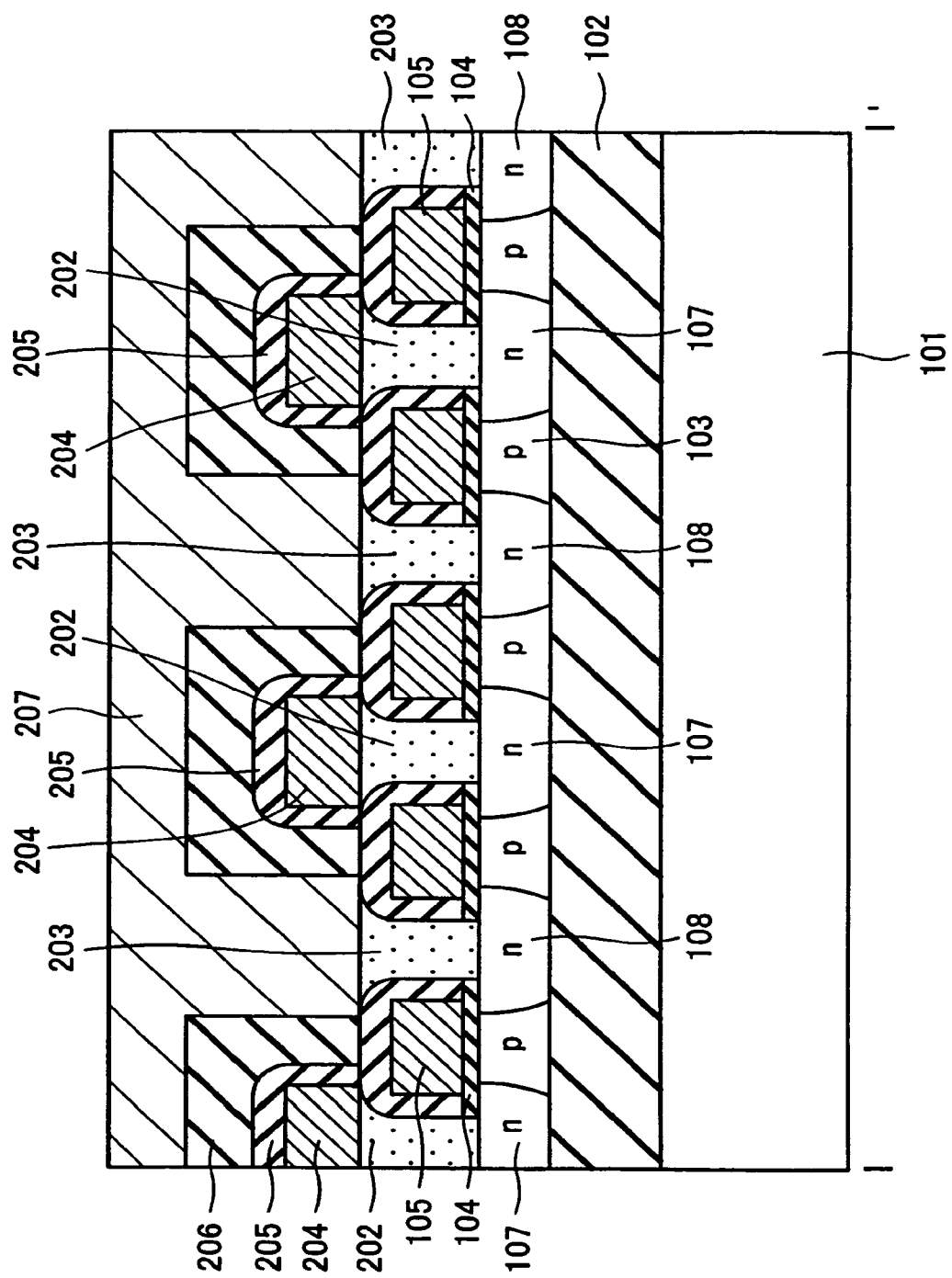
FIG. 70 is a sectional view showing a bit line forming step in the embodiment.

Next, as shown in FIG. 69, an interlayer dielectric film 206, which is a silicon oxide film and so on, is formed again and flattened. Grooves and contact holes for embedding the bit lines are formed in the interlayer dielectric film 206 using a Dual Damascene Method, and bit lines 207 are embedded therein as shown in FIG. 70.

According to this embodiment, since the upper face and both side faces of the source wiring portions 204 are protected by the silicon oxide film 205, it is possible to set a width of the bit line contact in the direction of the bit line in large enough. As a result, a bit line contact with low resistance can be obtained without an influence of mask alignment deviation.

Figure 71:
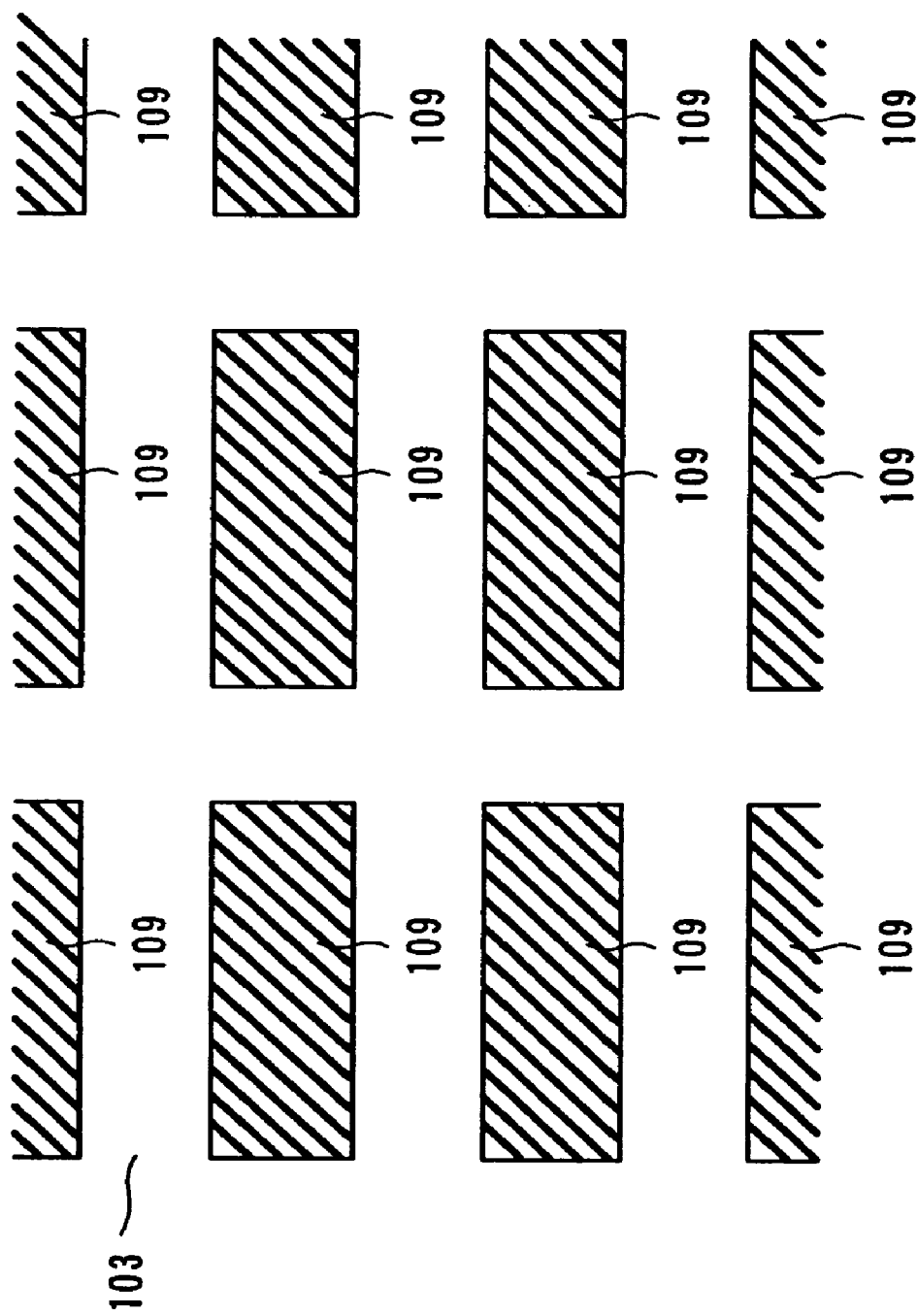
FIG. 71 is a plan view showing an element isolating structure according to a seventh embodiment and corresponding to FIG. 61A.

In the last two embodiments described above, as shown in FIG. 61A, element forming regions are defined continuously in stripes. Therefore, each of the element formed regions does not continue in the direction of the word line WL. On the other hand, as shown in FIG. 71, it is possible to define the element forming regions continuously in the direction of the word line WL at the position of the source diffusion region. In this case, the source diffusion regions are formed continuously in the direction of the word line and constitute common source lines themselves. Even in this case, it is effective for realizing the common source lines with low resistance to form the source wiring portions 112 in the same way as the above-mentioned embodiments.

The present invention is not limited to the above embodiments. The N-channel MOS transistor formed in the p-type silicon layer is used in the embodiments, but even if a P-channel MOS transistor formed in an n-type silicon layer is used as a memory cell, dynamic storage is possible by the same principle. In this case, a majority carrier is an electron, and accumulation and emission of electrons in/from the bulk region is utilized.

Furthermore, although the SOI substrate is used in the embodiments, it is possible to form a memory cell of the same principle by an MOS transistor using a semiconductor layer which gets floating by pn junction isolation.

As described above, according to the embodiments of the present invention, a semiconductor memory device can be provided in which a simple transistor structure is used as a memory cell, enabling dynamic storage of binary data by a small number of signal lines.

What is claimed is:

1. A semiconductor memory device, comprising:
   a plurality of transistors, wherein each of the transistors comprises:
   a pillar semiconductor layer of a first conduction type and formed on a substrate;
   a drain region of a second conduction type and formed in a surface side of the pillar semiconductor layer;

a source region of the second conduction type and formed in a bottom of the pillar semiconductor layer, the source region being formed apart from the drain region;

a gate electrode surrounding the pillar semiconductor layer; and a gate insulator disposed between the gate electrode and the pillar semiconductor layer, wherein each of the transistors is configured to be in a first data state in which excessive majority carriers are held in the pillar semiconductor layer and in a second data state in which the excessive majority carriers in the pillar semiconductor layer are emitted.

2. The semiconductor memory device of claim 1, wherein the first data state is a state in which impact ionization is generated near a drain junction by operating the transistor and in which the excessive majority carriers held in the pillar semiconductor layer are produced by the impact ionization, and the second data state is a state in which a forward bias is applied between the pillar semiconductor layer and the drain diffusion region to extract the excessive majority carriers from within the pillar semiconductor layer to the drain diffusion region.

3. The semiconductor memory device of claim 1, wherein a voltage of a source line of the semiconductor memory device is constant.

4. The semiconductor memory device of claim 1, wherein the semiconductor memory device is configured such that when data is written to the semiconductor memory device, with a source line of the semiconductor memory device at a reference voltage:

a first voltage higher than the reference voltage is provided to a word line of a first transistor of the plurality of transistors, a second voltage lower than the reference voltage is provided to a word line of a second transistor of the plurality of transistors, a third voltage higher than the reference voltage is provided to a bit line connected to the first transistor when the first data state is written, and a fourth voltage lower than the reference voltage is provided to the bit line when the second data state is written.

5. The semiconductor memory device of claim 4, wherein the semiconductor memory device is configured such that when data is read from the semiconductor memory device, with the source line at the reference voltage, a fifth voltage between a first threshold voltage of the first data state and a second threshold voltage of the second data state, and also that is higher than the reference voltage, is provided to the word line of the first transistor.

6. The semiconductor memory device of claim 4, wherein the semiconductor memory device is configured such that when data is read from the semiconductor memory device, with the source line at the reference voltage, a fifth voltage higher than a first threshold voltage of the first data state and a second threshold voltage of the second data state, and also that is higher than the reference voltage, is provided to the word line of the first transistor.

7. The semiconductor memory device of claim 1, wherein each of the transistors comprises:

a first region formed on the source region;

a second region formed on the first region; and a third region formed on the second region, wherein an impurity concentration of the second region is higher than impurity concentrations of the first and third regions.

8. The semiconductor memory device of claim 7, wherein the first region, the second region, and the third region form a bulk region in a floating state.

9. The semiconductor memory device of claim 1, wherein the gate electrodes of the plurality of transistors are continuously formed in one direction to constitute a word line, and a bit line is connected to each of the drain regions.

10. The semiconductor memory device of claim 1, wherein the first conduction type is P-type, and the transistor is an N-channel metal-oxide-semiconductor (MOS) transistor.

11. The semiconductor memory device of claim 1, wherein the source regions of the plurality of transistors are connected to each other so as to be formed in a linear arrangement.

12. The semiconductor memory device of claim 1, wherein the source regions of the plurality of transistors are connected to each other so as to be formed in a planar arrangement.

* * * * *